(12) United States Patent
Raissi et al.

(10) Patent No.: US 10,963,540 B2
(45) Date of Patent: Mar. 30, 2021

(54) PHYSICS INFORMED LEARNING MACHINE

(71) Applicant: BROWN UNIVERSITY, Providence, RI (US)

(72) Inventors: Maziar Raissi, Bethesda, MD (US); Paris Perdikaris, Providence, RI (US); George E. Karniadakis, Newton, MA (US)

(73) Assignee: Brown University, Providence, RI (US)

( * ) Notice: Subject to any disclaimer, the term of this patent is extended or adjusted under 35 U.S.C. 154(b) by 180 days.

(21) Appl. No.: 16/306,316

(22) PCT Filed: Jun. 2, 2017

(86) PCT No.: PCT/US2017/035781
§ 371 (c)(1),
(2) Date: Nov. 30, 2018

(87) PCT Pub. No.: WO2018/013247
PCT Pub. Date: Jan. 18, 2018

(65) Prior Publication Data
US 2020/0293594 A1    Sep. 17, 2020

Related U.S. Application Data

(60) Provisional application No. 62/478,319, filed on Mar. 29, 2017, provisional application No. 62/344,955, filed on Jun. 2, 2016.

(51) Int. Cl.
| | | |
|---|---|---|
| *G06F 17/13* | (2006.01) | |
| *G06N 7/00* | (2006.01) | |
| *G06F 30/27* | (2020.01) | |
| *G06K 9/62* | (2006.01) | |
| *G06N 20/10* | (2019.01) | |

(52) U.S. Cl.
CPC .............. *G06F 17/13* (2013.01); *G06F 30/27* (2020.01); *G06K 9/6265* (2013.01); *G06N 7/005* (2013.01); *G06N 20/10* (2019.01)

(58) Field of Classification Search
CPC ...................................................... G06F 17/13
See application file for complete search history.

(56) References Cited

U.S. PATENT DOCUMENTS

| | | |
|---|---|---|
| 6,772,082 B2 | 8/2004 | van der Geest et al. |
| 2003/0187621 A1 | 10/2003 | Nikitin et al. |
| 2007/0171998 A1 | 7/2007 | Hietala et al. |
| 2010/0211357 A1 | 8/2010 | Li et al. |

(Continued)

FOREIGN PATENT DOCUMENTS

EP    1562033 B1    9/2006

OTHER PUBLICATIONS

International Search Report and Written Opinion for PCT/US2017/035781, dated Jan. 29, 2018.

*Primary Examiner* — Chuong D Ngo
(74) *Attorney, Agent, or Firm* — Adler Pollock & Sheehan P.C.

(57) ABSTRACT

A method for analyzing an object includes modeling the object with a differential equation, such as a linear partial differential equation (PDE), and sampling data associated with the differential equation. The method uses a probability distribution device to obtain the solution to the differential equation. The method eliminates use of discretization of the differential equation.

27 Claims, 24 Drawing Sheets

(56) References Cited

U.S. PATENT DOCUMENTS

2011/0178953 A1* 7/2011 Johannes ............... G06Q 40/06
                                                    705/36 R
2017/0147722 A1* 5/2017 Greenwood ........... G16H 50/50

* cited by examiner

PHYSICS INFORMED LEARNING MACHINE

CROSS-REFERENCE TO RELATED APPLICATIONS

This application is a U.S. National Stage application of PCT International application No. PCT/US2017/035781, filed Jun. 2, 2017, which claims the benefit of U.S. Patent Application Ser. No. 62/344,955 filed Jun. 2, 2016, and U.S. Patent Application Ser. No. 62/478,319, filed Mar. 29, 2017, which applications are incorporated herein by reference in their entireties. To the extent appropriate, a claim of priority is made to each of the above disclosed applications.

GOVERNMENT CONTRACT

This invention was made with government support under Grant Number N66001-15-2-4055 awarded by SPAWAR-SYSCEN Pacific. The government has certain rights in the invention.

BACKGROUND

Solutions of differential equations have been obtained either analytically or numerically. For example, the calculation of differential equations is conditioned on several assumptions of ideal situations. However, in reality, variables or data that are used to solve differential equations are oftentimes noisy or erroneous, which results in inaccurate solutions to those differential equations.

Physics Informed Learning Machine

In general terms, this disclosure is directed to systems and methods for analyzing objects based on a probability distribution. In one possible configuration and by non-limiting example, the systems and methods employ a probability distribution device to obtain a solution to a differential equation that models an object to be analyzed. Various aspects are described in this disclosure, which include, but are not limited to, the following aspects.

One aspect is a method for analyzing an object. The method includes modeling the object with a time-dependent partial differential equation; measuring an initial data from the object; constructing a probability distribution device by: constructing a linear multi-step device (scheme; method) usable to predict a solution to the time-dependent partial differential equation; constructing a non-parametric regression prior; and placing the non-parametric regression prior on a predetermined term in the linear multi-step device; running the probability distribution device by: setting a time step size; inputting the initial data to the probability distribution device, the initial data representative of data at an initial time step; obtaining first artificial data at a first time step, the first time step being increased from the initial time step by the time step size, the first artificial data being calculated based on a first output from the probability distribution device to which the initial data is inputted; obtaining second artificial data at a second time step, the second time step being increased from the first time step by the time step size, the second artificial data being calculated based on a second output from the probability distribution device to which the first artificial data is inputted; obtaining third artificial data at a third time step, the third time step being increased from the second time step by the time step size, the third artificial data being calculated based on a third output from the probability distribution device to which the second artificial data is inputted; and repeating the steps of obtaining the second artificial data and obtaining the third artificial data until a predetermined time is reached.

Another aspect is a system for analyzing an object using a differential equation which models the object. The system includes a sensing device, a data collection device, and an object analysis device. The sensing device is configured to measure one or more parameters of the object. The data collection device is configured to control the sensing device and generate initial data based on the parameters. The object analysis device is configured to: construct a probability distribution device by: constructing a linear multi-step device (scheme; method) usable to predict a solution to the time-dependent partial differential equation; constructing a non-parametric regression prior; and placing the non-parametric regression prior on a predetermined term in the linear multi-step device; and run the probability distribution device by: setting a time step size; inputting the initial data to the probability distribution device, the initial data representative of data at an initial time step; obtaining first artificial data at a first time step, the first time step being increased from the initial time step by the time step size, the first artificial data being calculated based on a first output from the probability distribution device to which the initial data is inputted; obtaining second artificial data at a second time step, the second time step being increased from the first time step by the time step size, the second artificial data being calculated based on a second output from the probability distribution device to which the first artificial data is inputted; obtaining third artificial data at a third time step, the third time step being increased from the second time step by the time step size, the third artificial data being calculated based on a third output from the probability distribution device to which the second artificial data is inputted; and repeating the steps of obtaining the second artificial data and obtaining the third artificial data until a predetermined time is reached.

Yet another aspect is a method for analyzing an object. The method includes obtaining a differential equation that models the object; measuring a set of control data from the object; constructing a probability distribution device based on the differential equation and the set of control data; and running the probability distribution device to obtain output data, the output data including information representative of the object.

Yet another aspect is a system for analyzing an object using a differential equation. The system includes a sensing device for measuring one or more parameters of the object, a data collection device configured to control the sensing device and generate control data based on the parameters, and an object analysis device. The object analysis device is configured to obtain a differential equation that models the object; obtain the control data from the data collection device; construct a probability distribution device based on the differential equation and the control data; and run the probability distribution device to obtain output data, the output data including information representative of the object.

Yet another aspect is a method of analyzing an object. The method includes modeling the object with a differential equation; calculating anchor point data, the anchor point data including a solution to the differential equation; constructing a first prior probability distribution, the first prior probability distribution being a prior probability distribution on the solution to the differential equation; constructing a second prior probability distribution, the second prior probability distribution being a prior probability distribution on the differential equation; measuring sample data from the object using a sensing device; running the second prior probability distribution using the sample data to estimate one or more hyperparameters, the one or more hyperparameters associated with the first prior probability distribution and the second prior probability distribution; and obtaining a posterior probability distribution for the solution to the differential equation based on the sample data and the anchor point data.

DETAILED DESCRIPTION

Figure 1:
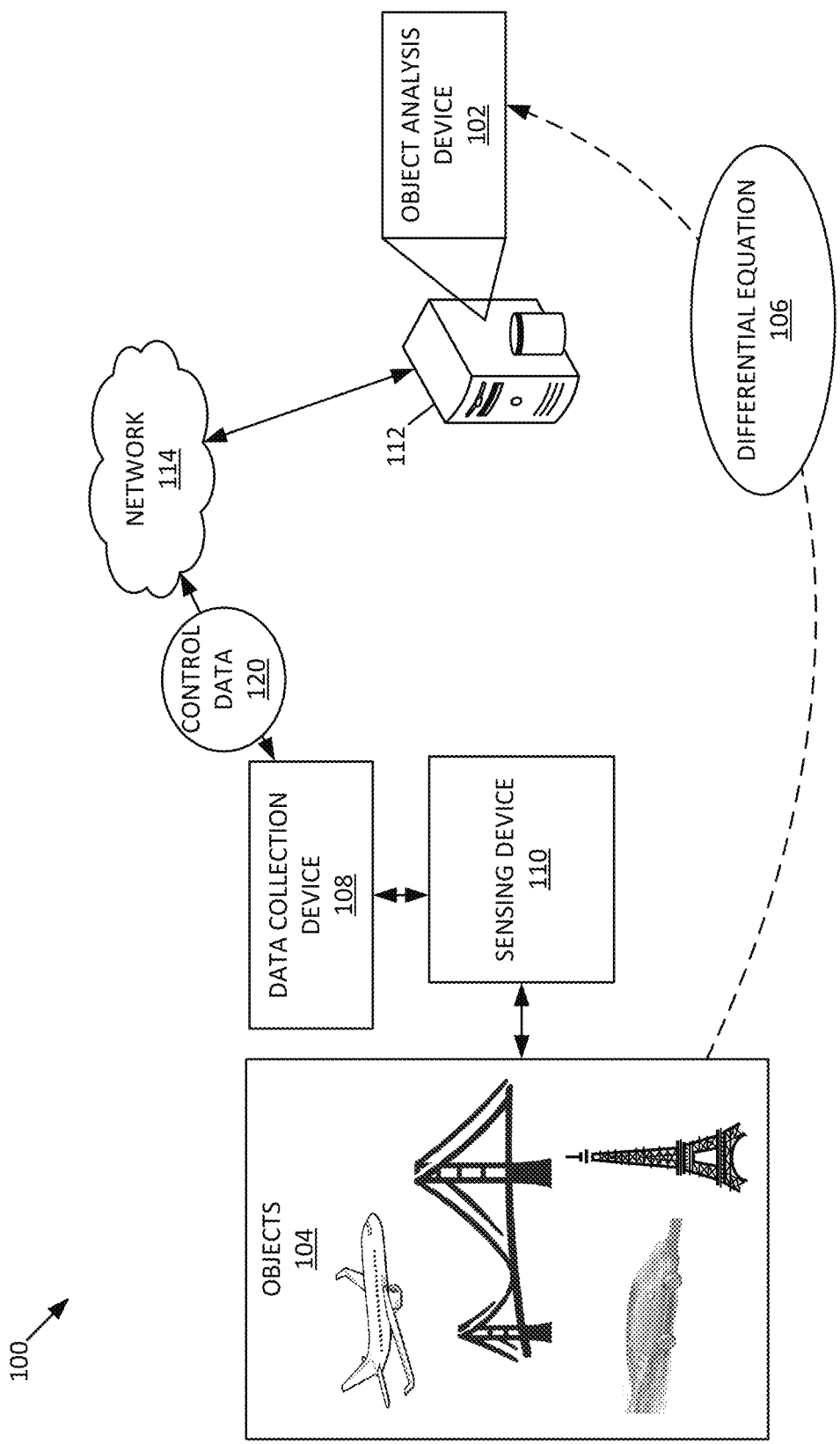
FIG. 1 illustrates a system for analyzing an object using a differential equation in accordance with an exemplary embodiment of the present disclosure.

Various embodiments will be described in detail with reference to the drawings, wherein like reference numerals represent like parts and assemblies throughout the several views.

In general, a method for analyzing one or more objects in accordance with the present disclosure models the objects with a differential equation, such as a linear partial differential equation (PDE), and samples data associated with the objects. The sampled data refer to the right hand side (RHS) of the differential equation. In some examples, the data can be obtained at scattered space-time points. The method of the present disclosure then uses a probability distribution device to obtain the solution to the equation. Some non-limiting examples of the objects include a vehicle, bridge, building, fluid, or any other object that can be evaluated for one or more physical characteristics thereof. Physical characteristics of an object may be, but are not limited to, movement, displacement, variation, or any change in sound, heat, electrostatics, electrodynamics, fluid flow, elasticity, quantum mechanics, heat transfer, and other dynamic characteristics. One example of the probability distribution device employs Gaussian process (GP) regression. The probability distribution device can be constructed based on the type of the differential equation.

As such, the method of the present disclosure does not use discretization of differential equations as required by typical numerical approximation approaches. Such numerical approximation approaches become less reliable in high dimensions (physical or parameter space). Further, data obtained from boundary conditions, or excitation forces, can render solutions from numerical discretization methods erroneous. In contrast, the sampling as used in present disclosure avoids the dimensionality problem. Further, the probability distribution method of the present disclosure can handle non-sterilized (e.g., noisy or imperfect) data of variable fidelity, combining experimental measurements and outputs from black-box simulation codes as well as data with sharp discontinuity. Further, while numerical approaches depend on the mathematical type of an equation (e.g., hyperbolic versus parabolic), the methods of the present disclosure are unaffected by such mathematical differences.

The methods of the present disclosure provide an interface between probabilistic machine learning and differential equations. In some examples, the methods are driven by data for linear equations using Gaussian process priors tailored to the corresponding integro-differential operators. The only observables are scarce noisy multi-fidelity data for the forces and solutions that are not required to reside on the domain boundary. The resulting predictive posterior distributions quantify uncertainty and lead to adaptive solution refinement via active learning. The methods of the present disclosure circumvent several constraints of numerical discretization as well as the consistency and stability issues of time-integration, and are scalable to high-dimensions. As such, the methods of the present disclosure provide a principled and robust handling of uncertainties due to model inadequacy, parametric uncertainties, and numerical discretization or truncation errors. The methods may further provide a flexible and general platform for Bayesian reasoning and computation.

FIG. 1 illustrates a system 100 for analyzing an object using a differential equation in accordance with an example embodiment of the present disclosure.

In general, the system 100 provides an object analysis device 102 to analyze an object 104 that is modeled with a differential equation 106. In some examples, the system 100 includes a data collection device 108 configured to collect data associated with the object 104. For example, the data collection device 108 controls a sensing device 110 configured to measure one or more parameters associated with the object 104.

The object 104 can be of various types that can be modeled and analyzed with a differential equation. In some examples, the object 104 is a physical object, such as, but not limited to, a vehicle, bridge, building, fluid, or any other object that can be evaluated for various characteristics thereof. As described herein, methods of the present disclosure can be used to evaluate various characteristics of the object 104 such as movement, displacement, variation, or any change in sound, heat, electrostatics, electrodynamics, fluid flow, elasticity, quantum mechanics, heat transfer, and other dynamic characteristics of systems.

In some examples, the differential equation can be of various types. One example differential equation is a partial differential equation (PDE). A PDE 106 is a differential equation that contains multivariable functions and partial derivatives thereof. A PDE is different from an ordinary differential equation (ODE) in that an ODE includes functions of a single variable and derivatives thereof. In some examples, PDEs are used to formulate problems involving functions of several variables and used to generate a relevant computer model for a system or phenomenon to be analyzed.

In many applications, PDEs can be used to describe or model a variety of objects, which can include multidimensional systems. In some examples, such objects include physical objects. PDEs can be used to interpret various characteristics (e.g., features, conditions, or behaviors) of the objects. Such characteristics include but are not limited to movement, displacement, variation, or any change in sound, heat, electrostatics, electrodynamics, fluid flow, elasticity, quantum mechanics, heat transfer, and other dynamic characteristics of systems. PDEs involve rates of change of continuous variables. For example, where a rigid body is analyzed, a position of the rigid body is described by six variables, and the dynamics of the rigid body take place in a finite-dimensional configuration space. Where a fluid is modeled, a configuration of a fluid is given by a continuous distribution of multiple variables including the temperature and pressure, and the dynamics of the fluid occur in an infinite-dimensional configuration space.

In general, a PDE for a function $u(x_1, \ldots, x_n)$ is described as the following function:

$$f\left(x_1, \ldots, x_n, u, \frac{\partial u}{\partial x_1}, \ldots, \frac{\partial u}{\partial x_n}, \frac{\partial^2 u}{\partial x_1 \partial x_1}, \ldots, \frac{\partial^2 u}{\partial x_1 \partial x_n}, \ldots\right) = 0.$$

If f is a linear function of u and its derivatives, the PDE is defined to be linear. Linear PDEs are typically used to describe, for example, heat equations, wave equations, Laplace's equations, Helmholtz equations, Klein-Gordon equations, and Poisson's equations.

In many applications, PDEs are typically solved using numerical methods, such as the finite element method (FEM), finite difference methods (FDM), and finite volume methods (FVM). The finite element method (FEM) or finite element analysis is a numerical technique for determining approximate solutions of PDEs. The finite element method can eliminate a PDE completely, or render a PDE into an approximating system of ordinary differential equations, which are then numerically integrated using standard techniques such as the Euler method and the Runge-Kutta methods. The finite difference method (FDM) is a numerical method for approximating the solutions to differential equations using finite difference equations to approximate derivatives. The finite volume method (FVM) calculates values at discrete places on a meshed geometry, similarly to the finite element method or the finite difference method. The finite volume method considers a small volume surrounding each node point on a mesh, and converts surface integrals in a PDE that contain a divergence term into volume integrals, using the Divergence theorem. These terms are then evaluated as fluxes at the surfaces of each finite volume. As such, these methods commonly involve discretization of a linear operator and solve a system in many degrees of freedom, which are unknown solutions. These numerical methods are conditioned on various assumptions and sterilized data. However, in reality, such assumptions are hardly met, and data is obtained with noise. Further, the numerical methods become less reliable as the dimension increases.

As described herein, the object analysis device 102 can provide reliable analysis results with improved accuracy, even with non-sterilized data of variable fidelity, using the probability distribution method, thereby avoiding the dimensionality problem.

With continued reference to FIG. 1, the data collection device 108 operates to control the sensing device 110 to obtain data associated with the object 104, and transmit such data to the object analysis device 102 for further evaluation. In some examples, the data collection device 108 generates control data based on the parameters measured by the sensing device 110.

The sensing device 110 operates to detect parameters of the object 104 to obtain data associated with the object 104. In some examples, parameters of the object 104 indicate changes in physical characteristics of the object that are under observation. As described herein, physical characteristics may be, but are not limited to movement, displacement, variation, force, pressure, or any change in sound, heat, electrostatics, electrodynamics, fluid flow, elasticity, quantum mechanics, heat transfer, and other dynamic characteristics.

In some examples, the sensing device 110 includes one or more sensors configured to engage or attach at different portions or locations of the object 104. In other embodiments, the sensors are positioned near or adjacent to the object 104. The sensing device 110 can include various types of sensors in a wide variety of technologies.

Examples of the sensors include sensors in acoustic, sound, and vibration technologies (e.g., geophone, hydrophone, lace sensor, microphone, seismometer, and any suitable sensors), sensors in automotive and transportation areas (e.g., air flow meter, air-fuel ratio meter, blind spot monitor, crankshaft position sensor, curb feeler, defect detector, engine coolant temperature sensor, hall effect sensor, knock sensor, MAP sensor, mass flow sensor, oxygen sensor, parking sensors, radar gun, speedometer, speed sensor, throttle position sensor, tire-pressure monitoring sensor, torque sensor, transmission fluid temperature sensor, turbine speed sensor, variable reluctance sensor, vehicle speed sensor, water sensor, wheel speed sensor, and any suitable sensors), sensors in chemical technology (e.g. breathalyzer, carbon dioxide sensor, carbon monoxide detector, catalytic bead sensor, chemical field-effect transistor, chemiresistor, electrochemical gas sensor, electronic nose, electrolyte—insulator—semiconductor sensor, fluorescent chloride sensors, holographic sensor, hydrocarbon dew point analyzer, hydrogen sensor, hydrogen sulfide sensor, infrared point sensor, ion-selective electrode, nondispersive infrared sensor, microwave chemistry sensor, nitrogen oxide sensor, olfactometer, optode, oxygen sensor, ozone monitor, pellistor, pH glass electrode, potentiometric sensor, redox electrode, smoke detector, zinc oxide nanorod sensor, and any suitable sensor), sensors in electric current, electric potential, magnetic, and radio technologies (e.g., current sensor, Daly detector, electroscope, electron multiplier, Faraday cup, galvanometer, Hall effect sensor, Hall probe, magnetic anomaly detector, magnetometer, magnetoresistance, MEMS magnetic field sensor, metal detector, planar Hall sensor, radio direction finder, voltage detector, and any suitable sensors), sensors in environment, weather, moisture, humidity related technologies (e.g., actinometer, air pollution sensor, bedwetting alarm, ceilometer, Dew warning, electrochemical gas sensor, fish counter, frequency domain sensor, gas detector, hook gauge evaporimeter, humistor, hygrometer, leaf sensor, pyranometer, pyrgeometer, psychrometer, rain gauge, rain sensor, seismometers, SNOTEL, snow gauge, soil moisture sensor, stream gauge, tide gauge, and any suitable sensors), sensors in flow and fluid velocity technologies (e.g., air flow meter, anemometer, flow sensor, gas meter, mass flow sensor, water meter, and any suitable sensors), sensors relating to ionizing radiation and subatomic particles (e.g., cloud chamber, Geiger counter, neutron detection, scintillation counter, and any suitable sensors), sensors relating to navigation instruments (e.g., air speed indicator, altimeter, attitude indicator, depth gauge, fluxgate compass, gyroscope, inertial navigation system, inertial reference unit, magnetic compass, MHD sensor, ring laser gyroscope, turn coordinator, TiaLinx sensor, variometer, vibrating structure gyroscope, yaw rate sensor, and any suitable sensors), sensors for position, angle, displacement, distance, speed, or acceleration (e.g., auxanometer, capacitive displacement sensor, capacitive sensing, flex sensor, free fall sensor, gravimeter, gyroscopic sensor, impact sensor, inclinometer, integrated circuit piezoelectric sensor, laser rangefinder, laser surface velocimeter, LIDAR, linear encoder, linear variable differential transformer (LVDT), liquid capacitive inclinometers, odometer, photoelectric sensor, piezocapacitive sensor, piezoelectric accelerometer, position sensor, position sensitive device, rate sensor, rotary encoder, rotary variable differential transformer, selsyn, shock detector, shock data logger, stretch sensor, tilt sensor, tachometer, ultrasonic thickness gauge, variable reluctance sensor, velocity receiver, and any suitable sensors), sensors for optical, light, imaging, or photon related technologies (e.g., charge-coupled device, CMOS sensor, colorimeter, contact image sensor, electro-optical sensor, flame detector, infra-red sensor, kinetic inductance detector, LED as light sensor, light-addressable potentiometric sensor, Nichols radiometer, fiber optic sensors, optical position sensor, thermopile laser sensors, photodetector, photodiode, photomultiplier tubes, phototransistor, photoelectric sensor, photoionization detector, photomultiplier, photoresistor, photoswitch, phototube, scintillometer, shack-Hartmann, single-photon avalanche diode, superconducting nanowire single-photon detector, transition edge sensor, visible light photon counter, wavefront sensor, and any suitable sensors), pressure sensors (e.g., barograph, barometer, boost gauge, Bourdon gauge, hot filament ionization gauge, ionization gauge, McLeod gauge, oscillating U-tube, permanent Downhole Gauge, piezometer, Pirani gauge, pressure sensor, pressure gauge, tactile sensor, time pressure gauge, and any suitable sensors), sensors for force, density, or level measurements (e.g. bhangmeter, hydrometer, force gauge and force Sensor, level sensor, load cell, magnetic level gauge, nuclear density gauge, piezocapactive pressure sensor, piezoelectric sensor, strain gauge, torque sensor, viscometer, and any suitable sensors), sensors for thermal, heat, or temperature measurements (e.g., bolometer, bimetallic strip, calorimeter, exhaust gas temperature gauge, flame detection, gardon gauge, golay cell, heat flux sensor, infrared thermometer, microbolometer, microwave radiometer, net radiometer, quartz thermometer, resistance temperature detector, resistance thermometer, silicon bandgap temperature sensor, special sensor microwave/imager, temperature gauge, thermistor, thermocouple, thermometer, pyrometer, and any suitable sensors), sensors for proximity presence detection (e.g., alarm sensor, Doppler radar, motion detector, occupancy sensor, proximity sensor, passive infrared sensor, reed switch, stud finder, triangulation sensor, touch switch, wired glove, and any suitable sensors), and any other currently-available sensors or sensors to be developed for various purposes.

Figure 24:
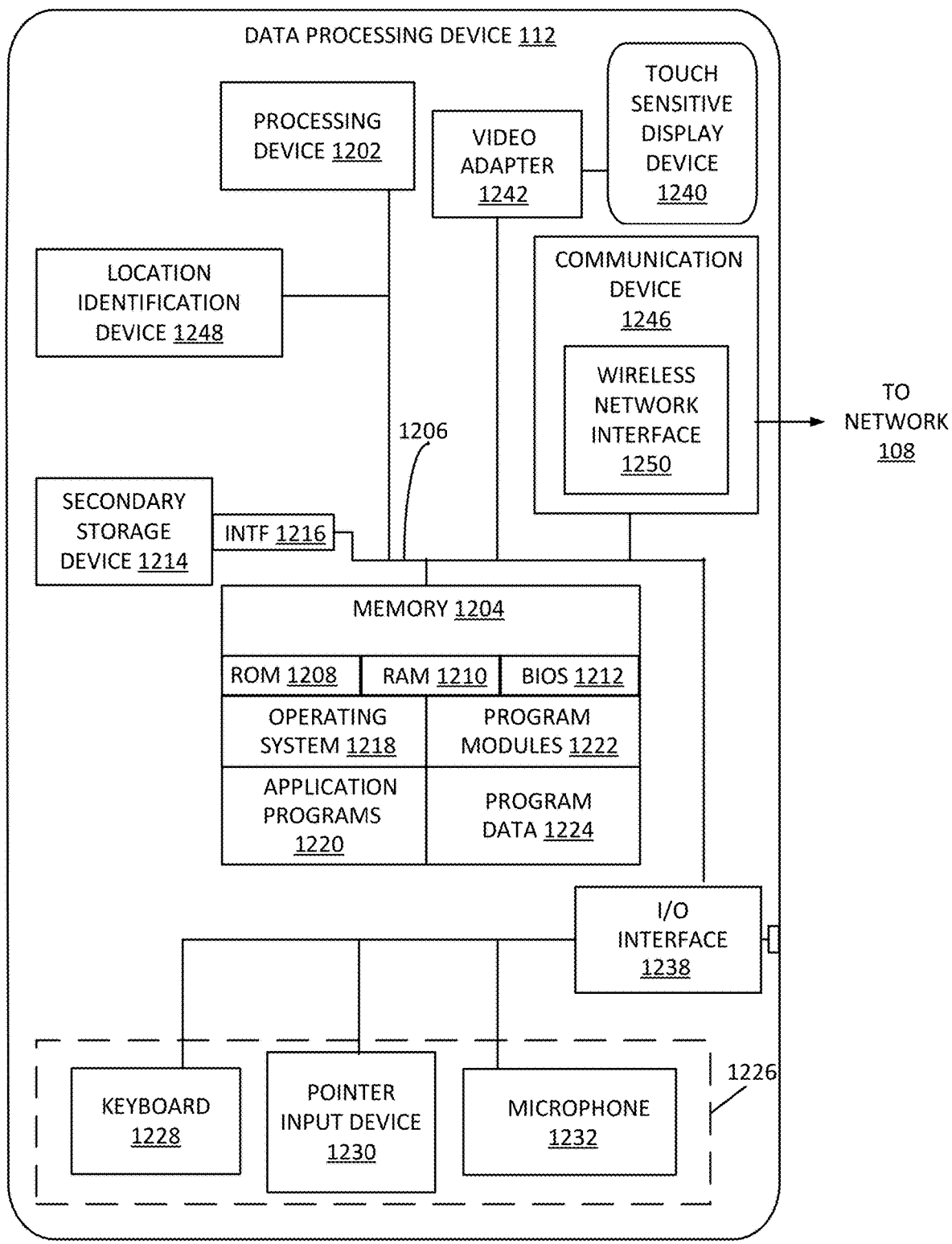
FIG. 24 illustrates an exemplary architecture of a data analysis device.

Referring still to FIG. 1, in some examples, the object analysis device 102 is provided with a data processing system 112. The data processing system 112 can operate to communicate with the data collection device 108 via a data communication network 114. In some embodiments, the data processing system 112 operates to process data, such as data associated with the object 104, transmitted from the data collection device 108 and analyze the data to provide an evaluation result. In some embodiments, the data processing system 112 includes one or more computing devices, an example of which is illustrated in FIG. 24.

The data communication network 114 communicates data between one or more computing devices, such as between the data collection device 108 and the data processing system 112. Examples of the network 114 include a local area network and a wide area network, such as the Internet. In some embodiments, the network 114 includes a wireless communication system, a wired communication system, or a combination of wireless and wired communication systems. A wired communication system can transmit data using electrical or optical signals in various possible embodiments. Wireless communication systems typically transmit signals via electromagnetic waves, such as in the form of optical signals or radio frequency (RF) signals. A wireless communication system typically includes an optical or RF transmitter for transmitting optical or RF signals, and an optical or RF receiver for receiving optical or RF signals. Examples of wireless communication systems include Wi-Fi communication devices (such as utilizing wireless routers or wireless access points), cellular communication devices (such as utilizing one or more cellular base stations), and other wireless communication devices.

Figure 2:
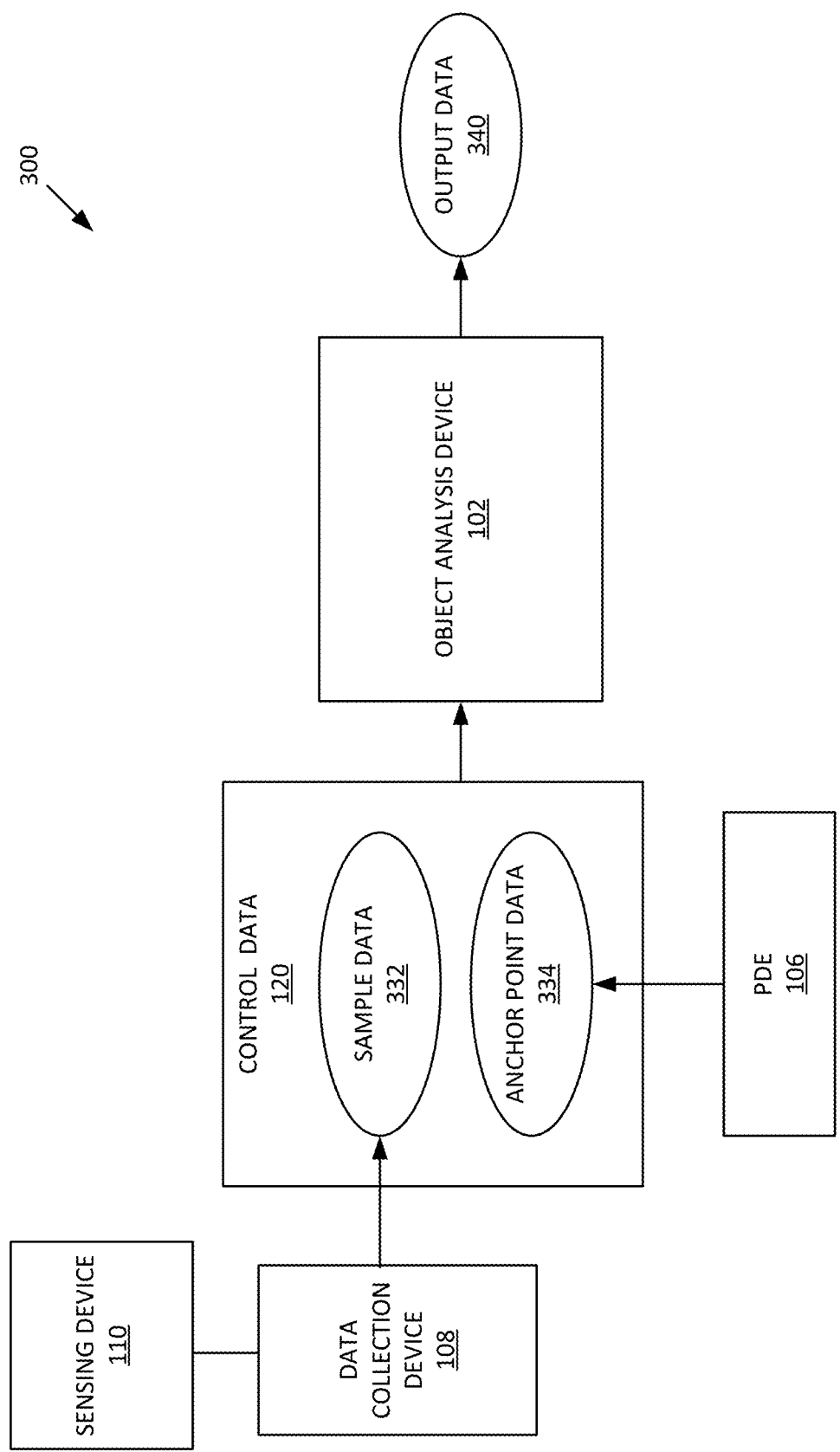
FIG. 2 is a block diagram of an example method for operating the system.

FIG. 2 is a block diagram of an example method 330 for operating the system 100. As described in FIG. 1, the control data 120 is provided to the object analysis device 102. In some examples, the control data 120 includes sample data 332 and anchor point data 334.

The sample data 332 includes data obtained by the sensing device 110 controlled by the data collection device 108. In some examples, the sensing device 110 includes one or more sensors configured to be engaged with different locations of the object 104 to be analyzed. In other embodiments, the one or more sensors are positioned proximate to the object 104 under observation. The sensors can be controlled by the data collection device 108 and can be used to detect parameters of the object 104 that may determine a characteristic of the object. In some embodiments, parameters affect one or more characteristics of the object 104. For example, where a differential equation is used to model the object, the right hand side of the equation includes one or more variables to represent one or more parameters of the object, and a solution of the equation (i.e., the left hand side) can indicate one or more characteristics of the object. As described herein, in some examples, sensors can be used to detect one or more parameters of the object, and a characteristic of the object can be determined using the detected one or more parameters of the object. By way of example, where a vertical displacement of a bridge (e.g., an object 104) is a characteristic under observation, the sensing device 110 may include a plurality of displacement sensors that can be attached to or positioned proximate to different locations of the bridge. Accordingly, the displacement sensors may be used to measure a displacement parameter of the bridge over time. In other examples, other types of parameters, such as force or vibrations associated with the bridge can be detected to determine the vertical displacement (i.e., the characteristic) of the bridge.

Unlike numerical methods for solving PDEs, the methods of the present disclosure use data that is randomly sampled. Such sampled data can include noisy or erroneous data of various fidelities. Further, the methods of the present disclosure need not consider initial conditions and boundary conditions, which are inaccurate or approximate at most. Therefore, the methods herein provide flexibility and freedom in choosing samples and determining a solution to a given PDE.

The anchor point data 334 includes one or more points of data on a solution to the PDE 106. The anchor point data 334 is used to infer more reliable solutions to the PDE 106. In some examples, the anchor point data 334 can be a set of approximate solutions to the PDE 106 by incorporating noise factors (e.g., $\varepsilon_0$ in the examples below). The anchor point data 334 can be data at random points associated with on the object, and need not be boundary values or initial values.

Upon receiving the control data 120, the object analysis device 102 uses the control data 120 to generate an output data 340. An example of the output data 340 is described with reference to FIG. 7.

Figure 3:
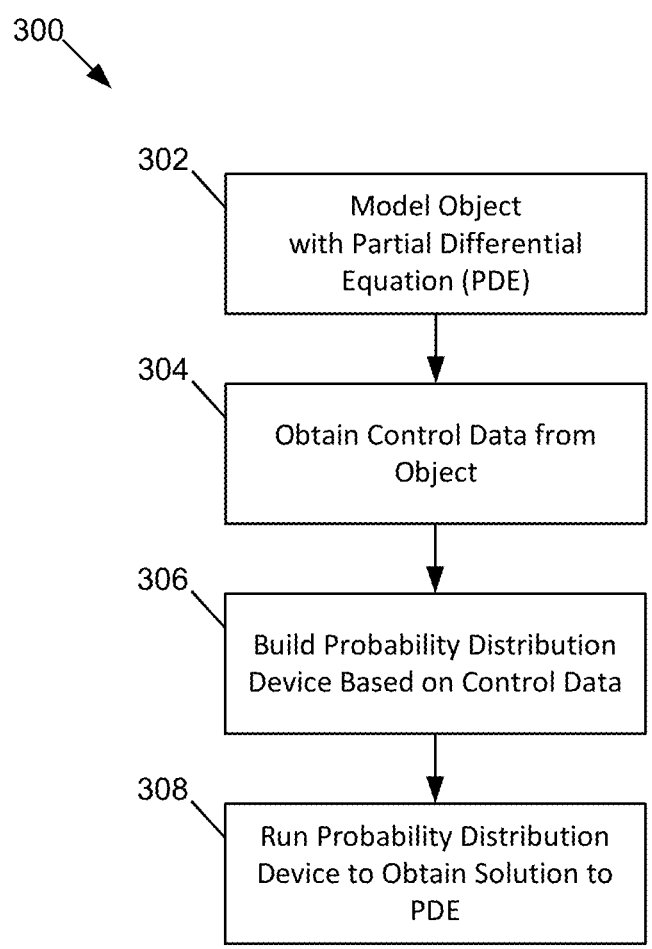
FIG. 3 is a flowchart generally illustrating an example method of operating the system including the data analysis device.

FIG. 3 is a flowchart generally illustrating an example method 300 of analyzing an object using a differential equation. In some examples, the method 300 begins with operation 302 in which an object 104 is modeled with a differential equation 106. In some examples, the object 104 can be modeled with a partial differential equation (PDE), as described with reference to FIG. 1.

At operation 304, the object analysis device 102 obtains a set of control data 120. In some examples, the control data 120 (FIG. 1) includes sample data 332 and anchor point data 334, as illustrated in FIG. 2. As described below in more detail, sample data 332 can be obtained and measured using the sensing device 110, which is controlled by the data collection device 108. Anchor point data 334 is obtained from the PDE 106. As described below, anchor point data includes one or more points of data on a solution to the PDE 106.

At operation 306, the object analysis device 102 operates to build a probability distribution based on the control data 120. Such a probability distribution includes a distribution of solutions that are provided to the PDE 106. Such a probability distribution can be of various types, such as a Gaussian process distribution, as illustrated in FIG. 4.

At operation 308, the object analysis device 102 runs the probability algorithm to obtain a solution to the PDE 106, which represents analysis of the object 104 for which the PDE 106 has been modeled.

Figure 4:
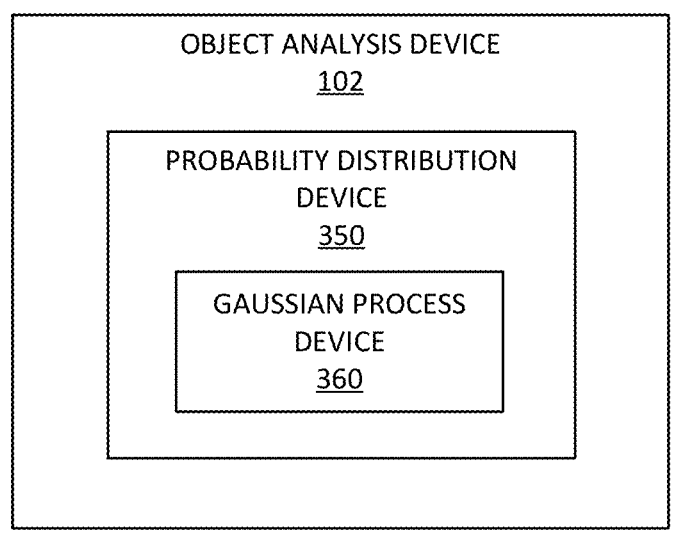
FIG. 4 is a block diagram of an example of the object analysis device.

FIG. 4 is a block diagram of an example of the object analysis device 102 illustrated and described with reference to FIG. 2. Some examples of the object analysis device 102 include a probability distribution device 350. The probability distribution device 350 operates to assign a probability to each measurable subset of possible outcomes of a random test, experiment, survey, or procedure of statistical inference. A probability distribution can be univariate or multivariate.

In some examples, the probability distribution device 350 employs a Bayesian probability interpretation. Bayesian probability is a type of evidential probability. For example, to evaluate the probability of a hypothesis, Bayesian probability specifies some prior probability, which is then updated to a posterior probability in the light of new, relevant data or evidence. The Bayesian interpretation provides a standard set of procedures and formulae to perform this calculation. Bayesian methods use random variables, or, more generally, unknown quantities, to model all sources of uncertainty in statistical models. This also includes uncertainty resulting from lack of information. Bayesian approaches need to determine the prior probability distribution taking into account the available (prior) information. Then, when more data becomes available, Bayes' formula is used to calculate the posterior distribution, which subsequently becomes the next prior. In Bayesian statistics, a probability can be assigned to a hypothesis that can differ from 0 or 1 if the truth value is uncertain.

With continued reference to FIG. 4, the probability distribution device 350 includes a Gaussian process device 360. The Gaussian process device 360 uses a Gaussian process, which is a statistical model in which observations occur in a continuous domain, e.g. time or space. In a Gaussian process, every point in some continuous input space is associated with a normally distributed random variable. Moreover, every finite collection of those random variables has a multivariate normal distribution. The distribution of a Gaussian process is the joint distribution of all those random variables, and as such, it is a distribution over functions with a continuous domain, e.g. time or space. As used in a machine-learning algorithm, a Gaussian process uses a measure of the similarity between points (i.e., a kernel function) to predict the value for an unseen point from training data. The prediction provides an estimate for that point as well as uncertainty information.

A Gaussian process is a statistical distribution $X_t$, $t \in T$, for which any finite linear combination of samples has a joint Gaussian distribution. Any linear functional applied to the sample function $X_t$ will give a normally distributed result. A Gaussian distribution can be represented as $X \sim GP(m, K)$, where the random function X is distributed as a Gaussian process with mean function m and covariance function K. In some examples, the random variables $X_t$ is assumed to have a mean of zero, which simplifies calculations without loss of generality and allows the mean square properties of the process to be entirely determined by the covariance function K.

When a Gaussian process is assumed to have a mean of zero, defining the covariance function can define the behavior of the process. For example, the non-negative definiteness of the covariance function enables its spectral decomposition using the Karhunen-Loeve expansion. Aspects that can be defined through the covariance function include the stationarity, isotropy, periodicity, and smoothness of the process. Stationarity refers to the behavior of the process regarding the separation of any two points x and x'. If the process is stationary, it depends on their separation, x–x', and if non-stationary, it depends on the actual position of the points x and x'.

Regarding isotropy, if the process depends only on |x–x'|, the Euclidean distance (not the direction) between x and x', then the process is considered isotropic. A process that is concurrently stationary and isotropic is considered to be homogeneous. In practice, these properties reflect the differences (or rather the lack of them) in the behavior of the process given the location of the observer.

Regarding periodicity, it refers to inducing periodic patterns within the behavior of the process.

Regarding smoothness, Gaussian processes can translate as taking priors on functions and the smoothness of these priors can be induced by the covariance function. If it is expected that for "near-by" input points x and x' their corresponding output points y and y' to be "near-by" also, then the assumption of continuity is present. If significant displacement is allowed, then a rougher covariance function can be chosen.

As such, a Gaussian process can be used as a prior probability distribution over functions in Bayesian inference. Given any set of N points in the desired domain of your functions, a multivariate Gaussian is taken whose covariance matrix parameter is the Gram matrix of your N points with some desired kernel, and data are sampled from that Gaussian. Inference of continuous values with a Gaussian process prior is known as Gaussian process regression, or kriging. Gaussian processes are thus useful as a powerful non-linear multivariate interpolation and out of sample extension tool. Gaussian process regression can be further extended to address learning tasks in both supervised (e.g. probabilistic classification) and unsupervised (e.g. manifold learning) learning frameworks.

Figure 5:
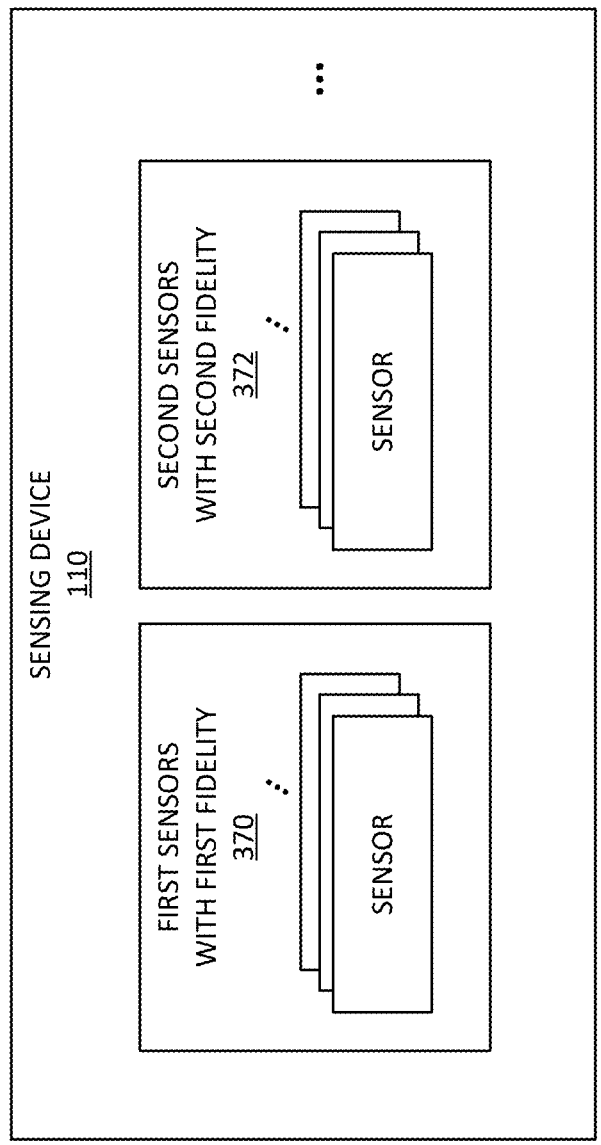
FIG. 5 is a block diagram of an example sensing device.

FIG. 5 is a block diagram of an example of the sensing device 110. In some examples, the sensing device 110 includes a plurality of sensors with different levels of fidelity. For example, the sensing device 110 includes sensors with different levels of fidelity, which are used to obtain multi-fidelity data associated with the object 104. By way of example, the sensing device 110 includes one or more first sensors 370 and one or more second sensors 372. The first sensors 370 are configured to have higher fidelity than the second sensors 372. For example, the first sensors 370 may be capable of measuring data more accurately and reliably than the second sensors 372. In some examples, the first sensors 370 are configured to detect predetermined parameters associated with the object at a first accuracy rate, and the second sensors 372 are configured to measure the parameters at a second accuracy rate that is lower than the first accuracy rate. Although two sets of sensors 370 and 372 are illustrated in FIG. 5, more than two sets of sensors with different levels of fidelity can be used in other examples.

Figure 6:
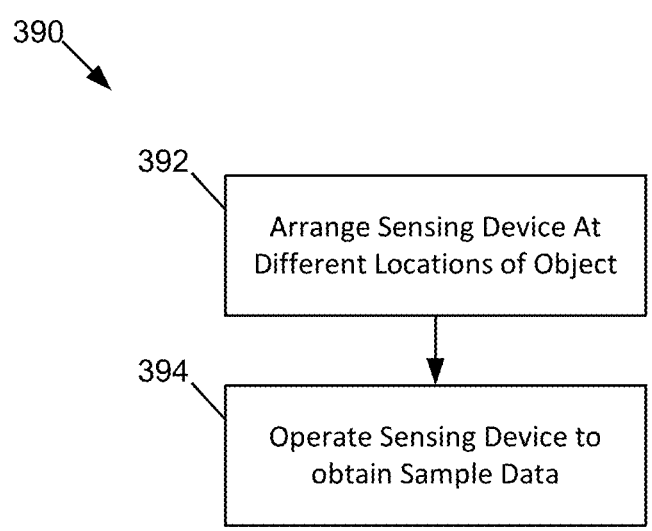
FIG. 6 is a flowchart illustrating an example method of obtaining sample data.

FIG. 6 is a flowchart illustrating an example method 390 of obtaining sample data 332. At operation 392, one or more sensors in the sensing device 110 are arranged at different locations on or near the object 104. In some examples, such locations at which the sensors are positioned are randomly selected. As described herein, the object analysis device 102 can operate to find other locations at which the sensors can be arranged to improve the analysis result of the object analysis device 102. In other embodiments, the one or more sensors are positioned at a predetermined location.

At operation 394, the sensing device 110 is operated to obtain sample data 332 from the object 104. In some examples, the sensors of the sensing device 110 each detect one or more parameters associated with the object 104 over time. In embodiments, the sensing device 110 records the detected parameters and converts them into sample data 332. In some examples, the sample data 332 can be transmitted to the object analysis device 102 via the network 114.

Figure 7:
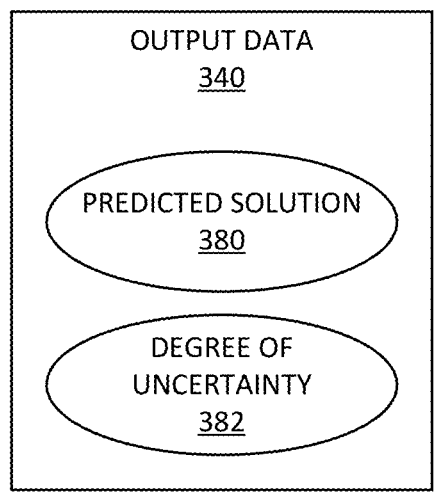
FIG. 7 is a block diagram of example output data.

FIG. 7 is a block diagram of an example of output data 340. In some examples, output data 340 presents a predicted solution 380 and a degree of uncertainty 382 associated with the solution 380.

The predicted solution 380 is a solution to the PDE 106 that is obtained by the object analysis device 102. As the PDE 106 is used to model the object 104 to evaluate one or more predetermined characteristics of the object 104, the predicted solution 380 can represent such characteristics in interest about the object 104. As described herein, in some examples, the predicted solution 380 can be provided as a distribution of solutions.

The degree of uncertainty 382 represents uncertainty (also referred to as variance or error) associated with the obtained solutions. Various factors can cause or contribute to uncertainty. For example, noise in the data and insufficient number of data can be factors associated with such uncertainty. Where the object analysis device 102 employs a Gaussian process regression, the output data 340 can present a posterior distribution of the Gaussian process. In this case, the degree of uncertainty 382 can be obtained from, or expressed by, a posterior variance of the Gaussian distribution.

Figure 8:
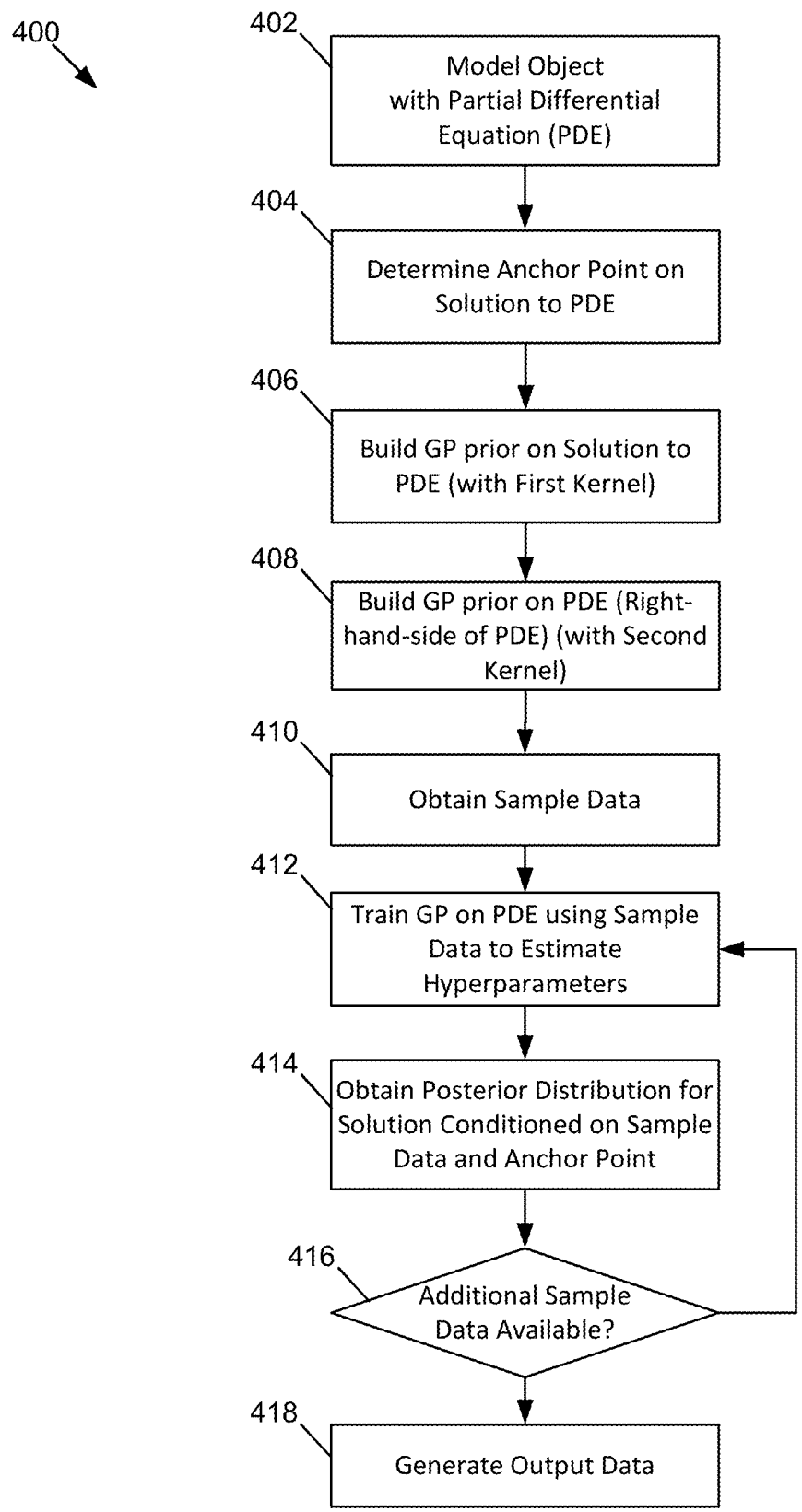
FIG. 8 is a flowchart of an example method for operating the object analysis device.

FIG. 8 is a flowchart of an example method 400 for operating the object analysis device 102.

At operation 402, the object analysis device 102 operates to model an object 104 with a partial differential equation (PDE) 106. The PDE 106 can be used to model, and obtain a solution to, one or more characteristics of the object 104. In some examples, such characteristics can include an attribute, behavior, condition, and any other things that describe a behavior of the object 104.

By way of example, where a bridge is an object to be analyzed, a vertical displacement of the bridge can be the characteristic of the object that is to be solved by the PDE 106. Furthermore, the one or more parameters that are to be detected are represented by variables in the right hand side of the PDE. In this example, force or vibration resulting from wind or other sources can be a parameter represented by a variable in the right hand side of the PDE 106. Such force or vibration data is noisy because it can originate from multiple sources.

At operation 404, the object analysis device 102 can determine one or more anchor points 334 on the solution to the PDE 106. As described herein, the anchor point data 334 includes one or more points of data on a solution to the PDE 106. In some examples, the anchor point data 334 can be a set of approximate solutions to the PDE 106 by incorporating noise factors (e.g., $\varepsilon_0$ in the examples herein). The anchor point data 334 can be data at random points associated with the object, and need not be boundary values or initial values.

At operation 406, the object analysis device 102 operates to obtain a prior probability distribution on the solution to the PDE 106. As described herein, in some examples, a Gaussian process can be used as such a prior probability distribution on the solution. The prior on the solution is provided with a first kernel function.

At operation 408, the object analysis device 102 operates to obtain a prior probability distribution on the PDE 106. As described herein, in some examples, a Gaussian process can be used as such a prior probability distribution over the PDE 106. The prior on the PDE 106 is provided with a second kernel function.

At operation 410, the object analysis device 102 obtains sample data 332 associated with the object 104. In some examples, the sensing device 110 is engaged with the object 104 or positioned proximate to the object and is used to measure parameters associated with the object 104. As described herein, such parameters are represented by variables in the right hand side of the PDE. The data collection device 108 can be used to control the sensing device 110 and transmit the collected sample data 332 to the object analysis device 102.

At operation 412, the object analysis device 102 operates to train the probability distribution (e.g., Gaussian process) using the sample data 332 to estimate hyperparameters that are associated with the first and second kernel functions.

At operation 414, the object analysis device 102 operates to obtain a posterior distribution for the solution to the PDE 106 conditioned on the sample data 332 and the anchor points 334.

At operation 416, the object analysis device 102 determines whether there is additional sample data available. If so ("YES" at this operation), the method 400 returns to the operation 412 to further train the probability distribution using the additional sample data. Otherwise ("NO" at this operation), the method 400 continues to operation 418.

At operation 418, the object analysis device 102 operates to generate output data 340 based on the posterior distribution for the solution to the PDE 106. As described with reference to FIG. 7, the output data 340 includes a predicted solution 380 and a degree of uncertainty 382 which is determined from the posterior distribution for the solution to the PDE 106. For example, a variance of the posterior distribution can be used to determine the level of uncertainty 382.

Figure 9:
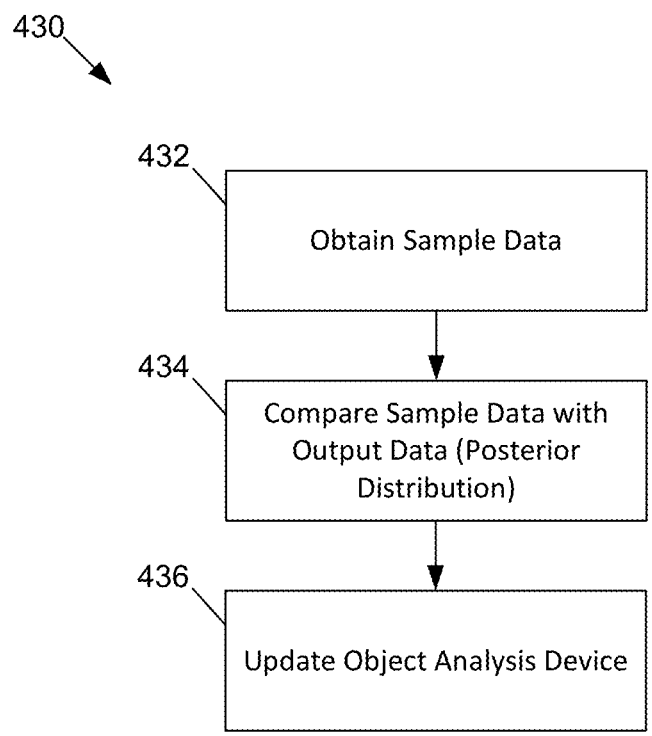
FIG. 9 is a flowchart of an example method for further training the object analysis device.

FIG. 9 is a flowchart of an example method 430 for further training the object analysis device 102. First, the method 430 begins at operation 432 in which sample data 332 is obtained using, for example, one or more sensors described herein. Then, at operation 434, the object analysis device 102 operates to compare the obtained sample data with the output data from the posterior distribution. At operation 436, the object analysis device 102 updates the posterior distribution based on the comparison, thereby improving the accuracy of distribution.

Figure 10:
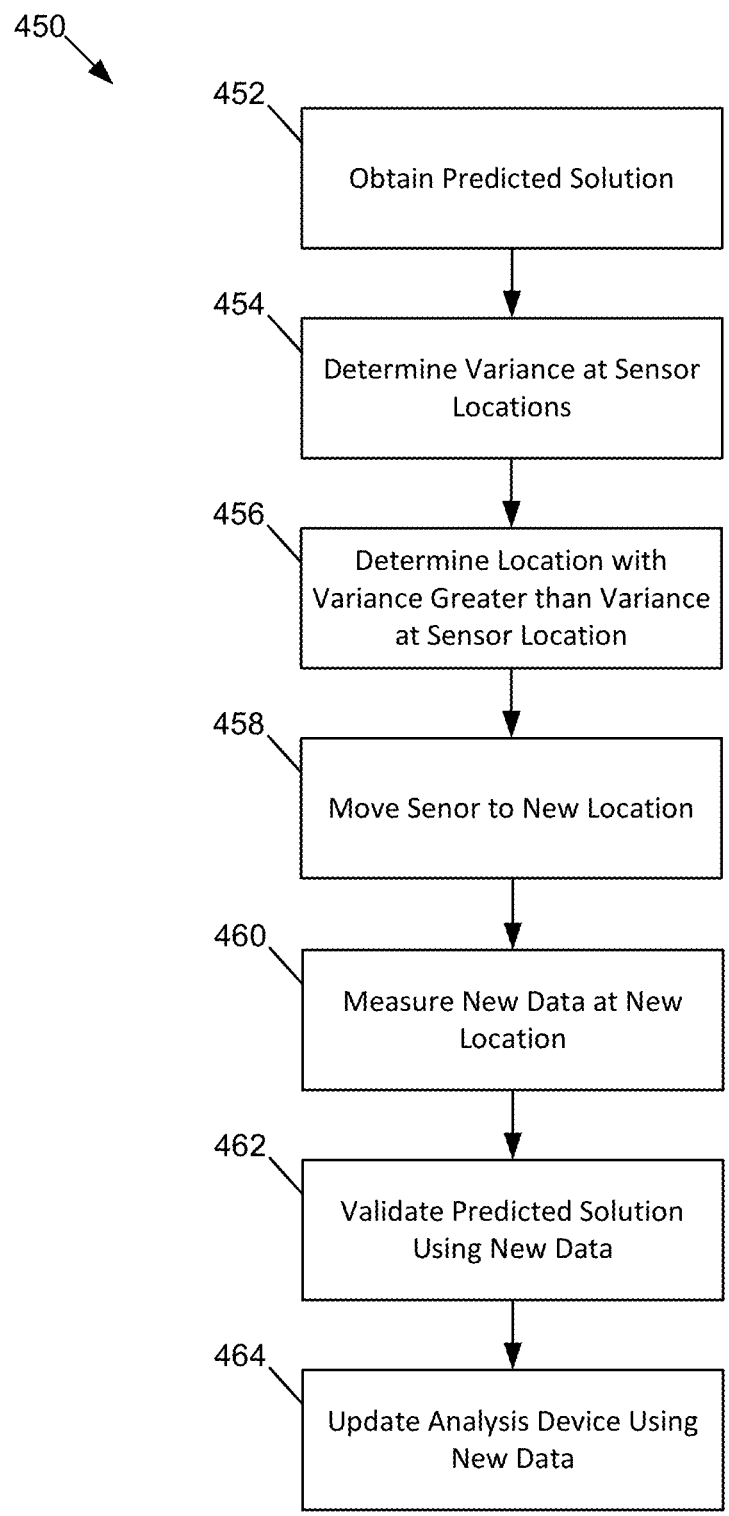
FIG. 10 is a flowchart of an example method for improving sensor locations based on the output data from the object analysis device.

FIG. 10 is a flowchart of an example method 450 for improving sensor locations based on the output data from the object analysis device 102. For brevity, this example method is explained with only one of the sensors in the sensor device 110. However, the method 450 can be equally applicable to a plurality of sensors associated with the object 104.

As described herein, sensors in the sensing device 110 are arranged with respect to an object 104 to be analyzed. In some embodiments, the sensors are arranged at random locations on or near the object 104. Alternatively, the sensors can be arranged in typical locations of or proximate to the object 104. However, such random or typical locations are not necessarily the best locations or portions that can provide the most reliable results. The method 450 uses a built-in quantification of uncertainty (e.g., GP variance) from the probability distribution to determine better, more ideal locations for sensing, and accordingly provides the best possible result with the smallest uncertainty in the solution.

At operation 452, the object analysis device 102 obtains a predicted solution (i.e., the posterior distribution) to the PDE 106. As described herein, the output data 340 includes the predicted solution, which is associated with a degree of uncertainty (i.e., variance).

At operation 454, the object analysis device 102 determines the variance (i.e., a first degree of uncertainty) at the location in which the sensor is currently arranged with respect to the object 104.

At operation 456, the object analysis device 102 determines a location (i.e., a sample data point) that has a variance greater than the variance at the sensor location as determined at the operation 454.

In some examples, the object analysis device 102 looks into a sample data point different from the locations where the sensors are arranged with respect to the object 104. The object analysis device 102 determines a variance (i.e., a second degree of uncertainty) at the sample data point from the predicted solution (i.e., the posterior distribution or probability distribution). Then, the object analysis device 102 compares the first degree of uncertainty and the second degree of uncertainty, and determines whether the second degree of uncertainty is higher than the first degree of uncertainty. If the second degree of uncertainty is higher than the first degree of uncertainty (i.e., the variance at the sample data point is greater than the variance at the current sensor location), as further described below, the sensor positioned at the current location is rearranged to a location of the object corresponding to the sample data point. Furthermore, additional sample data is obtained to improve the output data (i.e., the posterior distribution) to reduce uncertainty.

At operation 458, the sensor device 110 is moved to a location having a variance better than the variance associated with the sensor location variance. In some examples, where there are multiple locations having greater variances than the variance at the current sensor location, a new location having the greatest variance can be chosen. In other examples, any of other new locations can be selected having variances greater than the sensor location variance.

At operation 460, new sample data is obtained using the sensor at the new location. The sample date can be obtained in the same manner as done at the previous location.

At operation 462, the object analysis device 102 can validate the predicted solution from the previous posterior distribution using the newly obtained sample data.

At operation 464, the object analysis device 102 is updated and further trained using the sample data obtained at the new location, in order to improve the accuracy of the solution to the PDE.

EXAMPLES

Referring to FIGS. 11-15, the method for analyzing an object in accordance with the present disclosure is further exemplified.

In the following examples, the exact solutions are known and used validate the method of the present disclosure. In these examples, it is confirmed that the method of the present disclosure derives a reliable solution to a PDE by showing that the solution obtained by the method of the present disclosure is very close to the known exact solution. The examples further show that the variance correlates well with the absolute error from the exact solution.

In one example, it is noted that an object to be analyzed is modeled with a linear integro-differential equation in the following equations (1), (2), and (3). In other examples, however, an object can be represented by different types of equations.

$$\mathcal{L}_x u(x) = f(x) | \{x_l, y_l\}_{l=1}^L \tag{1}$$

$$y_l = f_l(x_l) + \varepsilon_l, \ell = 1, \ldots L \tag{2}$$

$$y_0 = u(x_0) + \varepsilon_0 \tag{3}$$

where x is a D-dimensional vector that includes spatial or temporal coordinates, $L_x$ is a linear operator, u(x) denotes an unknown solution to the equation, and f(x) represents the external force that drives an object or system to be analyzed.

In this example, it is assumed that $f = f_L$ is a complex, expensive to evaluate, "black-box" function. For instance, $f_L$ could represent force acting upon as a physical system, the outcome of a costly experiment, the output of an expensive computer code, or any other unknown function.

As described herein, we can obtain a limited number of high fidelity data for $f_L$, denoted by $\{x_L, y_L\}$, that could be corrupted by noise $\varepsilon_L$. In some examples, lower fidelity data can additionally obtained to improve the analysis. For example, supplementary sets of less accurate models $f_l$, $\ell = 1, \ldots, L-1$, can be obtained, which are sorted by increasing level of fidelity and generating data $\{x_l, y_l\}$ that can be contaminated by noise $\varepsilon_l$. Such lower fidelity data may come from simplified computer models, inexpensive sensors, or uncalibrated measurements.

In addition, a small set of data on the solution u, denoted by $\{x_0, y_0\}$, perturbed by noise $\varepsilon_0$, is obtained by sampling at scattered spatio-temporal locations of the object. In this document, such data on the solution is referred to as anchor point. The anchor points can be data at random points on the object, and need not be boundary values or initial values. Although such anchor points can be located on the domain boundaries as in the classical setting, this is not a requirement in the current framework as solution data can be partially available on the boundary or in the interior of either spatial or temporal domains.

It is noted that the method of the present disclosure is not primarily interested in estimating f. Instead, the method is used to estimate the unknown solution u that is related to f through the linear operator $L_x$. For example, where the object is a bridge subject to environmental loading, which is evaluated in a two-level of fidelity setting (i.e., L=2), it is possible to collect scarce but more accurate (high-fidelity) measurements of the wind force $f_2$ (x) acting upon the bridge at some locations. In addition, it may be also possible to gather samples by probing a cheaper but inaccurate (low-fidelity) wind prediction model $f_1$ (x) at some other locations. With these noisy data, the method of the present disclosure operates to accurately estimate the bridge displacements u(x) under the laws of linear elasticity. As described herein, the method can evaluate uncertainty or error associated with such estimation, and further improve the estimation using other observation of the wind force.

In the examples herein, the probability distribution device can employ the Bayesian approach. In some examples, the probability distribution device uses Gaussian process (GP) regression and auto-regressive stochastic schemes. In this configuration, the Bayesian non-parametric nature of GPs can provide analytical tractability properties and natural extension to the multi-fidelity settings as described herein. For example, GPs provide a flexible prior distribution over functions, and a fully probabilistic workflow that returns robust posterior variance estimates which enable adaptive refinement and active learning.

Figure 11:
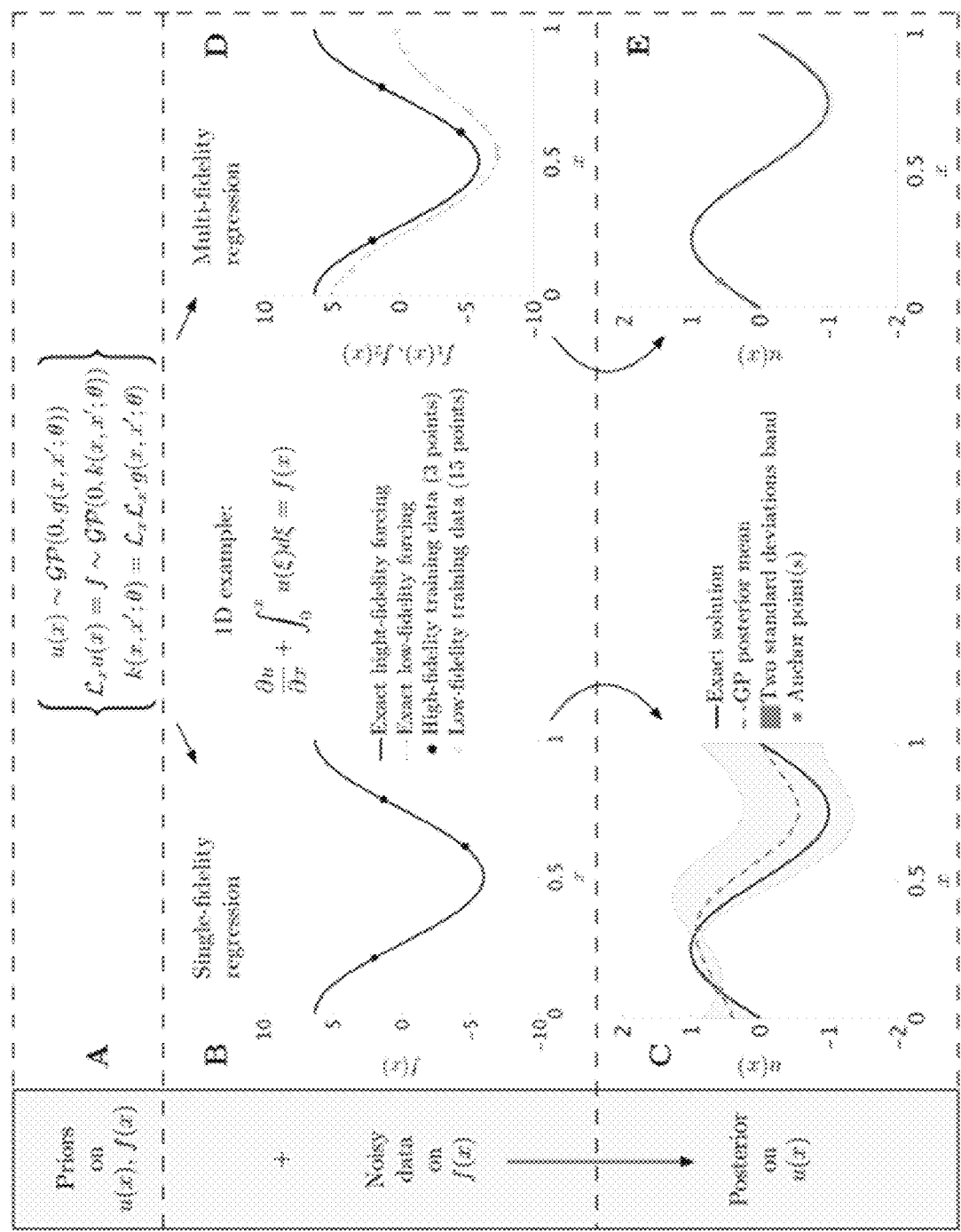
FIG. 11 illustrates an example method of analyzing an object by inferring a solution of a differential equation using noisy multi-fidelity data.

Referring to FIG. 11, an example process of the present disclosure is described, which is to analyze an object by inferring a solution of a differential equation that models the object, using noisy multi-fidelity data. In FIG. 11, a top section (A) shows a prior on an external force function (f(x)) that affects an object in question, and a prior on an unknown solution u(x) to an equation that models the object. Starting from a GP prior on u with kernel g(x,x'; θ), and using the linearity of the operator $L_x$, we obtain a GP prior on f that encodes the structure of the differential equation in its covariance kernel k(x,x'; θ). A middle section (B, D) illustrates that a plurality of data is obtained with respect to the external force function f, and a bottom section (C, E) shows that a posterior distribution on the solution u is obtained from a training process using the obtained data. As described herein, in some examples, such data can be measured using sensors associated with the object. In a graph (B), based on three noisy high-fidelity data points for f, a single-fidelity GP (i.e., ρ=0) with kernel k(x,x'; θ) is trained to estimate the hyper-parameters θ. In a graph (C), the training leads to a predictive posterior distribution for u conditioned on the available data on f and the anchor point(s) on u. For example, in the one-dimensional integro-differential example considered here, the posterior mean gives us an estimate of the solution u while the posterior variance quantifies uncertainty in our predictions. In addition, as shown in graphs (D) and (E), a supplementary set of noisy low-fidelity data points (e.g., 15 data points in the illustrated example) for f is added to further train a multi-fidelity GP, more accurate solutions can be obtained with a tighter uncertainty band.

With continued reference to FIG. 11, the process of the present disclosure is illustrated in two-levels of fidelity (i.e., L=2). It is noted that this example may be generalized to multiple fidelity levels in other examples.

In this example, a solution (e.g., a property, characteristic, feature, and behavior of the object in question) to be estimated and evaluated is represented with an auto-regressive model as in equation (4):

$$u(x) = \rho u_1(x) + \delta_2(x), \tag{4}$$

where $\delta_2(x)$ and $u_1(x)$ are two independent Gaussian Processes with $\delta_2(x) \sim GP(0, g_2(x,x'; \theta_2))$, and $u_1(x) \sim GP(0, g_1(x,x'; \theta_1))$. Here, $g_1(x,x'; \theta_1)$, $g_2(x,x'; \theta_2)$ are covariance functions, $\theta_1$, $\delta_2$ denote their hyper-parameters, and ρ is a cross-correlation parameter to be learned from the data.

The equation (4) can be simply represented as equation (5):

$$u(x) \sim GP(0, g(x,x'; \theta)), \tag{5}$$

where $g(x,x'; \theta) = \rho^2 g_1(x,x'; \theta_1) + g_2(x,x'; \theta_2)$, and $\theta = (\theta_1, \theta_2, \rho)$.

As seen here, derivatives and integrals of a Gaussian Process are still Gaussian Processes. Accordingly, given that the operator $L_x$ is linear, the external force is obtained as equation (6):

$$f(x) \sim GP(0, k(x,x'; \theta)), \tag{6}$$

where $k(x,x'; \theta) = L_x L_{x'} g(x,x'; \theta)$.

Similarly, the auto-regressive structure $f(x) = \rho f_1(x) + \gamma_2(x)$ on the forcing is obtained, where $\gamma_2(X) = L_x \delta_2(x)$, and $f_1(x) = L_x u_1(x)$ are consequently two independent Gaussian Processes with $\gamma_2(x) \sim GP(0, k_2(x,x'; \theta_2))$, and $f_1(x) \sim GP(0, k_1(x,x'; \theta_1))$. Furthermore, for l=1, 2, $k_s(x,x'; \theta_s) = L_x L_{x'} g_s(x,x'; \theta_s)$.

Without loss of generality, all Gaussian process priors used in this example are assumed to have zero mean and a squared exponential covariance function. Moreover, anisotropy across input dimensions is handled by Automatic Relevance Determination (ARD) weights $w_{d,\ell}$.

The kernel function g of the solution u is obtained as in equation (7):

$$g_\ell(x, x'; \theta_\ell) = \sigma_f^2 \exp\left(-\frac{1}{2}\sum_{d=1}^{D} w_{d,\ell}(x_d - x'_d)^2\right), \text{ for } \ell = 1, 2, \quad (7)$$

where $\sigma_\ell^2$ is a variance parameter, x is a D-dimensional vector that includes spatial or temporal coordinates, and $\theta_l = (\sigma_l^2, \{w_{d,l}\}_{d=1}^{D})$.

The choice of the kernel represents our prior belief about the properties of the functions that are to be approximated. From a theoretical point of view, each kernel gives rise to a Reproducing Kernel Hilbert Space that defines the class of functions that can be represented by our prior. In particular, the squared exponential covariance function chosen above implies that smooth approximations are sought. In other examples, more complex function classes can be accommodated by appropriately choosing kernels.

In some examples, the hyper-parameters $\theta = (\theta_1, \theta_2, \rho)$, which are shared between the kernels $g(x, x'; \theta)$ and $k(x, x'; \theta)$, can be estimated by minimizing the negative log marginal likelihood of the GP model (e.g., a training step below). The cross-correlation parameter $\rho$ can represent correlation between data. For example, if the training procedure yields a $\rho$ close to zero, this indicates a negligible cross-correlation between the low- and high-fidelity data. This further implies that the low-fidelity data is not informative, and the algorithm can then automatically ignore them, thus solely trusting the high-fidelity data. In general, $\rho$ could depend on x(i.e., $\rho(x)$), yielding a more expressive scheme that can capture increasingly complex cross correlations. In this example, however, this is not pursued in this example for the sake of clarity. Lastly, once the model has been trained on the available multi-fidelity data on f and anchor points on u, a GP posterior distribution on u is obtained with predictive mean $\bar{u}$ which can be used to perform predictions at a new test point with quantified uncertainty (e.g., a prediction step below). The most computationally intensive part of this workflow is associated with inverting dense covariance matrices during model training, and scales cubically with the number of training data.

In one example, a training step can be described as follows:

The hyper-parameters $\theta = (\theta_1, \theta_2, \rho)$ which are shared between the kernels $g(x, x'; \theta)$ and $k(x, x'; \theta)$ can be estimated by minimizing the negative log marginal likelihood $$NLM\ L(\theta, \sigma_{n_0}^2, \sigma_{n_1}^2, \sigma_{n_2}^2) := -\log p(y | x; \theta, \sigma_{n_0}^2, \sigma_{n_1}^2, \sigma_{n_2}^2),$$

$$\text{with } y := \begin{bmatrix} y_0 \\ y_1 \\ y_2 \end{bmatrix} \text{ and } x := \begin{bmatrix} x_0 \\ x_1 \\ x_2 \end{bmatrix}.$$

Also, the variance parameters associated with the observation noise in u(x), $f_1(x)$ and $f_2(x)$ are denoted by $\sigma_{n_o}^2$, $\sigma_{n_1}^2$, and $\sigma_{H_2}^2$, respectively. Finally, the negative log marginal likelihood is explicitly given by $$NLM\ L = \frac{1}{2} y^T K^{-1} y + \frac{1}{2}\log|K| + \frac{n}{2}\log(2\pi),$$

where $n = n_0 + n_1 + n_2$, $n_\ell$, $\ell = 0, 1, 2$ denote the number of data points in x, $\mathbf{x}_\ell$, and $$K = \begin{bmatrix} K_{00} & K_{01} & K_{02} \\ K_{10} & K_{11} & K_{12} \\ K_{20} & K_{21} & K_{22} \end{bmatrix},$$

with $K_{00} = g(x_0, x_0; \theta) + \sigma_{n_0}^2 I_0$, $K_{01} = K_{10}^T = \rho L_{x'} g_1(x_0, x_1; \theta_1)$, $K_{02} = K_{20}^T = L_{x'} g(x_0, x_2; \theta_2)$, $K_{11} = k_1(x_1, x_1; \theta_1) + \sigma_{n_1}^2 I_1$, $K_{12} = K_{21}^T = \rho k_1(x_1, x_2; \theta_1)$, $K_{22} = k(x_2, x_2; \theta) + \sigma_{n_2}^2 I_2$, with $I_0$, $I_1$, and $I_2$ being the identity matrices of sizes $n_0$, $n_1$, and $n_2$, respectively.

In this example, a prediction step is described as follows:

After training the model on data $\{x_2, y_2\}$ on $f_2$, $\{x_1, y_1\}$ on $f_1$, and anchor points data $\{x_0, y_0\}$ on u, we are interested in predicting the value $u(x)$ at a new test point x. Hence, we are interested in the posterior distribution $p(u(x)|y)$.

This can be computed by first observing that $$\begin{bmatrix} u(x) \\ y \end{bmatrix} \sim N\left(\begin{bmatrix} 0 \\ 0 \end{bmatrix}, \begin{bmatrix} g(x, x) & a \\ a^T & K \end{bmatrix}\right),$$

Where $a := [g(x, x_0; \theta), \rho L_x g_1(x, x_1; \theta_1), L_x g(x, x_2; \theta)]$.

Therefore, we obtain the following predictive distribution for $u(x)$ $p(u(x)|y) = N(\bar{u}(x), V(x))$, with predictive mean $\bar{u}(x) := a K^{-1} y$ and predictive variance $V(x) := g(x, x) - a K^{-1} a^{-T}$.

As shown in the training step and the prediction step, the negative marginal log likelihood is first minimized to estimate the parameters and hyper-parameters of the model using the low- and high-fidelity training data $\{x, y\}$. This step scales as $O(mn^3)$, where m is the number of optimization iterations needed. In this implementation, the gradients of the likelihood is derived with respect to all unknown parameters and hyper-parameters, and used a Quasi-Newton optimizer L-BFGS with randomized initial guesses. Finally, $\bar{u}(x)$ is employed to predict $u(x)$ at a new test point x with a linear cost.

In the example of FIG. 11, the following one dimensional integro-differential operator is considered:

$$L_x u(x) = \frac{\partial}{\partial x} u(x) + \int_0^x u(\xi) d\xi,$$

and assume that the low- and high-fidelity training data $\{x_1, y_1\}$, $\{x_2, y_2\}$ are generated according to $y_\ell=f_\ell(x_\ell)+\varepsilon_\ell$, $\ell=1,2$, where $\varepsilon_1 \sim N(0, 0.3I)$ and $$\varepsilon_2 \sim N(0, 0.05I), f_2(x) = 2\pi\cos(2\pi x) + \frac{1}{\pi}\sin(\pi x)^2,$$

and $f_1(x)=0.8f_2(x)-5x$. This induces a non-trivial cross-correlation structure between $f_1(x)$, $f_2(x)$. The training data points $x_1$ and $x_2$ are randomly chosen in the interval $[0, 1]$ according to a uniform distribution. Here, $n_1=15$ and $n_2=3$ are taken, where $n_1$ and $n_2$ denote the sample sizes of $x_1$ and $x_2$, respectively. Moreover, anchor point data $\{x_0, y_0\}$ is provided on $u(x)$. In this example, $x_0$ is randomly selected in the interval $[0, 1]$ and $y_0=u(x_0)$ is assumed. It is noted that $u(x)=\sin(2\pi x)$ is the exact solution of this problem. The results for this example are illustrated in FIG. 11.

As such, the methodology of the present disclosure can accurately approximate the solution to a one dimensional integro-differential equation (as shown in the above example) in the absence of any numerical discretization of the linear operator, or any data on u other than the minimal set of anchor points that are necessary to pin down a solution. In sharp contrast to classical grid-based solution strategies (e.g. finite difference, finite element methods, etc.), the approach of the present disclosure relaxes the classical well-possedness requirements as the anchor point(s) need not necessarily be prescribed as initial/boundary conditions, and could also be contaminated by noise.

As shown in the graphs (C) and (D), a direct consequence of the Bayesian approach in this example is the built-in uncertainty quantification encoded in the posterior variance of u (e.g., as in the prediction step above). The computed variance reveals regions where model predictions are least trusted, thus directly quantifying model inadequacy. This information is very useful in designing a data acquisition plan that can be used to optimally enhance our knowledge about u. This observation can be used to efficiently learn the solution to differential equations by intelligently selecting the location of the next sampling point and iterating.

Figure 12:
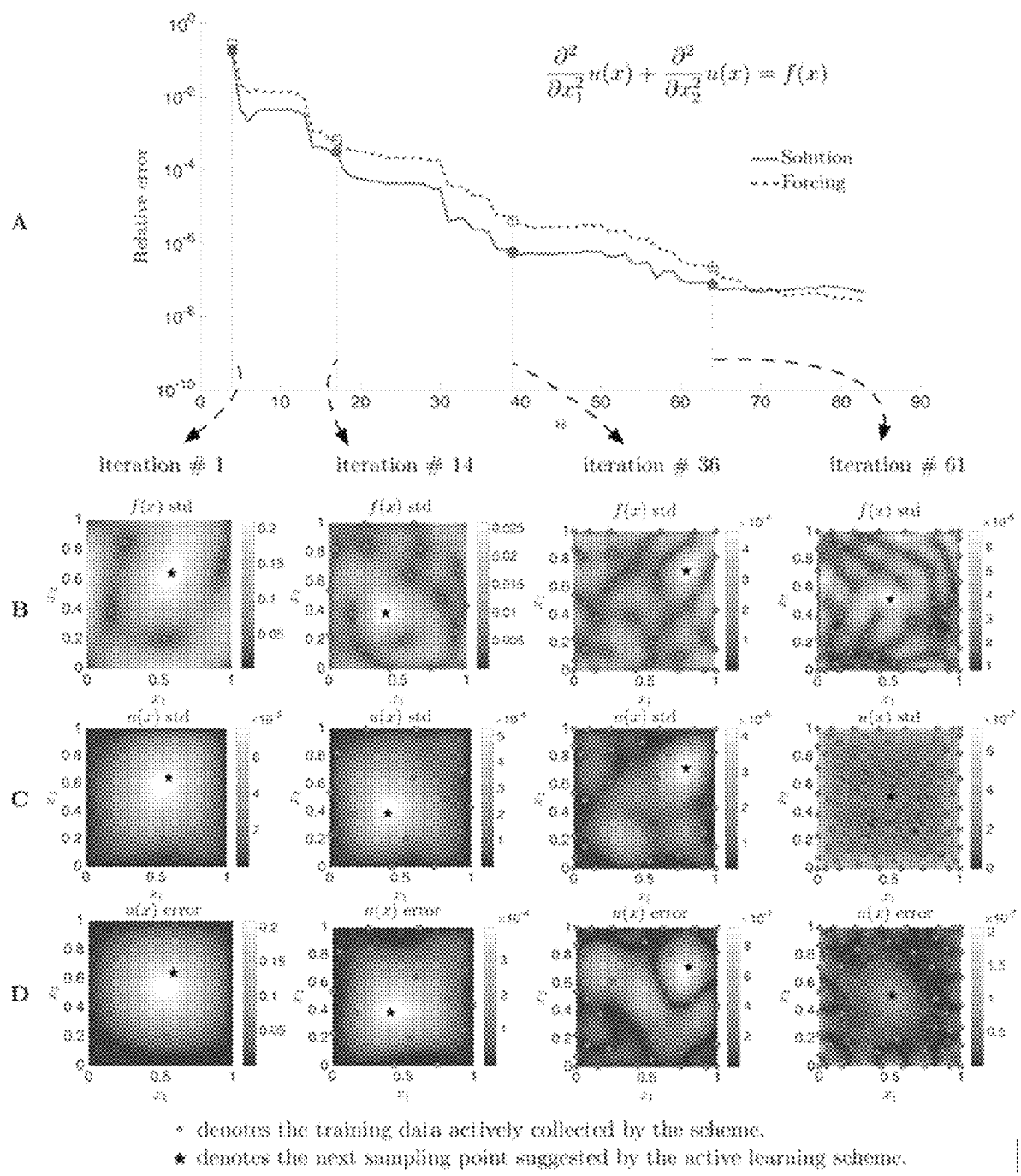
FIG. 12 illustrates an example iterative process with updated sampling points.

Referring to FIG. 12, an example iterative process with updated sampling points is illustrated. In this example, the iterative process is performed to infer the solution to a two-dimensional partial differential equation from single-fidelity noise-free data for the right-hand-side forcing term f, along with 25 anchor points for the solution u at each of the square domain boundaries.

In this example, the following differential equation is considered:

$$\frac{\partial^2}{\partial x_1^2}u(x) + \frac{\partial^2}{\partial x_2^2}u(x) = f(x),$$

and a single-fidelity data-set comprising of noise-free observations for the forcing $f(x)=-2\pi^2 \sin(\pi x_1)\sin(\pi x_2)$, and noise free anchor points generated by the exact solution $u(x)=\sin(\pi x_1)\sin(\pi x_2)$. To demonstrate the concept of active learning, an initial data set consisting of 4 randomly sampled observations of f is used in the unit square, along with 25 anchor points per domain boundary. The later can be considered as information that is a-priori known from the problem setup, as a noise-free Dirichlet boundary condition is considered in this example. Moreover, this high-number of anchor points allows accurately resolving the solution on the domain boundary and focusing on the convergence properties of the scheme in the interior domain. Starting from this initial training set, an active learning iteration loop (as described below) is performed in which a new observation of f is augmented to the training set at each iteration according to the sampling policy described in the active learning iteration loop below. The results of this experiment are illustrated in FIG. 12.

The active learning iteration loop, or adaptive acquisition of data is performed in order to enhance the prediction of the solution u, under the assumption that one additional high-fidelity observation of the right-hand-side forcing f is allowed. The adaptation of the following active learning scheme to cases where one can acquire additional anchor points or low-fidelity data for $f_1$ is straightforward. It begins with obtaining the following predictive distribution for $f(x)$ at a new test point x, $$p(f(x)|y)=N(\bar{f}(x),V_f(x)),$$

where $\bar{f}(x)=bK^{-1}y$, $V_f(x)=k(x,x)-nK^{-1}b^T$, and $$b:=[L_x g(x,x_0;\theta), \rho L_x g_1(x,x_1;\theta_1), k(x,x_2;\theta)].$$

The most intuitive sampling strategy corresponds to adding a new observation $x^*$ for f at the location where the posterior variance is maximized, i.e., $x^*=\mathrm{argmax}_x V_f(x)$. Compared to more sophisticated data acquisition criteria, it is found that this simple computationally inexpensive choice leads to similar performance for all cases examined in this work.

In FIG. 12, the graph (A) shows a log-scale convergence plot of the relative error in the predicted solution u and forcing term f as the number of single-fidelity training data on f is increased via iterative process. Sample points can be selected based on the maximum posterior uncertainty on f. Plots (B) show evolution of the posterior standard deviation of f as the number of active learning iterations is increased. Plots (C) and (D) show evolution of the posterior standard deviation of u and the relative point-wise error against the exact solution. As illustrated, the methodology of the present disclosure can provide a-posteriori error estimate on the predicted solution.

It is noted that new observations at locations for which the posterior variance of f is the highest is sampled for the next iteration. This choice yields a fast convergence rate and returns an accurate prediction for the solution u after just a handful of iterations, as shown in a graph (A) of FIG. 12. As illustrated, the error in the solution appears to be bounded by the approximation error in the forcing term, except for the late iteration stages where the error is dominated by how well we approximate the solution on the boundary. This indicates that in order to further reduce the relative error in u, more anchor points on the boundary are needed. Overall, the non-monotonic error decrease as observed in the graph (A) of FIG. 12 is a common feature of active learning approaches as the algorithm needs to explore and gather the sufficient information required in order to further reduce the error. It is also noted that how uncertainty in computation is quantified by the computed posterior variance that can be interpreted as a type of a-posteriori error estimate, as shown in plots (C) and (D) of FIG. 12.

As described herein, the methodology of the present disclosure is not problem specific to the extent that an object to be evaluated is modeled with a linear equation. In fact, the system of the present disclosure provides an entirely agnostic treatment of linear operators. For example, solutions to integro-differential, time-dependent, high-dimensional, or even fractional equations can be reliably obtained with the methodology of the present disclosure. This generality is illustrated through a mosaic of benchmark problems compiled in FIG. 13.

Figure 13:
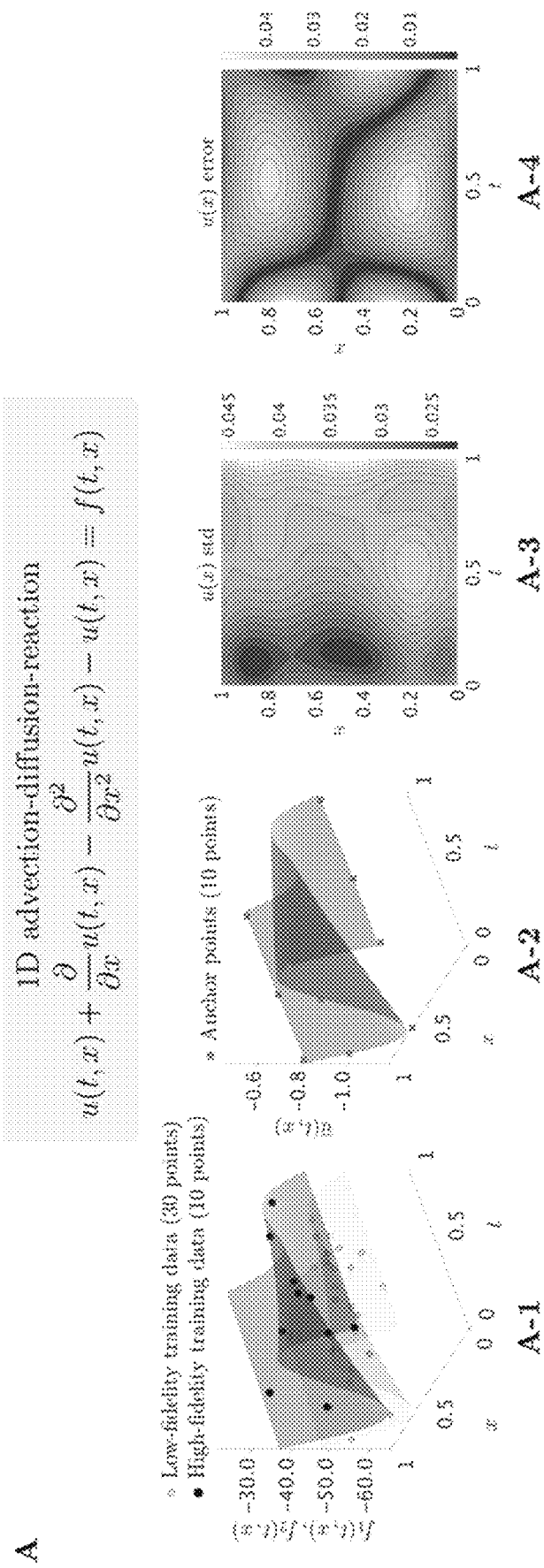
FIG. 13 illustrates generality and scalability of the multi-fidelity system of the present disclosure.
Figure 14:
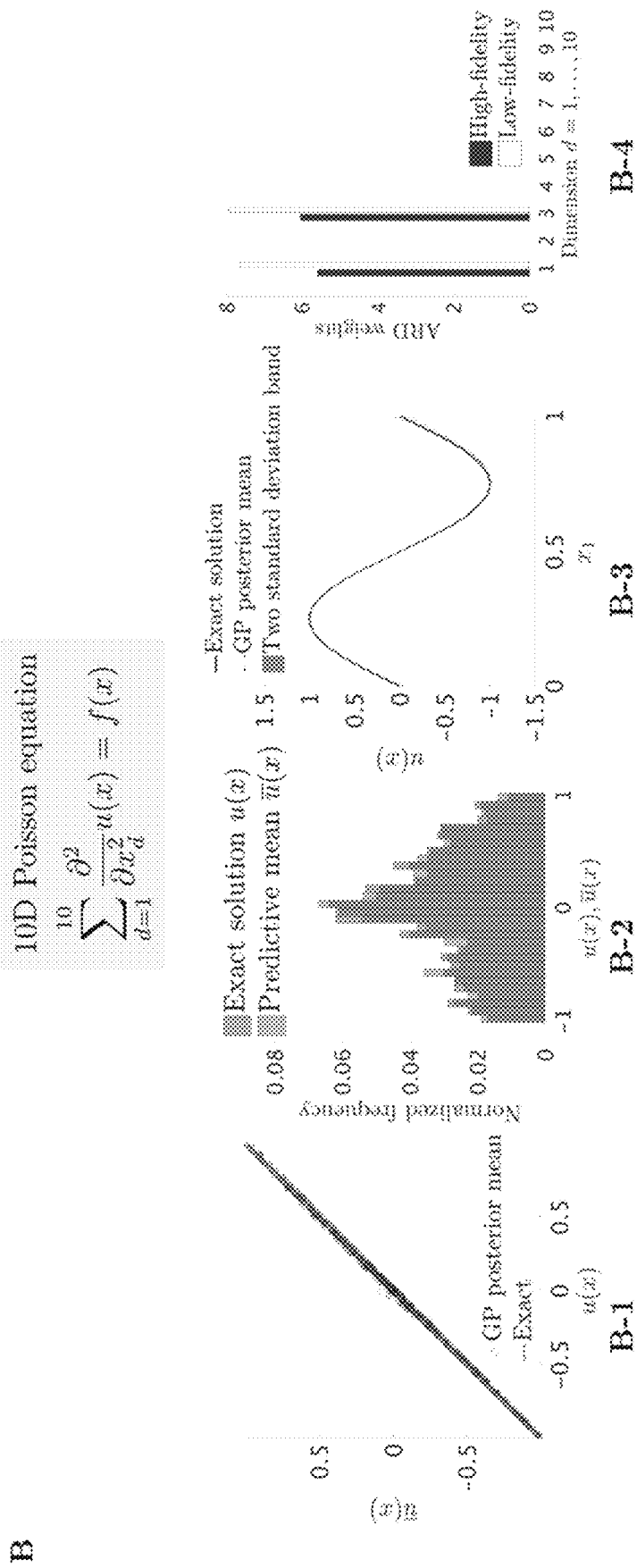
FIG. 14 illustrates generality and scalability of the multi-fidelity system of the present disclosure.
Figure 15:
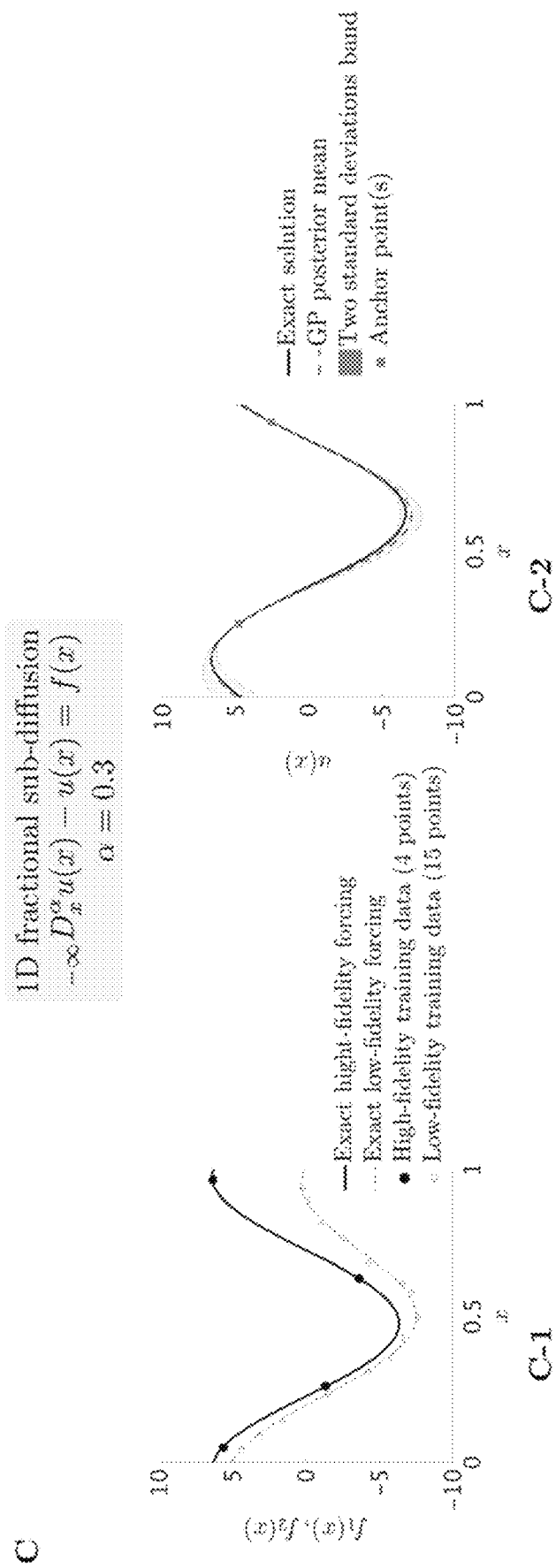
FIG. 15 illustrates generality and scalability of the multi-fidelity system of the present disclosure.

FIGS. 13-15 illustrate generality and scalability of the multi-fidelity system of the present disclosure. The system provides an agnostic treatment of temporal integration, high-dimensionality, and non-local interactions, without requiring any modification of the workflow illustrated herewith. In particular, FIG. 13 illustrates comparison between the inferred and exact solutions $\bar{u}$ and u for time-dependent advection diffusion-reaction, FIG. 14 illustrates comparison between the inferred and exact solutions $\bar{u}$ and u for Poisson equation in ten dimensions, and FIG. 15 illustrates comparison between the inferred and exact solutions $\bar{u}$ and u for fractional sub-diffusion.

For discussion, a time-dependent linear advection-diffusion-reaction equation is considered such as an equation using the following operator $L_{(t,x)}u(t,x)$, which is also illustrated in FIG. 13.

$$L_{(t,x)}u(t,x) = \frac{\partial}{\partial t}u(t,x) + \frac{\partial}{\partial x}u(t,x) - \frac{\partial^2}{\partial x^2}u(t,x) - u(t,x).$$

In this example, a total of $n_1=30$ low-fidelity and $n_2=10$ high-fidelity training points $(t_1, x_1)$ and $(t_2, x_2)$ are generated, respectively, in the domain $[0,1]^2=\{(t,x): t \in [0,1]$ and $x \in [0,1]\}$. These points are chosen at random according to a uniform distribution. The low- and high-fidelity training data $\{(t_1,x_1), y_1\}$, $\{(t_2, x_2), y_2\}$ are given by $y_l=f_l(t_l, x_l)+\varepsilon_l$, $l=1,2$, where $f_2(t, x)=e^{-t} (2\pi \cos(2\pi x)+2(2\pi^2-1) \sin(2\pi x))$, and $f_1 (t, x)=0.8f_2(t, x) -5tx-20$. Moreover, $\varepsilon_1 \wedge N (0, 0.3I)$ and $\varepsilon_2$ N (0, 0.05I). Further, $n_0=10$ random anchor points $(t_0, x_0)$ are chosen according to a uniform distribution on the initial/boundary set $\{0\}\times[0,1]\cup[0,1]\times\{0, 1\}$. Moreover, $y_0=u(t_0, x_0)+\varepsilon_0$ with $\varepsilon_0 \sim N(0, 0.01I)$. It is noted that $u(t, x)=e^{-1} \sin(\pi x)$ is the exact solution.

This example highlights the capability of the system of the present disclosure to handle time-dependent problems using only noisy scattered space-time observations of the right-hand-side forcing term. As described herein, this system circumvents the need for temporal discretization, and is essentially immune to any restrictions arising due to time-stepping, e.g., the fundamental consistency and stability issues in classical numerical analysis. As shown in FIG. 13, a reasonable reconstruction of the solution field u can be achieved using only 10 noisy high-fidelity observations of the forcing term f (see Plots A-1 and A-2 in FIG. 13). The maximum error in the prediction is quantified by the posterior variance (see Plot A-3 of FIG. 13), which, in turn, is in good agreement with the maximum absolute point-wise error between the predicted and exact solution for u (see Plot A-4 of FIG. 13). It is noted that in realistic scenarios no knowledge of the exact solution is available, and therefore one cannot assess model accuracy or inadequacy. The approach of the present disclosure only needs a very limited number of noisy high-fidelity observations of f to compute a reasonably accurate solution u, avoiding any numerical discretization of the spatio-temporal advection-diffusion-reaction operator.

As illustrated in FIG. 14, to demonstrate scalability to high dimensions, a 10-dimensional (10D) example is considered involving an elliptic partial differential equation shown below and in FIG. 14. For this equation, only two dimensions are active in the variability of its solution, namely dimensions 1 and 3.

$$L_x u(x) = \sum_{d=1}^{D} \frac{\partial^2}{\partial x_d^2}u(x).$$

Results for the case corresponding to D=10 are presented, assuming that the low- and high-fidelity data $\{\{x_1, y_1\}, \{x_2, y_2\}\}$ are generated according to $y_l=f_l(x_l)+\varepsilon_l$, $l=1,2$, where $\varepsilon_1 \sim N(0, 0.3I)$ and $\varepsilon_2 \sim N(0, 0.05I)$. A training set is constructed comprising of $n_1=60$ low-fidelity and $n_2=20$ high-fidelity observations, sampled at random in the unit hypercube $[0,1]^{10}$. Moreover, $n_0=40$ data points are employed on the solution u(x). These anchor points are not necessarily boundary points and are in fact randomly chosen in the domain $[0,1]^{10}$ according to a uniform distribution. The high- and low-fidelity forcing terms are given by $$f_2(x) = -8\pi^2 \sin(2\pi x_1)\sin(2\pi x_3), \text{ and}$$

$$f_1(x) = 0.8f_2(x) - 40\prod_{d=1}^{10} x_d + 30,$$

respectively.

The data $y_0$ on the exact solution $u(x)=\sin(2\pi x_1)\sin(2\pi x_3)$ are generated by $y_0=u(x_0)+\varepsilon_0$ with $\varepsilon_0 \sim N(0, 0.01I)$. It is noted that the effective dimensionality of this problem is 2, and the active dimensions $x_1$ and $x_3$ will be automatically discovered by the method in this example.

This example illustrates that the methodology of the present disclosure provides automatic discovery of this effective dimensionality from data. This screening procedure is implicitly carried out during model training (such as shown with the equation above) by using GP covariance kernels that can detect directional anisotropy in multi-fidelity data, helping the algorithm to automatically detect and exploit any low-dimensional structure. For example, a training data-set of only 20 high-fidelity and 60 low-fidelity noisy observations off are employed, which are randomly sampled in the unit hypercube. Although the high-fidelity forcing only contains terms involving dimensions 1 and 3, the low-fidelity model for f is active along all dimensions (see equation and its description above). In addition, this example also employs a total of 40 noisy anchor points for u, randomly selected in the interior domain (i.e., there is no data on u on the domain boundaries). This minimal selection of sampling points is sufficient for constructing a global approximation of u with relative $L_2$ error less than 2%.

Plots B-1, B-2, and B-3 in FIG. 14 provide a visual assessment of the high accuracy attained by the predictive mean in approximating the exact solution u evaluated at randomly chosen validation points in the 10-dimensional space. In particular, Plot B-1 is a scatter plot of the predictive mean, Plot B-2 depicts the histogram of the predicted solution values versus the exact solution, and Plot B-3 is a one dimensional slice of the solution field. If all the dimensions are active, achieving this accuracy level would clearly require a larger number of multi-fidelity training data. In contrast, the method of the present disclosure can discover the effective dimensionality of the system from data (see Plot B-4), which is a non-trivial problem.

FIG. 15 illustrates another example application of the method of the present disclosure for a linear equation with fractional-order derivatives. For example, the following one dimensional fractional operator is considered.

$$L_x u(x) = {}_{-\infty}D_x^\alpha u(x) - u(x),$$

where $\alpha \in R$ is the fractional order of the operator that is defined in the Riemann-Liouville sense. In the framework of the present disclosure, the only technicality induced by fractional operators relates to deriving the kernel $k(x,x';\theta)$. Here, $k(x,x';\theta)$ was obtained by taking the inverse Fourier transform of $$[(-iw)^\alpha(-iw')^\alpha - (-iw)^\alpha + 1]\hat{g}(w,w';\theta),$$

where $\hat{g}(w,w';\theta)$ is the Fourier transform of the kernel $g(x,x;\theta)$. It is assumed that the low- and high-fidelity data $\{x_1, y_1\}$, $\{x_2, y_2\}$ are generated according to $y_\ell = f_\ell(x_\ell) + \varepsilon_\ell$, $\ell = 1,2$, where $\varepsilon_1 \sim N(0, 0.3I)$ and $\varepsilon_2 \sim N(0, 0.05I)$, $f_2(x) = 2\pi \cos(2\pi x) - \sin(2\pi x)$, and $f_1(x) = 0.8 f_1(x) - 5x$. The training data $x_1$, $x_2$ with sample sizes $n_1 = 15$, $n_2 = 4$, respectively, are randomly chosen in the interval [0,1] according to a uniform distribution. We also assume that we have access to data $\{x_0, y_0\}$ on $u(x)$. In this example, we choose $n_0 = 2$ random points in the interval [0,1] to constitute $x_0$ and let $y_0 = u(x_0)$. It is noted that $$u(x) = \frac{1}{2} e^{-2i\pi x} \left( \frac{-i + 2\pi}{-1 + (-2i\pi)^\alpha} + \frac{e^{4i\pi x}(i + 2\pi)}{-1 + (2i\pi)^\alpha} \right),$$

is the exact solution, and is obtained using Fourier analysis. The numerical demonstration herein corresponds to $\alpha = 0.3$, and our results are summarized in FIG. 15.

Fractional operators often arise in modeling anomalous diffusion processes, and their non-local behavior poses serious computational challenges as it involves costly convolution operations for resolving the underlying non-Markovian dynamics. Bypassing the need for numerical discretization, the regression approach of the present disclosure overcomes these computational bottlenecks, and can seamlessly handle all such linear cases without any modifications.

As shown above, a probabilistic regression framework is described for learning solutions to general linear integro-differential equations from noisy data. The machine learning approach of the present disclosure can seamlessly handle spatio-temporal as well as high-dimensional problems. The algorithms herein can learn from scattered noisy data of variable fidelity, and return solution fields with quantified uncertainty. It is noted that he methodology generalizes well beyond the example cases presented here. For example, it is straightforward to address problems with more than two levels of fidelity, variable coefficients, complex geometries, non-Gaussian and input-dependent noise models (e.g., student-t, heteroscedastic, etc.), as well as more general linear boundary conditions, e.g., Neumann, Robin, etc. The current methodology can be readily extended to address applications involving characterization of materials, tomography and electrophysiology, design of effective metamaterials, etc. An equally important direction involves solving systems of linear partial differential equations, which can be addressed using multi-output GP regression. All these scenarios are feasible as they do not affect the key observation that this work is built upon, namely that any linear transformation (such as derivatives and integrals) of a Gaussian process is still a Gaussian process. Despite its generality, the proposed framework does not constitute a universal remedy. For example, the most pressing open question is posed by non-linear operators for which assigning GP priors on the solution may not be a reasonable choice. Some specific non-linear equations can be transformed into systems of linear equations (albeit in high-dimensions) that can be solved with extensions of the current framework.

Referring now to FIG. 16-23, another example method 500 for analyzing an object using a differential equation. Similarly to the method 300, the method 500 also can utilize the system 100 as illustrated in FIG. 1. For example, as least some operations in the method 500 can be performed in the object analysis device 102, as well as the data collection device 108 and/or the sensing device 110. Therefore, the description of the system 100 and the devices, elements, and data associated with the system 100 herein is similarly applicable to the method 500.

The method of the present disclosure involves machine learning techniques that explicitly leverage such structured prior information as to reflect underlying laws of physics that may have shaped the distribution of observed data. Modeling a physical object or phenomenon can take the form of systems of partial differential equations. In some embodiments, the solution of such systems is accessible by means of numerical algorithms that provide sensible approximations to given quantities of interest. The method of the present disclosure can use long-standing developments of classical methods in numerical analysis and introduce partial differential equations from a statistical inference standpoint. The method enables the construction of data-efficient learning machines that can encode underlying laws of physics as structured prior information. The method also provides numerical algorithms that can seamlessly blend equations and noisy data, obtain latent quantities of interest (e.g., the solution to a partial differential equation), and quantify uncertainty in computations.

Figure 16:
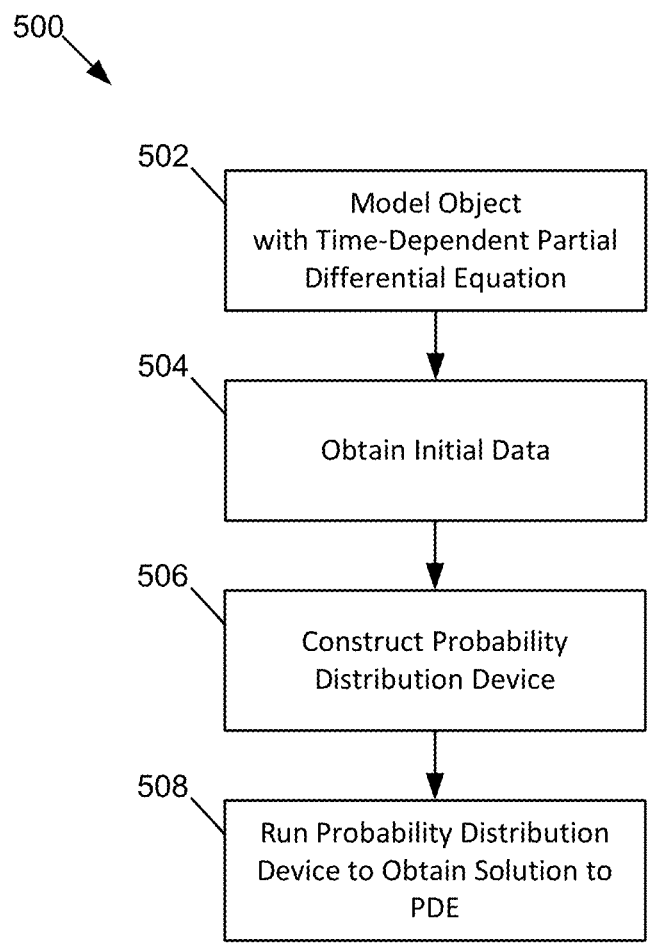
FIG. 16 illustrates an example method for analyzing an object using a differential equation.

FIG. 16 illustrates an example method 500 for analyzing an object using a differential equation. In the examples hereinafter, the differential equation can be a time-dependent partial differential equation.

The method 500 can begin at operation 502, in which the object analysis device 102 models an object 106 with a time-dependent partial differential equation (PDE). Time-dependent PDEs can be used to describe or model a variety of objects having time-dependent characteristics. A few examples of such time-dependent objects or models are illustrated herein.

In some embodiments, the time-dependent PDE used in the method 500 can be a time-dependent linear PDE. In other embodiments, the time-dependent PDE in the method 500 can be a time-dependent non-linear PDE. When a time-dependent non-linear PDE is modeled having one or more non-linear terms, the time-dependent non-linear PDE may be linearized by approximating the non-linear terms. Various methods can be used for linearization. In some examples, non-linear terms can be linearized around a previous time step state. Various examples of linearization are described herein below.

At operation 504, the object analysis device 102 can obtain initial data. In some embodiments, the initial data is data which are obtained at an initial time (e.g., t=0) when the object is first observed. The initial data can be obtained in various ways. One example of obtaining the initial data is described in FIG. 17.

At operation 506, the object analysis device 102 operates to construct a probability distribution device for analyzing the object. As described herein, the probability distribution device is built based on a multi-step scheme and a non-parametric regression prior. In one example, the probability distribution device employs a Gaussian process. An example of constructing a probability distribution device is further described in FIG. 18.

At operation 508, the object analysis device 102 runs the probability distribution device to predict the solution of the time-dependent PDE modeled at the operation 502. As described herein, the probability distribution device can also provide an uncertainty associated with the predicted solution. An example of running the probability distribution device is further described in FIG. 19.

Figure 17:
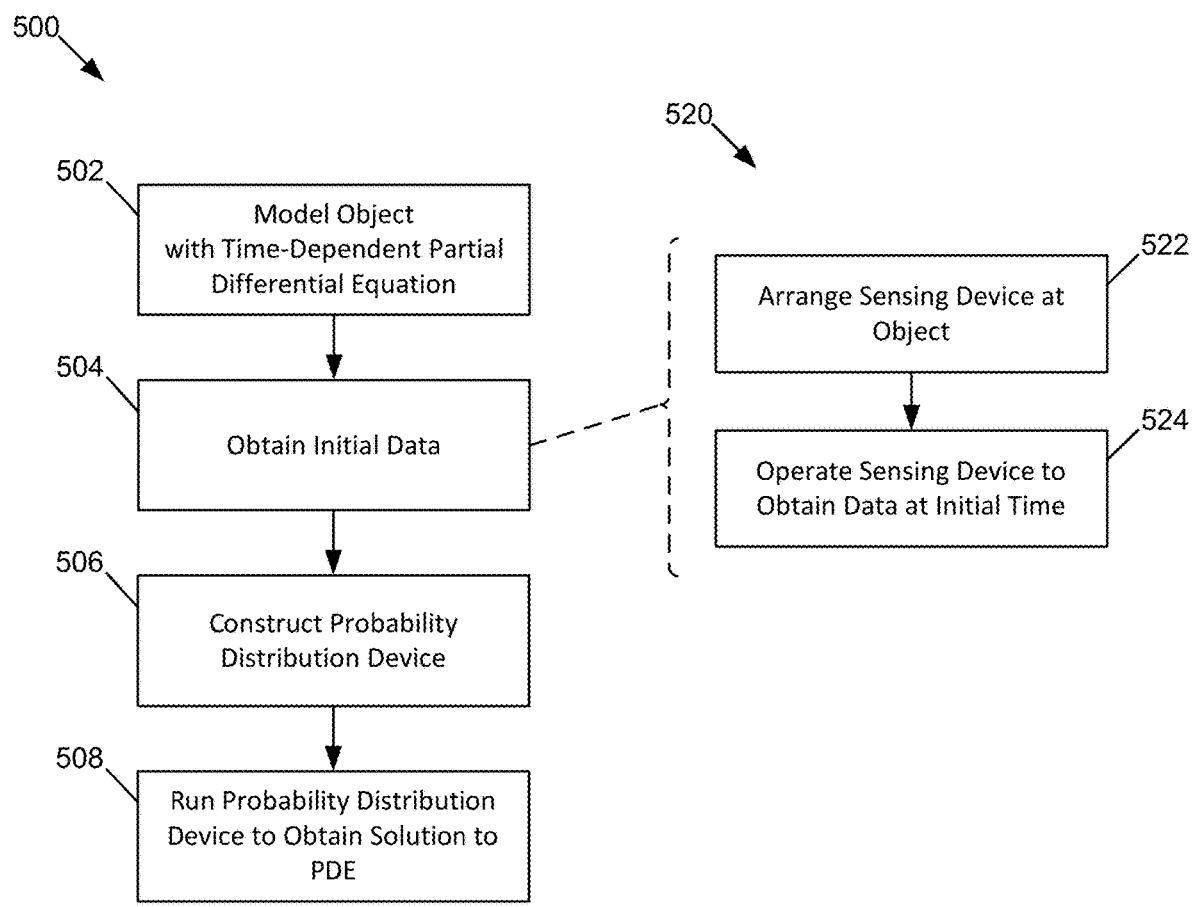
FIG. 17 illustrates an example method for obtaining initial data.

FIG. 17 illustrates an example method 520 for obtaining initial data, which can be used at the operation 504 of the method 500. In this example, the method 520 begins at operation 522 in which the sensing device 110 is arranged at one or more locations of the object. At operation 524, the sensing device 110 can be operated to measure data at the initial time. Such measured data can be the initial data. As described herein, the sensing device 110 includes one or more sensors of the same or different types for various applications, and can be controlled by the data collection device 108.

In other examples, the initial data can be obtained in other ways. In some embodiments, the initial data can be randomly selected. In other embodiments, the initial data can be empirically obtained. In yet other embodiments, the initial data can be inferred from a history of measurements.

Figure 18:
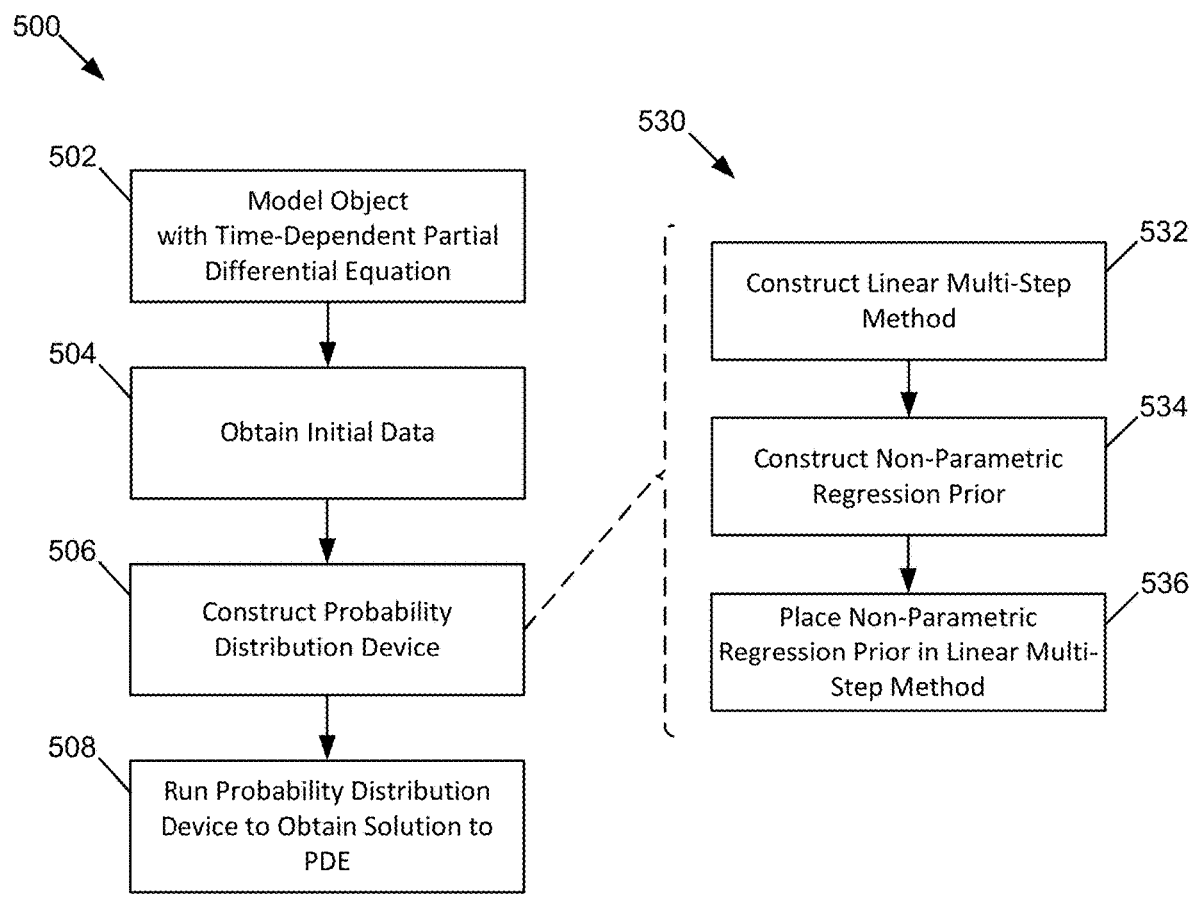
FIG. 18 illustrates an example method for constructing a probability distribution device.

FIG. 18 illustrates an example method 530 for constructing a probability distribution device, which can be used at the operation 506 of the method 500. In this example, the method 530 begins at operation 532 in which a linear multi-step device or method is constructed which can be used to predict the solution to the time-dependent PDE. Various forms of linear multi-step device can be used for constructing a probability distribution device. As described here, for example, Runge-Kutta methods can be used to build the linear multi-step device. In other examples, the linear multi-step device uses Euler methods, such as a forward Euler scheme, a backward Euler scheme, and a trapezoidal rule, as further described herein.

At operation 534, a non-parametric regression prior is constructed. Various forms of non-parametric regression prior can be used. In examples where a Gaussian process is used, a Gaussian process prior is used as the non-parametric regression prior. This example will be further described herein.

At operation 536, the non-parametric regression prior is placed in the linear multi-step device. As described herein, the non-parameter regression prior needs to be placed on one or more particular terms in the linear multi-step device. In some embodiments, the particular terms are determined such that no inversion of differential operators is necessary and thus any spatial discretization of such operators is avoided as the probability distribution device (e.g., a Gaussian process) is run.

Figure 19:
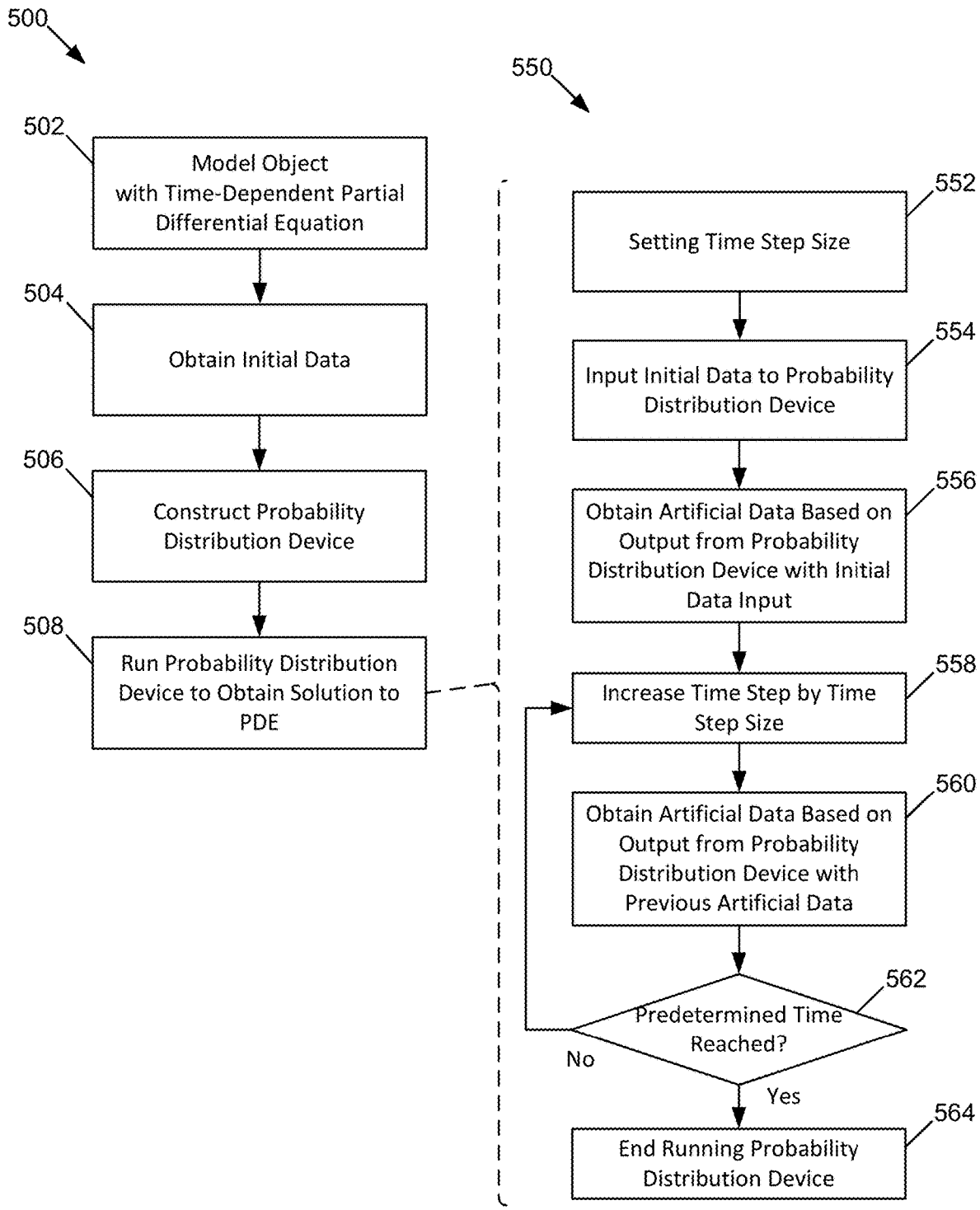
FIG. 19 illustrates an example method for running the probability distribution device.

FIG. 19 illustrates an example method 550 for running the probability distribution device, which can be used at the operation 508 in the method 500. The method 550 can begin at operation 552, in which a time step size ($\Delta t$) is set. In some embodiments, a user can input the time step size to the object analysis device 102. In other embodiments, the object analysis device 102 can automatically optimize a time step size for a particular application.

At operation 554, the initial data is inputted to the probability distribution device so that the probability distribution device calculates a first output based on the initial data. As described herein, the initial data represents data obtained at the initial time step (e.g., t=0). The first output includes an outcome including a predicted solution based on the initial data (i.e., at the initial time) and an uncertainty associated with the predicted solution.

At operation 556, the object analysis device 102 obtains artificial data based on the first output calculated by the probability distribution device with the initial data. Artificial data is data at a next time step (i.e., a time step following to a previous time step). In this operation, the artificial data is data at a time step (e.g., at t=$\Delta t$) next to the initial time step and obtained from the first output from the probability distribution device to which the initial data is inputted. As such, artificial data is not data that are obtained directly from measurement, but calculated by the probability distribution device.

At operation 558, the object analysis device 102 increases a time step by the time step size for the next calculation ($t_n = t_{n-1} + \Delta t$).

At operation 560, the object analysis device 102 obtains artificial data based on an output calculated by the probability distribution device with the previous artificial data. As described above, artificial data is data at a next time step (i.e., a time step following to a previous time step), and obtained from the output from the probability distribution device to which the previous artificial data is inputted.

At operation 562, the object analysis device 102 operates to determine whether a predetermined time is reached for running the probability distribution device. If it is determined that the predetermined time has been reached ("Yes" in this operation), the object analysis device 102 ends running the probability distribution device. Otherwise ("No" in this operation), the object analysis device 102 returns to the operation 558 and repeat the operations 558 and 560 until the predetermined time is reached.

To better illustrate the method 500 including the methods 520, 530, and 550, a linear PDE is considered in the form of $$(u_t = \mathcal{L}_x u, x \in \Omega, t \in [0,T])$$

where $\mathcal{L}_x$ is a linear operator, u(t, x) denotes the latent solution, and $\Omega$ is a subset of $\mathbb{R}^D$.

For example, $$\mathcal{L}_x = \frac{\partial^2}{\partial x^2}$$

can be used for a one dimensional heat equation. All data that are obtained are noisy data ($x^0$, $u^0$) on the black-box initial function u(0, x) as well as some information on the domain boundary $\partial \Omega$, which is specified later. The method 500 can predict the latent solution u(t, x) at t>0, and propagate the uncertainty due to noise in the initial data.

By way of example, where the Euler time stepping scheme is used for constructing the linear-multi step device (operation 532), such as:

$$u^n = u^{n-1} + \Delta t \mathcal{L}_x u^{n-1} \quad (2)$$

where $u^n(x) = u(t^n, x)$.

In this example, a Gaussian process prior can be placed on $u^{n-1}$ (operation 536) such that:

$$u^{n-1}(x) \sim \mathcal{GP}(0, k_{u,u}^{n-1,n-1}(x,x',\theta)) \quad (3)$$

where $\theta$ denotes the hyper-parameters of the covariance function $k_{u,u}^{n-1,n-1}$.

In this example, Gaussian process regression is selected as the probability distribution device. Gaussian process is a non-parametric Bayesian machine learning technique that provides a flexible prior distribution over functions, enjoys analytical tractability, and has a fully probabilistic workflow that returns robust posterior variance estimates, which quantify uncertainty in a natural way. Moreover, Gaussian processes are among a class of methods known as kernel machines and are analogous to regularization approaches. They can also be viewed as a prior on one-layer feed-forward Bayesian neural networks with an infinite number of hidden units. The Gaussian process prior assumption (Equation (3)) along with the Euler scheme (Equation (2)) will allow capturing the entire structure of the differential operator $\mathcal{L}_x$ as well as the Euler time-stepping rule in the resulting multi-output Gaussian process $$\begin{bmatrix} u^n \\ u^{n-1} \end{bmatrix} \sim \mathcal{GP}\left(0, \begin{bmatrix} k_{u,u}^{n,n} & k_{u,u}^{n,n-1} \\ & k_{u,u}^{n-1,n-1} \end{bmatrix}\right) \quad (4)$$

The specific forms of the kernels $k_{u,u}^{n,n}$ and $k_{u,u}^{n,n-1}$ are direct functions of the Euler scheme (Equation (2)) as well as the prior assumption (Equation (3)), as further discussed later. The multi-output process (Equation (4)) is an example of a numerical Gaussian process, because the covariance functions $k_{u,u}^{n,n}$ and $k_{u,u}^{n,n-1}$ result from a numerical scheme, in this case, the Euler method. This can introduce a structured prior that explicitly encodes the physical law modeled by the partial differential equation (Equation (1)).

In some embodiments, the framework described above can be generalized to arbitrary linear multi-step methods as well as Runge-Kutta methods, as described below. It is understood from the following examples that the Gaussian process prior (e.g., Equation (3)) needs to be placed to avoid inversion of differential operators and to bypass the classical need for spatial discretization of such operators. For instance, in the above example (Equations (2) and (3)), it would have been an inappropriate choice to start by placing a Gaussian process prior on $u^n$, rather than $u^{n-1}$, as obtaining the numerical Gaussian process (Equation (4)) would then involve inverting operators of the form $I+\Delta t \mathcal{L}_x$ corresponding to the Euler method. Moreover, it is shown that the uncertainty associated with the noisy initial observations $(x^0, u^0)$ can be propagated through time.

Linear Multi-Step Methods

One example linear multi-step method, which is applied to a time-dependent PDE (Equation (1)) is:

$$u^n = \sum_{i=1}^{m} \alpha_i u^{n-i} + \Delta t \sum_{i=0}^{m} \beta_i \mathcal{L}_x u^{n-i}. \quad (5)$$

Different choices for parameters $\alpha_i$ and $\beta_i$ result in specific schemes. Example members of the family of linear multi-step methods are shown in Table 1 below.

TABLE 1

| Forward Euler | $u^n = u^{n-1} + \Delta t \mathcal{L}_x u^{n-1}$ |
| Backward Euler | $u^n = u^{n-1} + \Delta t \mathcal{L}_x u^n$ |
| Trapezoidal Rule | $u^n = u^{n-1} + \frac{1}{2}\Delta t \mathcal{L}_x u^{n-1} + \frac{1}{2}\Delta t \mathcal{L}_x u^n$ |

The linear multi-step method in Equation (5) can be equivalently written as:

$$\mathcal{P}_x u^n = \sum_{i=1}^{m} Q_x^i u^{n-i} \quad (6)$$

where $\mathcal{P}_x u := u - \Delta t \beta_B \mathcal{L}_x u$ and $Q_x^i n := \alpha_i u + \Delta t \beta_i \mathcal{L}_x u$.

Some special cases of Equation (6) are given in Table 2 below.

TABLE 2

| Forward Euler | $u^n = Q_x u^{n-1}$ |
| | $Q_x u^{n-1} = u^{n-1} + \Delta t \mathcal{L}_x u^{n-1}$ |
| Backward Euler | $\mathcal{P}_x u^n = u^{n-1}$ |
| | $\mathcal{P}_x u^n = u^n - \Delta t \mathcal{L}_x u^n$ |
| Trapezoidal Rule | $\mathcal{P}_x u^n = Q_x u^{n-1}$ |
| | $\mathcal{P}_x u^n = u^n - \frac{1}{2}\Delta t \mathcal{L}_x u^n$ |
| | $Q_x u^{n-1} = u^{n-1} + \frac{1}{2}\Delta t \mathcal{L}_x u^{n-1}$ |

For every $j=0, 1, \ldots, m$, and some $\tau \in [0,1]$ which depends on the specific choices for the values of the parameters $\alpha_i$ and $\beta_i$, the term $u^{n-j+96}$ is defined to be given by:

$$\mathcal{P}_x u^{n-j+1} =: u^{n-j+\tau} := \sum_{i=1}^{m} Q_x^i u^{n-i-j+1} \quad (7)$$

Equation (7) can take one of the forms in Table 3 below for some example schemes.

TABLE 3

| Forward Euler | $u^n = Q_x u^{n-1}$ |
| | $\tau = 0$ |
| Backward Euler | $\mathcal{P}_x u^n = u^{n-1}$ |
| | $\tau = 1$ |
| Trapezoidal Rule | $\mathcal{P}_x u^n = u^{n-1/2} = Q_x u^{n-1}$ |
| | $\tau = 1/2$ |

Shifting every term involved in the Table 3 by $-\tau$ yields:

$$\mathcal{P}_x u^{n-j+1-\tau} = u^{n-j} = \sum_{i=1}^{m} Q_x^i u^{n-i-j+1-\tau} \quad (8)$$

By way of example, where the trapezoidal rule provides:

$\mathcal{P}_x u^{n+1/2} = u^n = Q_k u^{n-1/2}$ and $\mathcal{P}_x u^{n-1/2} = u^{n-1} = Q_x u^{n-3/2}$.

Therefore, Equation (8) results in:

$$u^n = \sum_{i=1}^{m} Q_x^i u^{n-i+1-\tau}, \text{ when } j = 0, \quad (9)$$

$u^{n-j} = \mathcal{P}_x u^{n-j+1-\tau}$, when $j = 1, \ldots, m$.

Where the trapezoidal rule applies, this translates to $u^n = Q_x u^{n-1/2}$ and $u^{n-1} = \mathcal{P}_x u^{n-1/2}$.

It is noted that, by assuming $u^{n-1/2}(x) \sim \mathcal{GP}(0, k(x,x'; \theta))$, the entire structure of the trapezoidal rule in can be captured in the resulting joint distribution of $u^n$ and $u^{n-1}$. As such, the proper placement of the Gaussian process prior allows the proposed methodology because it does not require inversion of differential operators and thus avoids any spatial discretization of such operators.

In some embodiments, the prior can be assumed:

$$u^{n-j+1-\tau}(x) \sim \mathcal{GP}(0, k^{j,j}(x, x'; \theta_j)), j=1, \ldots, m, \quad (10)$$

for m independent processes. As a result, the following numerical Gaussian process is obtained:

$$\begin{bmatrix} u^n \\ \vdots \\ u^{n-m} \end{bmatrix} \sim \mathcal{GP}\left(0, \begin{bmatrix} k_{u,u}^{n,n} & \cdots & k_{u,u}^{n,n-m} \\ & \ddots & \vdots \\ & & k_{u,u}^{n-m,n-m} \end{bmatrix}\right) \quad (11)$$

where $$k_{u,u}^{n,n} = \sum_{i=1}^{m} Q_x^i Q_{x'}^i k^{i,i}, \quad k_{u,u}^{n,n-j} = Q_x^i \mathcal{P}_{x'} k^{j,j},$$

$$k_{u,u}^{n-i,n-j} = 0, \, i \neq j, \, k_{u,u}^{n-j,n-j} = \mathcal{P}_x \mathcal{P}_{x'} k^{j,j},$$

$$j = 1, \ldots, m.$$

As such, the entire structure of linear multi-step methods (Equation (5)) is captured by the kernels given in Equation (11). Despite an independent assumption in Equation (10), the resulting numerical Gaussian process shows a fully correlated structure as illustrated in Equation (11). Moreover, the information on the boundary $\partial\Omega$ of the domain $\Omega$ can often be summarized by noisy observations $\{x_b^n, u_b^n\}$ of a linear transformation $\mathcal{B}_x$ of $u^n$; i.e., noisy data on $u_b^n := \mathcal{B}_x u^n$.

Using this, the following covariance functions involving the boundary are obtained:

$$k_{b,u}^{n,n} = \mathcal{B}_x k_{u,u}^{n,n}, k_{b,b}^{n,n} = \mathcal{B}_x \mathcal{B}_{x'} k_{u,u}^{n,n}, k_{b,u}^{n,n-j} = \mathcal{B}_x k_{u,u}^{n,n-j}, j=1, \ldots, m.$$

The numerical examples described herein show different special treatments of boundary conditions, including Dirichlet, Neumann, mixed, and periodic boundary conditions.

The workflow can be summarized as follow:

Step 1: Starting from the initial data $(x^0, u^0)$ and the boundary data $\{x_b^1, u_b^1\}$, the kernel hyper-parameters are trained as described below. This step carries the main computational burden as it scales cubically with the total number of training points since it involves Cholesky factorization of full symmetric positive-definite covariance matrices.

Step 2: Having identified the optimal set of kernel hyper-parameters, the conditional posterior distribution is utilized to predict the solution at the next time-step and generate the artificial data $\{x^1, u^1\}$. It is noted that $x^1$ is randomly sampled in the spatial domain according to a uniform distribution, and $u^1$ is a normally distributed random vector, as described below.

Step 3: Given the artificial data $\{x^1, u^1\}$ and boundary data $\{x_b^2, u_b^2\}$, the kernel hyper-parameters is trained for the second step (e.g., the mean of the random vector $u^1$ for training purposes).

Step 4: Having identified the optimal set of kernel hyper-parameters, we utilize the conditional posterior distribution to predict the solution at the next time-step and generate the artificial data $\{x^2, u^2\}$, where $x^2$ is randomly sampled in the spatial domain according to a uniform distribution. However, since $u^1$ is a random vector, it needs to be marginalized to obtain consistent uncertainty estimates for $u^2$. This procedure is outlined below.

Step 5: Steps 3 and 4 are repeated until the final integration time is reached.

In short, the proposed methodology boils down to a sequence of Gaussian process regressions at every time-step. To accelerate training, one can use the optimal set of hyper-parameters from the previous time-step as an initial guess for the current one.

Regarding the training step as discussed in Steps 1 and 3 above, for notational convenience and without loss of generality, m=1 (see Equation (5)) is assumed. The hyper-parameters $\theta_i, i=1, \ldots, m$, can be trained by employing the Negative Log Marginal Likelihood resulting from $$\begin{bmatrix} u_b^n \\ u^{n-1} \end{bmatrix} \sim \mathcal{N}(0, K) \quad (12)$$

where $\{x_b^n, u_b^n\}$ are the data (which is noisy) on the boundary, $\{x^{n-1}, u^{n-1}\}$ are artificially generated data to be explained below (see Equation (14)), and $$K := \begin{bmatrix} k_{b,b}^{n,n}(x_b^n, x_b^n) + \sigma_n^2 I & k_{b,u}^{n,n-1}(x_b^n, x^{n-1}) \\ & k_{u,u}^{n-1,n-1}(x^{n-1}, x^{n-1}) + \sigma_{n-1}^2 I \end{bmatrix}$$

It is noted that the marginal likelihood provides a natural regularization mechanism that balances the trade-off between data fit and model complexity. This effect is known as Occam's razor after William of Occam 1285-1349 who encouraged simplicity in explanations by the principle: "plurality should not be assumed without necessity".

Regarding posterior, in order to predict $u^n(x^{*n})$ at a new text point $x^{*n}$, we use the following conditional distribution:

$$u^n(x_*^n) \left| \begin{bmatrix} u_b^n \\ u^{n-1} \end{bmatrix} \right. \sim \mathcal{N}\left(q^T K^{-1} \begin{bmatrix} u_b^n \\ u^{n-1} \end{bmatrix}, k_{u,u}^{n,n}(x_*^n, x_*^n) - q^T K^{-1} q\right),$$

where $$q^T := [k_{u,b}^{n,n}(x_*^n, x_b^n) \quad k_{u,u}^{n,n-1}(x_*^n, x^{n-1})].$$

In addition, the uncertainty associated with the initial data can be propagated through time. Because $\{x^{n-1}, u^{n-1}\}$ are artificially generated data (see Equation (14)), this needs to be marginalized by employing $u^{n-1} \sim \mathcal{N}(\mu^{n-1}, \Sigma^{n-1, n-1})$ to obtain:

$$u^n(x_*^n) | u_b^n \sim \mathcal{N}\left(\mu^n(x_*^n), \sum^{n,n}(x_*^n, x_*^n)\right) \quad (13)$$

where $$\mu^n(x_*^n) = q^T K^{-1} \begin{bmatrix} u_b^n \\ \mu^{n-1} \end{bmatrix},$$

and $$\sum^{n,n}(x_*^n, x_*^n) = k_{u,u}^{n,n}(x_*^n, x_*^n) - q^T K^{-1} q + q^T K^{-1} \begin{bmatrix} 0 & 0 \\ 0 & \sum^{n-1,n-1} \end{bmatrix} K^{-1} q.$$

Now, the resulting posterior distribution (Equation (13)) can be used to obtain the artificially generated data $\{x^n, u^n\}$ for the next time step with $$u^n \sim \mathcal{N}(\mu^n, \Sigma^{n,n}) \quad (14)$$

where $\mu^n = \mu^n(x^n)$ and $\Sigma^{n,n} = \Sigma^{n,n}(x^n, x^n)$.

Example of Linear Multi-Step Methods Burgers' Equation (Backward Euler)

The following shows that the linear multi-step methods as described above apply to Burgers' equation. Burgers' equation is a fundamental partial differential equation arising in various areas, such as fluid mechanics, nonlinear acoustics, gas dynamics, and traffic flow.

Figure 20:
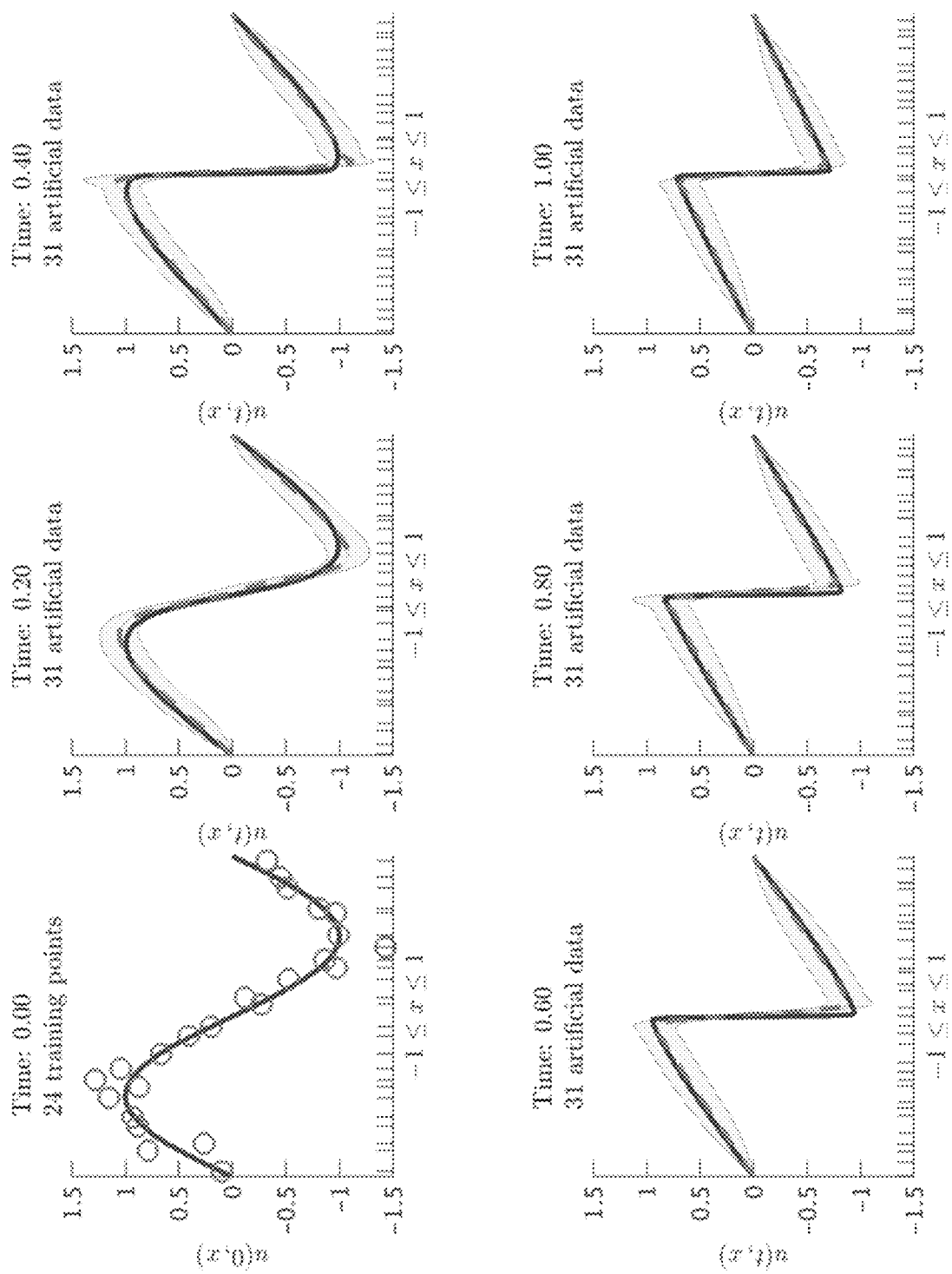
FIG. 20 illustrates noisy initial data and a posterior distribution of a solution to the Burgers' equation at different time snapshots.

In one space dimension, the equation reads as:

$$u_t + u u_x = v u_{xx} \quad (15)$$

along with Dirichlet boundary conditions $u(t, -1) = u(t, 1) = 0$, where $u(t, x)$ denotes the unknown solution and $v$ is a viscosity parameter. Assuming that only noisy measurements $\{x^0, u^0\}$ of the black-box initial function $u(0, x) = -\sin(\pi x)$, the Burgers' equation (Equation (15)) is solved while propagating through time the uncertainty associated with the noisy initial data, as illustrated in FIG. 20. As described below, this example involves solving a non-linear partial differential equation.

To illustrate how one can encode the structure of the physical laws expressed by Burgers' equation in a numerical Gaussian process, the backward Euler scheme is applied to Equation (15) to read:

$$u^n = u^{n-1} - \Delta t u^n \frac{d}{dx} u^n + v \Delta t \frac{d^2}{dx^2} u^n \quad (16)$$

Upon placing a Gaussian process prior on $u^n$, it is noted that the non-linear term $$u^n \frac{d}{dx} u^n$$

can cause problems because the product of two Gaussian processes is no longer Gaussian.

One method of handling such a non-linear term is to approximate the non-linear term with $$\mu^{n-1} \frac{d}{dx} u^n,$$

where $\mu^{n-1}$ is the posterior mean of the previous time step. With the method, the backward Euler scheme (Equation (16)) can be approximated by:

$$u^n = u^{n-1} - \Delta t \mu^{n-1} \frac{d}{dx} u^n + v \Delta t \frac{d^2}{dx^2} u^n \quad (17)$$

Equation (17) can be rearranged to:

$$u^n - \Delta t \mu^{n-1} \frac{d}{dx} u^n + v \Delta t \frac{d^2}{dx^2} u^n = u^{n-1} \quad (18)$$

The prior can be assumed as:

$$u^n(x) \sim \mathcal{GP}(0, k(x, x'; \theta)). \quad (19)$$

In some embodiments, the covariance function can be a neural network covariance function:

$$k(x, x'; \theta) = \frac{2}{\pi} \sin^{-1}\left( \frac{2(\sigma_0^2 + \sigma^2 x x')}{\sqrt{(1 + 2(\sigma_0^2 + \sigma^2 x^2))(1 + 2(\sigma_0^2 + \sigma^2 x'^2))}} \right) \quad (20)$$

where $\theta = (\sigma_0^2, \sigma^2)$ denotes the hyper-parameters.

In this example, a non-stationary prior can be selected because the solution to the Burgers' equation can develop discontinuities for small values of the viscosity parameter $v$. Accordingly, the Numerical Gaussian Process is obtained as follows:

$$\begin{bmatrix} u^n \\ u^{n-1} \end{bmatrix} \sim \mathcal{GP}\left( 0, \begin{bmatrix} k_{u,u}^{n,n} & k_{u,u}^{n,n-1} \\ & k_{u,u}^{n-1,n-1} \end{bmatrix} \right),$$

with covariance functions $k_{u,u}^{n,n}$, $k_{u,u}^{n,n-1}$, and $k_{u,u}^{n-1,n-1}$, which read:

$$k_{u,u}^{n,n} = k,$$

$$k_{u,u}^{n,n-1} = k + \Delta t \mu^{n-1}(x') \frac{d}{dx'} k - v \Delta t \frac{d^2}{dx'^2} k, \text{ and}$$

$$k_{u,u}^{n-1,n-1} = k + \Delta \mu^{n-1}(x) \mu^{n-1}(x') \frac{d}{dx'} k - v \Delta t \frac{d^2}{dx'^2} k +$$

$$\Delta t \mu^{n-1}(x) \frac{d}{dx} k + \Delta t^2 \mu^{n-1}(x) \mu^{n-1}(x') \frac{d}{dx dx'} k - v \Delta t \mu^{n-1}(x) \frac{d}{dx dx'^2} k -$$

$$v \Delta t \frac{d^2}{dx^2} k - v \Delta t^2 \mu^{n-1}(x') \frac{d^2}{dx^2 dx'} k + v^2 \Delta t^2 \frac{d^2}{dx^2 dx'^2} k$$

Training, prediction, and propagating the uncertainty associated with the noisy observations can be performed as described above. FIG. 20 depicts the noisy initial data along with the posterior distribution of the solution to the Burgers' equation (Equation (15)) at different time snapshots. It is noted that the proposed methodology can effectively propagate an infinite collection of correlated Gaussian random variables (i.e., a Gaussian process) through the complex nonlinear dynamics of the Burgers' equation.

As depicted in FIG. 20, the blue solid line represents the true data generating solution, while the dashed red line depicts the posterior mean. The shaded orange region illustrates the two standard deviations band around the mean. As described above, the backward Euler scheme is employed with time step size $\Delta t = 0.01$. At each time step, 31 artificial data points are generated and randomly located in the interval $[-1, 1]$ according to a uniform distribution. These locations are highlighted by the ticks along the horizontal axis. In this example, $$v = \frac{0.01}{\pi},$$

which is a value leading to the development of a non-singular thin internal layer at x=0 that is notoriously hard to resolve by classical numerical methods.

As such, it is noted that numerical Gaussian processes are used to handle cases in which all the data that are obtained is noisy data on black-box initial conditions, and in which the uncertainty associated with such noisy data are desired in the solutions to time-dependent partial differential equations. In contrast, typical classical numerical methods, such as Finite Differences, Finite Elements, and Spectral methods, can be used where the initial function is not a black-box function and noiseless data is accessible, or where quantifying the uncertainty in the solutions is not required.

Example Of Linear Multi-Step Methods Wave Equation (Trapezoidal Rule)

The following discusses that the linear multi-step methods apply to the wave equation, which is a second-order linear partial differential equation for the description of wave propagation phenomena, including sound waves, light waves, and water waves. It arises in many scientific fields such as acoustics, electromagnetics, and fluid dynamics. In one space dimension, the wave equation reads as:

$$u_{tt} = u_{xx}. \quad (21)$$

The function $$u(t, x) = \frac{1}{2}\sin(\pi t)\cos(\pi t) + \frac{1}{3}\sin(3\pi x)\sin(3\pi t)$$

solves this equation and satisfies the following initial and homogeneous Dirichlet boundary conditions:

$$u(0, x) = u^0(x) := \frac{1}{2}\sin(\pi x), \quad (22)$$

$$u_t(0, x) = v^0(x) := \pi\sin(3\pi c),$$

$$u(t, 0) = u(t, 1) = 0.$$

All the observed data are noisy measurements $\{x_u^0, u^0\}$ and $\{x_v^0, v^0\}$ of the black-box initial functions $u^0$ and $v^0$, respectively. Given this data, the following shows the steps of solving the wave equation (Equation (21)) and quantifying the uncertainty in the solution associated with the noisy initial data, with reference to FIG. 21.

Defining $v := u_t$, the wave equation can be written as a system of equations given by:

$$\begin{cases} u_t = v, \\ v_t = u_{xx}. \end{cases} \quad (23)$$

This system of equations (Equation (23)) can also be written in matrix-vector notations to obtain:

$$\frac{\partial}{\partial t}\begin{bmatrix} u \\ v \end{bmatrix} = \mathcal{L}_x \begin{bmatrix} u \\ v \end{bmatrix},$$

which takes me form of Equation (1) with $$\mathcal{L}_x = \begin{bmatrix} 0 & I \\ \frac{\partial^2}{\partial x^2} & 0 \end{bmatrix}.$$

This form is now amenable to the previous analysis provided for general linear multi-step methods.

With the trapezoidal rule, the system of equations (Equation (23)) is rewritten as:

$$u^n = u^{n-1} + \frac{1}{2}\Delta t v^{n-1} + \frac{1}{2}\Delta t v^n, \quad (24)$$

$$v^n = v^{n-1} + \frac{1}{2}\Delta t \frac{d^2}{dx^2}u^{n-1} + \frac{1}{2}\Delta t \frac{d^2}{dx^2}u^n.$$

Rearranging the terms yields:

$$u^n - \frac{1}{2}\Delta t v^n = u^{n-1} + \frac{1}{2}\Delta t v^{n-1},$$

$$v^n - \frac{1}{2}\Delta t \frac{d^2}{dx^2}u^n = v^{n-1} + \frac{1}{2}\Delta t \frac{d^2}{dx^2}u^{n-1}.$$

The terms $u^{n-1/2}$ and $v^{n-1/2}$ are defined to be given by:

$$u^n - \frac{1}{2}\Delta t v^n = : u^{n-1/2} := u^{n-1} + \frac{1}{2}\Delta t v^{n-1}, \quad (25)$$

$$v^n - \frac{1}{2}\Delta t \frac{d^2}{dx^2}u^n = : v^{n-1/2} := v^{n-1} + \frac{1}{2}\Delta t \frac{d^2}{dx^2}u^{n-1}.$$

As described herein, this can suggest a proper location to place the Gaussian process prior. Shifting the terms involved in the above equations by −½ and +½ provides:

$$u^{n-1/2} - \frac{1}{2}\Delta t v^{n-1/2} = u^{n-1}, \quad (26)$$

$$v^{n-1/2} - \frac{1}{2}\Delta t \frac{d^2}{dx^2}u^{n-1/2} = v^{n-1},$$

and $$u^n = u^{n-1/2} + \frac{1}{2}\Delta t v^{n-1/2}, \quad (27)$$

$$v^n = v^{n-1/2} + \frac{1}{2}\Delta t \frac{d^2}{dx^2}u^{n-1/2}, \text{ respectively.}$$

As such, the structure of the wave equation is encoded into a numerical Gaussian process prior for performing Bayesian machine learning of the solution $\{u(t, x), v(t, x)\}$ at any t>0.

The prior is assumed as:

$$u^{n-1/2}(x) \sim \mathcal{GP}(0, k_u(x, x'; \theta_u)), \text{ and}$$

$$u^{n-1/2}(x) \sim \mathcal{GP}(0, k_v(x, x'; \theta_v)), \quad (28)$$

which are two independent Gaussian processes with squared exponential covariance functions $$k_u(x, x'; \theta_u) = \gamma_u^2 \exp\left(-\frac{1}{2}w_u(x - x')^2\right), \quad (29)$$

-continued $$k_v(x, x'; \theta_v) = \gamma_v^2 \exp\left(-\frac{1}{2} w_v(x - x')^2\right),$$

where $\theta_u = (\gamma_u^2, w_u)$ and $\theta_v = (\gamma_v^2, w_v)$.

From the theoretical point of view, each covariance function gives rise to a Reproducing Kernel Hilbert space that defines a class of functions that can be represented by this kernel. In particular, the squared exponential covariance function chosen above implies smooth approximations. More complex function classes can be accommodated by appropriately choosing kernels (see, e.g., Equation (20)). This enables obtaining the following numerical Gaussian process $$\begin{bmatrix} u^n \\ v^n \\ u^{n-1} \\ v^{n-1} \end{bmatrix} \sim \mathcal{GP}\left(0, \begin{bmatrix} k_{u,u}^{n,n} & k_{u,v}^{n,n} & k_{u,u}^{n,n-1} & k_{u,v}^{n,n-1} \\ & k_{v,v}^{n,n} & k_{v,u}^{n,n-1} & k_{v,v}^{n,n-1} \\ & & k_{u,u}^{n-1,n-1} & k_{u,v}^{n-1,n-1} \\ & & & k_{v,v}^{n-1,n-1} \end{bmatrix}\right),$$

which captures the entire structure of the trapezoidal rule (Equation (24)), applied to the wave equation (Equation (21)), in the covariance functions for the wave equation. For example, the covariance functions can be given by:

$$k_{u,u}^{n,n} = k_u + \frac{1}{4}\Delta t^2 k_v,$$

$$k_{u,u}^{n,n-1} = k_u + \frac{1}{4}\Delta t^2 k_v,$$

$$k_{v,v}^{n,n} = k_v + \frac{1}{4}\Delta t^2 \frac{d^2}{dx^2}\frac{d^2}{dx'^2} k_u,$$

$$k_{v,v}^{n,n-1} = k_v + \frac{1}{4}\Delta t^2 \frac{d^2}{dx^2}\frac{d^2}{dx'^2} k_u,$$

$$k_{u,v}^{n-1,n-1} = -\frac{1}{2}\Delta t \frac{d^2}{dx'^2} k_u - \frac{1}{2}\Delta t k_v,$$

$$k_{u,v}^{n,n} = \frac{1}{2}\Delta t \frac{d^2}{dx'^2} k_u + \frac{1}{2}\Delta t k_v,$$

$$k_{u,v}^{n,n-1} = -\frac{1}{2}\Delta t \frac{d^2}{dx'^2} k_u + \frac{1}{2}\Delta t k_v,$$

$$k_{v,u}^{n,n-1} = -\frac{1}{2}\Delta t k_v + \frac{1}{2}\Delta t \frac{d^2}{dx^2} k_u,$$

$$k_{u,u}^{n-1,n-1} = k_u + \frac{1}{4}\Delta t^2 k_v,$$

$$k_{v,v}^{n-1,n-1} = k_v + \frac{1}{4}\Delta t^2 \frac{d^2}{dx^2}\frac{d^2}{dx'^2} k_u.$$

It is noted that, in some examples, the non-trivial but straightforward operations involved in the aforementioned kernel computations are:

$$\frac{d^2}{dx^2} k_u(x, x'; \theta_u) = \frac{d^2}{dx'^2} k_u(x, x'; \theta_u) \qquad (48)$$

$$= \gamma_u^2 w_u e^{-\frac{1}{2}w_u(x-x')^2}$$

$$(w_u(x - x')^2 - 1),$$

$$\frac{d^2}{dx^2 dx'^2} k_u(x, x'; \theta_u) =$$

$$\gamma_u^2 w_u^2 e^{-\frac{1}{2}w_u(x-x')^2}(w_u(x - x')^2(w_u(x - x')^2 - 6) + 3).$$

The hyper-parameters $\theta_u$ and $\theta_v$ can be trained by minimizing the Negative Log Marginal Likelihood resulting from $$\begin{bmatrix} u_b^n \\ u^{n-1} \\ v^{n-1} \end{bmatrix} \sim \mathcal{N}(0, K), \qquad (49)$$

where $\{x_b^n, u_b^n\}$ are the data on the boundary; $\{x_u^{n-1}, u^{n-1}\}, \{u_v^{n-1}, v_{n-1}\}$ are artificially generated data; and $$K := \begin{bmatrix} K_{u,u}^{n,n} + \sigma_n^2 I & K_{u,u}^{n,n-1} & K_{u,v}^{n,n-1} \\ & K_{u,u}^{n-1,n-1} + \sigma_{u,n-1}^2 I & K_{u,v}^{n-1,n-1} \\ & & K_{v,v}^{n-1,n-1} + \sigma_{v,n-1}^2 I \end{bmatrix},$$

where $$K_{u,u}^{n,n} = k_{u,u}^{n,n}(x_b^n, x_b^n),$$

$$K_{u,v}^{n,n-1} = k_{u,v}^{n,n-1}(x_b^n, x_v^{n-1}),$$

$$K_{u,v}^{n-1,n-1} = k_{u,v}^{n-1,n-1}(x_u^{n-1}, x_v^{n-1}),$$

$$K_{u,u}^{n,n-1} = k_{u,u}^{n,n-1}(x_b^n, x_u^{n-1}),$$

$$K_{u,u}^{n-1,n-1} = k_{u,u}^{n-1,n-1}(x_u^{n-1}, x_u^{n-1}),$$

$$K_{v,v}^{n-1,n-1} = k_{v,v}^{n-1,n-1}(x_v^{n-1}, x_v^{n-1}).$$

Here, the data on the boundary are given by $$x_b^n = \begin{bmatrix} 0 \\ 1 \end{bmatrix}, u_b^n = \begin{bmatrix} 0 \\ 0 \end{bmatrix},$$

which correspond to the Dirichlet boundary conditions (Equation (22)).

In order to predict $u^n(x^{*n}_u)$ and $v^n(x^{*n}_v)$ at new test points $x^{*n}_u$ and $x^{*n}_v$, respectively, the following conditional distribution is used:

$$\begin{bmatrix} u^n(x^n_{*u}) \\ v^n(x^n_{*v}) \end{bmatrix} \Bigg| \begin{bmatrix} u_b^n \\ u^{n-1} \\ v^{n-1} \end{bmatrix} \sim$$

$$\mathcal{N}\left(q^T K^{-1} \begin{bmatrix} u_b^n \\ u^{n-1} \\ v^{n-1} \end{bmatrix}, \begin{bmatrix} k_{u,u}^{n,n}(x^n_{*u}, x^n_{*u}) & k_{u,v}^{n,n}(x^n_{*u}, x^n_{*v}) \\ & k_{v,v}^{n,n}(x^n_{*v}, x^n_{*v}) \end{bmatrix} - q^T K^{-1} q \right)$$

where $q = [q_u q_v]$ and $q = [q_u q_v]$ $q_u^T := [k_{u,u}^{n,n}(x^n_{*u}, x_b^n) \quad k_{u,u}^{n,n-1}(x^n_{*u}, x_u^{n-1}) \quad k_{u,v}^{n,n-1}(x^n_{*u}, x_v^{n-1})],$ $q_v^T := [k_{u,u}^{n,n}(x^n_{*v}, x_b^n) \quad k_{v,u}^{n,n-1}(x^n_{*v}, x_u^{n-1}) \quad k_{v,v}^{n,n-1}(x^n_{*v}, x_v^{n-1})].$ Since $\{x_b^{n-1}, u^{n-1}\}$ and $\{x_v^{n-1}, v^{n-1}\}$ are artificially generated data, to properly propagate the uncertainty associated with the initial data, they are marginalized out by employing:

$$\begin{bmatrix} u^{n-1} \\ v^{n-1} \end{bmatrix} \sim \mathcal{N}\left(\begin{bmatrix} \mu_u^{n-1} \\ \mu_v^{n-1} \end{bmatrix}, \begin{bmatrix} \sum_{u,u}^{n-1,n-1} & \sum_{u,v}^{n-1,n-1} \\ & \sum_{v,v}^{n-1,n-1} \end{bmatrix}\right)$$

to obtain $$\begin{bmatrix} u^n(x_{*u}^n) \\ v^n(x_{*v}^n) \end{bmatrix} \Bigg| u_b^n \sim$$

$$\mathcal{N}\left(\begin{bmatrix} \mu_u^n(x_{*u}^n) \\ \mu_v^n(x_{*v}^n) \end{bmatrix}, \begin{bmatrix} \sum_{u,u}^{n,n}(x_{*u}^n, x_{*u}^n) & \sum_{u,v}^{n,n}(x_{*u}^n, x_{*v}^n) \\ & \sum_{v,v}^{n,n}(x_{*v}^n, x_{*v}^n) \end{bmatrix}\right),$$

where $\begin{bmatrix} \mu_u^n(x_{*u}^n) \\ \mu_v^n(x_{*v}^n) \end{bmatrix} = q^T K^{-1} \begin{bmatrix} u_b^n \\ \mu_u^{n-1} \\ \mu_v^{n-1} \end{bmatrix}$, and $$\begin{bmatrix} \sum_{u,u}^{n,n}(x_{*u}^n, x_{*u}^n) & \sum_{u,v}^{n,n}(x_{*u}^n, x_{*v}^n) \\ & \sum_{v,v}^{n,n}(x_{*v}^n, x_{*v}^n) \end{bmatrix} = \begin{bmatrix} k_{u,u}^{n,n}(x_{*u}^n, x_{*u}^n) & k_{u,v}^{n,n}(x_{*u}^n, x_{*v}^n) \\ & k_{v,v}^{n,n}(x_{*v}^n, x_{*v}^n) \end{bmatrix} -$$

$$q^T K^{-1} q = q^T K^{-1} \begin{bmatrix} 0 & 0 & 0 \\ & \sum_{u,u}^{n-1,n-1} & \sum_{u,v}^{n-1,n-1} \\ & & \sum_{n,n}^{n-1,n-1} \end{bmatrix} K^{-1} q.$$

The resulting posterior distribution is used to obtain the artificially generated data $\{x_b^n, u^n\}$ and $\{x_v^n, v^n\}$ for the next time step with $$\begin{bmatrix} u^n \\ v^n \end{bmatrix} \sim \mathcal{N}\left(\begin{bmatrix} \mu_u^n \\ \mu_v^n \end{bmatrix}, \begin{bmatrix} \sum_{u,u}^{n,n} & \sum_{u,v}^{n,n} \\ & \sum_{v,v}^{n,n} \end{bmatrix}\right).$$

Figure 21:
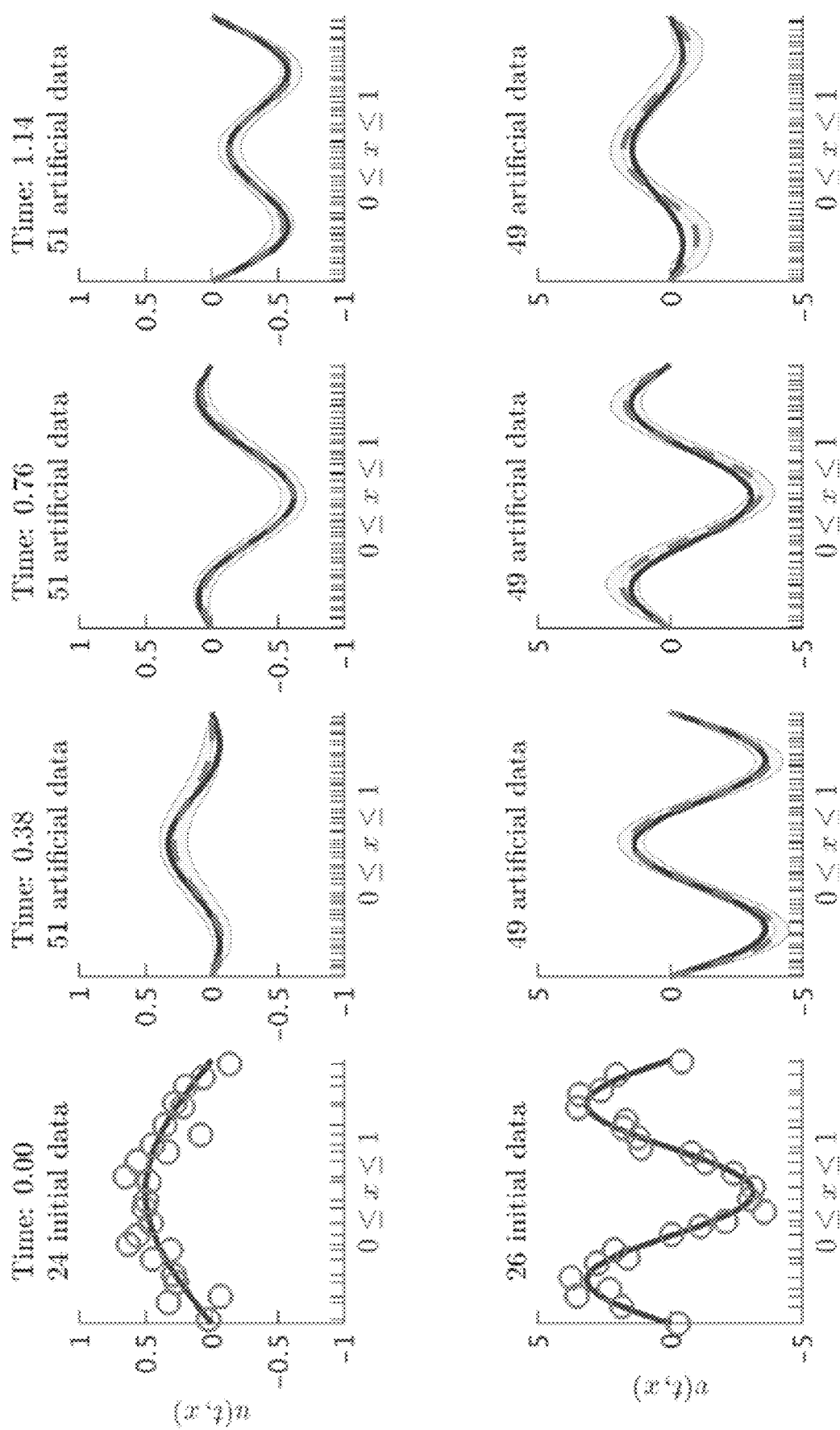
FIG. 21 illustrates noisy initial data and a posterior distribution of a solution to the wave equation at different time snapshots.

Training, prediction, and propagating the uncertainty associated with the noisy initial observations are performed as described above. FIG. 21 illustrates the noisy initial data along with the posterior distribution of the solution to the wave equation at different time snapshots.

Here, $v(t, x) = u_t(t, x)$. The blue solid line represents the true data generating solution, while the dashed red line depicts the posterior mean. The shaded orange region illustrates the two standard deviations band around the mean. At each time step, 51 artificial data points are generated for u and 49 artificial data points are generated for v, all randomly located in the interval [0, 1] according to a uniform distribution. These locations are highlighted by the ticks along the horizontal axis. The trapezoidal scheme is employed with time step size $\Delta t = 0.01$.

Runge-Kutta Methods

Now, the general form of Runge-Kutta methods with q stages applied to Equation (1) is $$u^{n+1} = u^n + \Delta t \sum_{i=1}^{q} b_i \mathcal{L}_x u^{n+T_i}, \tag{30}$$

$$u^{n+T_i} = u^n + \Delta t \sum_{j=1}^{q} a_{ij} \mathcal{L}_x u^{n+T_j}, i = 1, \ldots, q.$$

where $u^{n+T_i}(x) = u(t^n + T_i \Delta t, x)$.

This general form encapsulates both implicit and explicit time-stepping schemes, depending on the choice of the weights $\{a_{ij}, b_i\}$. In the proposed methodology, it is oblivious to the choice of these parameters, and thus the implicit or explicit nature of time-stepping scheme is ultimately irrelevant. This is in sharp contrast to classical numerical methods in which implicit time-integration is burdensome due to the need for repeatedly solving linear or nonlinear systems. Here, for a fixed number of stages q, the cost of performing implicit or explicit time-marching is identical. This is attributed to the fact that the structure of the time-stepping scheme is encoded in the numerical Gaussian process prior, and the algorithm only involves solving a sequence of regression problems as described herein. This allows us to enjoy the favorable stability properties of fully implicit schemes at no extra cost, and thus perform long-time integration using very large time-steps.

Equations (30) can be equivalently written as:

$$u^{n+1} - \Delta t \sum_{i=1}^{q} b_i \mathcal{L}_x u^{n+T_i} = u^n =: u_{q+1}^n, \tag{31}$$

$$u^{n+T_i} - \Delta t \sum_{j=1}^{q} a_{ij} \mathcal{L}_x u^{n+T_j} = u^n =: u_i^n, i = 1, \ldots, q.$$

The prior assumption is made such that:

$$u^{n+1}(x) \sim \mathcal{GP}(0, k_{u,u}^{n+1,n+1}(x, x'; \theta_{n+1})),$$

$$u^{n+T_i}(x) \sim \mathcal{GP}(0, k_{u,u}^{n+T_i,n+T_i}(x, x'; \theta_{n+T_i})), i = 1, \ldots, q, \tag{32}$$

are q+1 mutually independent Gaussian processes. Therefore, the joint distribution of $u^{n+1}$, $u^{n+T_q}$, ..., $u^{n+T_1}$, $u_{q+1}^n$, ..., $u_1^n$ can be written will capture the entire structure of the Runge-Kutta methods in the resulting numerical Gaussian process. This principle can be described with the following examples.

Runge-Kutta Methods Advection Equation (Gauss-Legendre Method)

The advection equation is one space dimension takes the form:

$$u_t = u_x \tag{33}$$

The function $u(t, x) = \sin(2\pi(x-t))$ solves this equation and satisfies the following initial and periodic boundary conditions:

$$u(0,x) = u^0(x) := \sin(2\pi x). \quad (t,0) = u(t,1). \tag{34}$$

Figure 22:
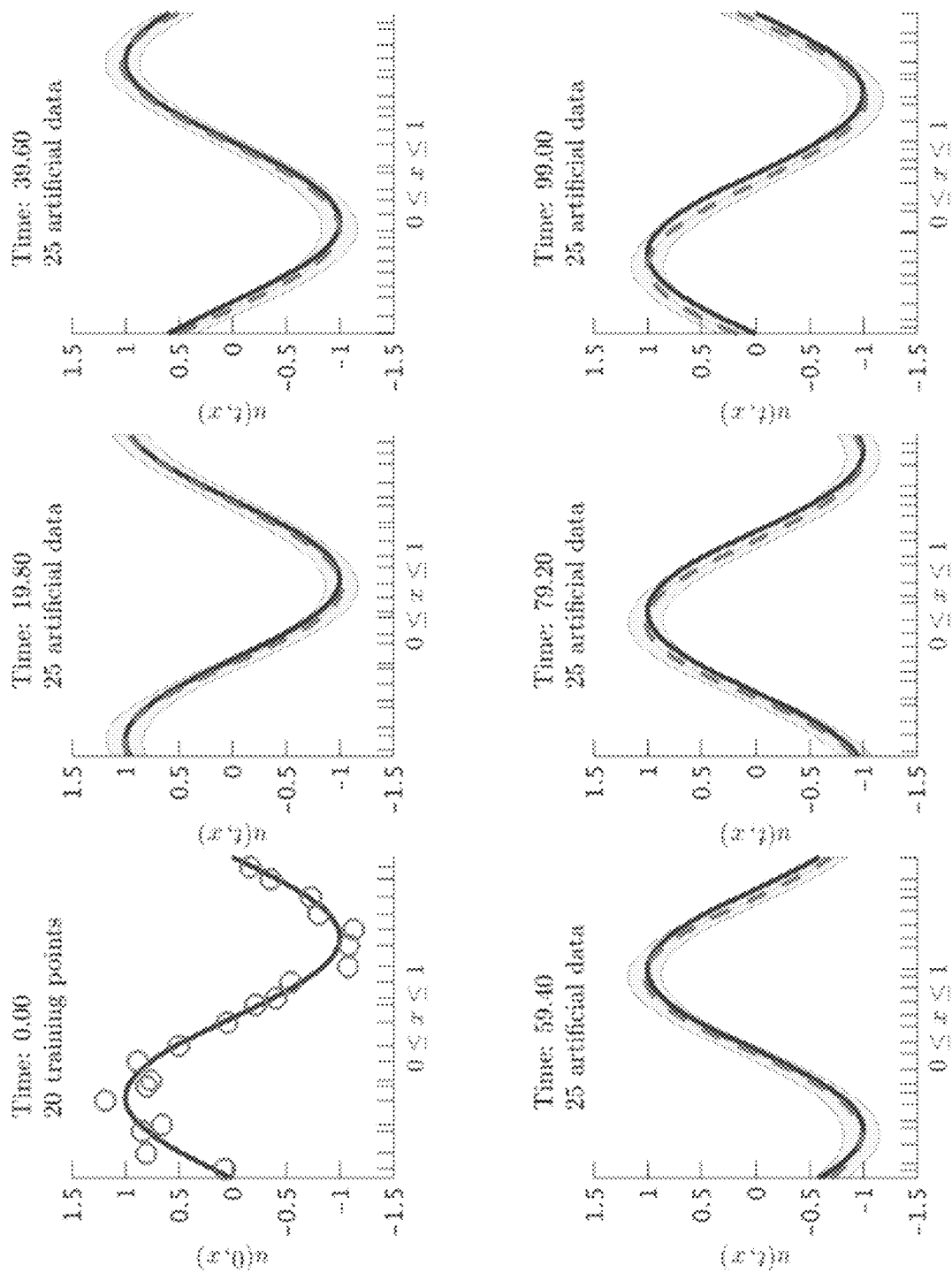
FIG. 22 illustrates noisy initial data and a posterior distribution of a solution to the advection equation at different time snapshots.

However, it is assumed that the data observed are only noisy measurements $\{x^0, u^0\}$ of the black-box initial function $u^0$. Given this data, the structure of the advection operator is encoded in a numerical Gaussian process prior, which is used to infer the solution $u(t, x)$ with quantified uncertainty for any $t>0$. FIG. 22 illustrates the inferred solution and uncertainty associated with it.

Gauss-Legendre time-stepping quadrature with two stages (thus fourth-order accurate) is applied to the advection equation (Equation (33)). Referring to Equation (31), the followings are obtained:

$$u_3^n := u^n = u^{n+1} + b_1 \Delta t \frac{d}{dx} u^{n+T_1} + b_2 \Delta t \frac{d}{dx} u^{n+T_2},$$

$$u_2^n := u^n = u^{n+T_2} + a_{21} \Delta t \frac{d}{dx} u^{n+T_1} + a_{22} \Delta t \frac{d}{dx} u^{n+T_2},$$

$$u_1^n := u^n = u^{n+T_1} + a_{11} \Delta t \frac{d}{dx} u^{n+T_1} + a_{12} \Delta t \frac{d}{dx} u^{n+T_2}. \tag{35}$$

Here, $T_1 = \frac{1}{2} - \frac{1}{6}\sqrt{3}$, $T_2 = \frac{1}{2} + \frac{1}{6}\sqrt{3}$, $b_1 = b_2 = \frac{1}{2}$, $a_{11} = a_{22} = \frac{1}{4}$, $a_{12} = \frac{1}{4} - \frac{1}{6}\sqrt{3}$, and $a_{21} = \frac{1}{4} + \frac{1}{6}\sqrt{3}$.

The prior assumption is made such that $u^{n+1}(x) \sim \mathcal{GP}(0, k_{u,u}^{n+1,n+1}(x,x';\theta_{n+1}))$, $u^{n+T_2}(x) \sim \mathcal{GP}(0, k_{u,u}^{n+T_2,n+T_2}(x,x';\theta_{n+T_2}))$, and $u^{n+T_1}(x) \sim \mathcal{GP}(0, k_{u,u}^{n+T_1,n+T_1}(x,x';\theta_{n+T_1}))$, (36)

are three independent Gaussian processes with squared exponential covariance functions similar to the kernels used in Equations (29). This assumption yields the following numerical Gaussian process:

$$\begin{bmatrix} u^{n+1} \\ u^{n+T_2} \\ u^{n+T_1} \\ u_3^n \\ u_2^n \\ u_1^n \end{bmatrix} \sim \mathcal{GP}\left(0, \begin{bmatrix} k_{u,u}^{n+1,n+1} & 0 & 0 & k_{u,3}^{n+1,n} & 0 & 0 \\ & k_{u,u}^{n+T_2,n+T_2} & 0 & k_{u,3}^{n+T_2,n} & k_{u,2}^{n+T_2,n} & k_{u,1}^{n+T_2,n} \\ & & k_{u,u}^{n+T_1,n+T_1} & k_{u,3}^{n+T_1,n} & k_{u,2}^{n+T_1,n} & k_{u,1}^{n+T_1,n} \\ & & & k_{3,3}^{n,n} & k_{3,2}^{n,n} & k_{3,1}^{n,n} \\ & & & & k_{2,2}^{n,n} & k_{2,1}^{n,n} \\ & & & & & k_{1,1}^{n,n} \end{bmatrix}\right).$$

where the covariance functions are given by:

$$k_{u,3}^{n+1,n} = k_{u,u}^{n+1,n+1},$$

$$k_{u,2}^{n+T_2,n} = k_{u,u}^{n+T_2,n+T_2} + a_{22}\Delta t \frac{d}{dx'} k_{u,u}^{n+T_2,n+T_2},$$

$$k_{u,3}^{n+T_1,n} = b_1 \Delta t \frac{d}{dx'} k_{u,u}^{n+T_1,n+T_1},$$

$$k_{u,1}^{n+T_1,n} = k_{u,u}^{n+T_1,n+T_1} + a_{11}\Delta t \frac{d}{dx'} k_{u,u}^{n+T_1,n+T_1},$$

$$k_{u,3}^{n+T_2,n} = b_2 \Delta t \frac{d}{dx'} k_{u,u}^{n+T_2,n+T_2},$$

$$k_{u,1}^{n+T_2,n} = a_{12}\Delta t \frac{d}{dx'} k_{u,u}^{n+T_2,n+T_2}$$

$$k_{u,2}^{n+T_1,n} = a_{21}\Delta t \frac{d}{dx'} k_{u,u}^{n+T_1,n+T_1}, \text{ and}$$

$$k_{3,3}^{n,n} = k_{u,u}^{n+1,n+1} + b_1^2 \Delta t^2 \frac{d}{dx}\frac{d}{dx'} k_{u,u}^{n+T_1,n+T_1} + b_2^2 \Delta t^2 \frac{d}{dx}\frac{d}{dx'} k_{u,u}^{n+T_2,n+T_2},$$

$$k_{3,2}^{n,n} = b_2 \Delta t \frac{d}{dx} k_{u,u}^{n+T_2,n+T_2} +$$

$$a_{21} b_1 \Delta t^2 \frac{d}{dx}\frac{d}{dx'} k_{u,u}^{n+T_1,n+T_1} + a_{22} b_1 \Delta t^2 \frac{d}{dx}\frac{d}{dx'} k_{u,u}^{n+T_2,n+T_2},$$

$$k_{3,1}^{n,n} = b_1 \Delta t \frac{d}{dx} k_{u,u}^{n+T_1,n+T_1} + a_{11} b_1 \Delta t^2 \frac{d}{dx}\frac{d}{dx'} k_{u,u}^{n+T_1,n+T_1} +$$

$$a_{12} b_2 \Delta t^2 \frac{d}{dx}\frac{d}{dx'} k_{u,u}^{n+T_2,n+T_2},$$

$$k_{2,2}^{n,n} = k_{u,u}^{n+T_2,n+T_2} + a_{21}^2 \Delta t^2 \frac{d}{dx}\frac{d}{dx'} k_{u,u}^{n+T_1,n+T_1} + a_{22}^2 \Delta t^2 \frac{d}{dx}\frac{d}{dx'} k_{u,u}^{n+T_2,n+T_2},$$

$$k_{2,1}^{n,n} = a_{12}\Delta t \frac{d}{dx'} k_{u,u}^{n+T_2,n+T_2} + a_{21}\Delta t \frac{d}{dx} k_{u,u}^{n+T_1,n+T_1} +$$

$$a_{21} a_{11} \Delta t^2 \frac{d}{dx}\frac{d}{dx'} k_{u,u}^{n+T_1,n+T_1} + a_{22} a_{12} \Delta t^2 \frac{d}{dx}\frac{d}{dx'} k_{u,u}^{n+T_2,n+T_2},$$

$$k_{1,1}^{n,n} = k_{u,u}^{n+T_1,n+T_1} + a_{11}^2 \Delta t^2 \frac{d}{dx}\frac{d}{dx'} k_{u,u}^{n+T_1,n+T_1} + a_{12}^2 \Delta t^2 \frac{d}{dx}\frac{d}{dx'} k_{u,u}^{n+T_2,n+T_2},$$

The hyper-parameters $\theta_{n+1}$, $\theta_{n+T_2}$, and $\theta_{n+T_1}$ can be trained by minimizing the Negative Log Marginal Likelihood resulting from $$\begin{bmatrix} u^{n+1}(1) - u^{n+1}(0) \\ u^{n+T_2}(1) - u^{n+T_2}(0) \\ u^{n+T_1}(1) - u^{n+T_1}(0) \\ u_3^n \\ u_2^n \\ u_1^n \end{bmatrix} \sim \mathcal{N}(0, K). \tag{37}$$

Here, $u^{n+1}(1) - u^{n+1}(0) = 0$, $u^{n+T_2}(1) - u^{n+T_2}(0) = 0$, and $u^{n+T_1}(1) - u^{n+T_1}(0) = 0$ correspond to the periodic boundary condition (Equation (34)). Moreover, $u_3^n = u_2^n = u_1^n = u^n$ and $\{x^n u^n\}$ are the artificially generated data. This equality shows a feature of this Runge-Kutta numerical Gaussian process, that is the fact that it inspects the same data through the lens of different kernels. A derivation of the covariance matrix K is given by $$K = \begin{bmatrix} k_{b,b}^{n+1,n+1} & 0 & 0 & K_{b,3}^{n+1,n} & 0 & 0 \\ & k_{b,b}^{n+T_2,n+T_2} & 0 & K_{b,3}^{n+T_2,n} & K_{b,2}^{n+T_2,n} & K_{b,1}^{n+T_2,n} \\ & & k_{b,b}^{n+T_1,n+T_1} & K_{b,3}^{n+T_1,n} & K_{b,2}^{n+T_1,n} & K_{b,1}^{n+T_1,n} \\ & & & K_{3,3}^{n,n} + \sigma_n^2 I & K_{3,2}^{n,n} & K_{3,1}^{n,n} \\ & & & & K_{2,2}^{n,n} + \sigma_n^2 I & K_{2,1}^{n,n} \\ & & & & & K_{1,1}^{n,n} + \sigma_n^2 I \end{bmatrix},$$

where $$K_{b,b}^{n+1,n+1} = k_{u,u}^{n+1,n+1}(1,1) - k_{u,u}^{n+1,n+1}(1,0) - k_{u,u}^{n+1,n+1}(0,1) + k_{u,u}^{n+1,n+1}(0,0),$$

$$K_{b,b}^{n+T_2,n+T_2} = k_{u,u}^{n+T_2,n+T_2}(1,1) - k_{u,u}^{n+T_2,n+T_2}(1,0) - k_{u,u}^{n+T_2,n+T_2}(0,1) + k_{u,u}^{n+T_2,n+T_2}(0,0),$$

$$K_{b,b}^{n+T_1,n+T_1} = k_{u,u}^{n+T_1,n+T_1}(1,1) - k_{u,u}^{n+T_1,n+T_1}(1,0) - k_{u,u}^{n+T_1,n+T_1}(0,1) + k_{u,u}^{n+T_1,n+T_1}(0,0),$$

$$K_{b,i}^{n+1,n} = k_{u,i}^{n+1,n}(1, x^n) - k_{u,i}^{n+1,n}(0, x^n),\ i = 3, 2, 1,$$

$$K_{b,i}^{n+T_2,n} = k_{u,i}^{n+T_2,n}(1, x^n) - k_{u,i}^{n+T_2,n}(0, x^n) = i = 3, 2, 1,$$

$$K_{b,i}^{n+T_1,n} = k_{u,i}^{n+T_1,n}(1, x^n) - k_{u,i}^{n+T_1,n}(0, x^n),\ i = 3, 2, 1,$$

$$K_{i,j}^{n,n} = k_{i,j}^{n,n}(x^n, x^n),\ i, j = 3, 2, 1,\ j \le i.$$

In some examples, prediction and propagation of uncertainty associated with the noisy initial observations can be performed as follows. In order to predict $u^{n+1}(x^{*\,n+1})$ at a new test point $x^{*n+1}$, the following is used:

$$u^{n+1}(x_*^{n+1}) \Bigg| \begin{bmatrix} u^{n+1}(1) - u^{n+1}(0) = 0 \\ u^{n+T_2}(1) - u^{n+T_2}(0) = 0 \\ u^{n+T_1}(1) - u^{n+T_1}(0) = 0 \\ u^n \\ u^n \\ u^n \end{bmatrix} \sim$$

$$\mathcal{N}\left(q^T K^{-1} \begin{bmatrix} 0 \\ 0 \\ 0 \\ u^n \\ u^n \\ u^n \end{bmatrix},\ k_{u,u}^{n+1,n+1}(x_*^{n+1}, x_*^{n+1}) - q^T K^{-1} q\right),$$

where $$q := \begin{bmatrix} k_{u,u}^{n+1,n+1}(1, x_*^{n+1}) - k_{u,u}^{n+1,n+1}(0, x_*^{n+1}) \\ 0 \\ 0 \\ k_{3,u}^{n,n+1}(x^n, x_*^{n+1}) \\ k_{2,u}^{n,n+1}(x^n, x_*^{n+1}) \\ k_{1,u}^{n,n+1}(x^n, x_*^{n+1}) \end{bmatrix}.$$

To propagate the uncertainty associated with the noisy initial data through time, the artificially generated data $\{x^n, u^n\}$ are marginalized by employing $u^n \sim \mathcal{N}(\mu^n, \Sigma^{n,n})$ to obtain $$u^{n+1}(x_*^{n+1}) \Bigg| \begin{bmatrix} u^{n+1}(1) - u^{n+1}(0) = 0 \\ u^{n+T_2}(1) - u^{n+T_2}(0) = 0 \\ u^{n+T_1}(1) - u^{n+T_1}(0) = 0 \end{bmatrix}$$

$$\sim \mathcal{N}\left(\mu^{n+1}(x_*^{n+1}),\ \sum^{n+1,n+1}(x_*^{n+1}, x_*^{n+1})\right),$$

where $\mu^{n+1}(x_*^{n+1}) = q^T K^{-1} \begin{bmatrix} 0 \\ 0 \\ 0 \\ \mu^n \\ \mu^n \\ \mu^n \end{bmatrix}$, and $$\sum^{n+1,n+1}(x_*^{n+1}, x_*^{n+1}) =$$

$$k_{u,u}^{n+1,n+1}(x_*^{n+1}, x_*^{n+1}) - q^T K^{-1} q + q^T K^{-1} \begin{bmatrix} 0 & 0 & 0 & 0 & 0 & 0 \\ 0 & 0 & 0 & 0 & 0 & 0 \\ 0 & 0 & 0 & 0 & 0 & 0 \\ & & & \Sigma^{n,n} & \Sigma^{n,n} & \Sigma^{n,n} \\ & & & & \Sigma^{n,n} & \Sigma^{n,n} \\ & & & & & \Sigma^{n,n} \end{bmatrix} K^{-1} q.$$

The resulting posterior distribution above can be used to obtain the artificially generated data $\{x^{n+1}, u^{n+1}\}$ with $u^{n+1} \sim \mathcal{N}(\mu^{n+1}, \Sigma^{n+1,n+1})$.

In FIG. 22, which illustrates initial data and the posterior distribution of the solution at different time snapshots, the blue solid line represents the true data generating solution, while the dashed red line depicts the posterior mean. The shaded orange region illustrates the two standard deviations band around the mean. At each time step we generate 25 artificial data points randomly located in the interval [0, 1] according to a uniform distribution. These locations are highlighted by the ticks along the horizontal axis. We are employing the Gauss-Legendre time-stepping quadrature rule with time step size $\Delta t=0.1$. It is noted that the time stepping scheme runs for a very long time and with a relatively large time step size.

Runge-Kutta Methods Heat Equation

Revisiting the trapezoidal rule, equipped with the machinery introduced for the Runge-Kutta methods, an alternative numerical Gaussian process can be obtained. The resulting scheme is applied to the heat equation in two space dimensions as in:

$$u_t = u_{x_1 x_1} + u_{x_2 x_2}, x_1 \in [1,0], x_2 \in [1,0]. \tag{38}$$

The function $$u(t, x_1, x_2) = e - \frac{5\pi^2 t}{4} \sin(\pi x_1) \sin\left(\frac{\pi x_2}{2}\right)$$

solves this equation and satisfies the following initial and boundary conditions:

$$u(0, x_1, x_2) = \sin(\pi x_1)\sin\left(\frac{\pi x_2}{2}\right),$$

$$u(t, 0, x_2) = u(t, 1, x_2) = 0, u(t, x_1, 0) = 0, \tag{39}$$

$$u_{x_2}(t, x_1, 1) = 0. \tag{40}$$

Figure 23:
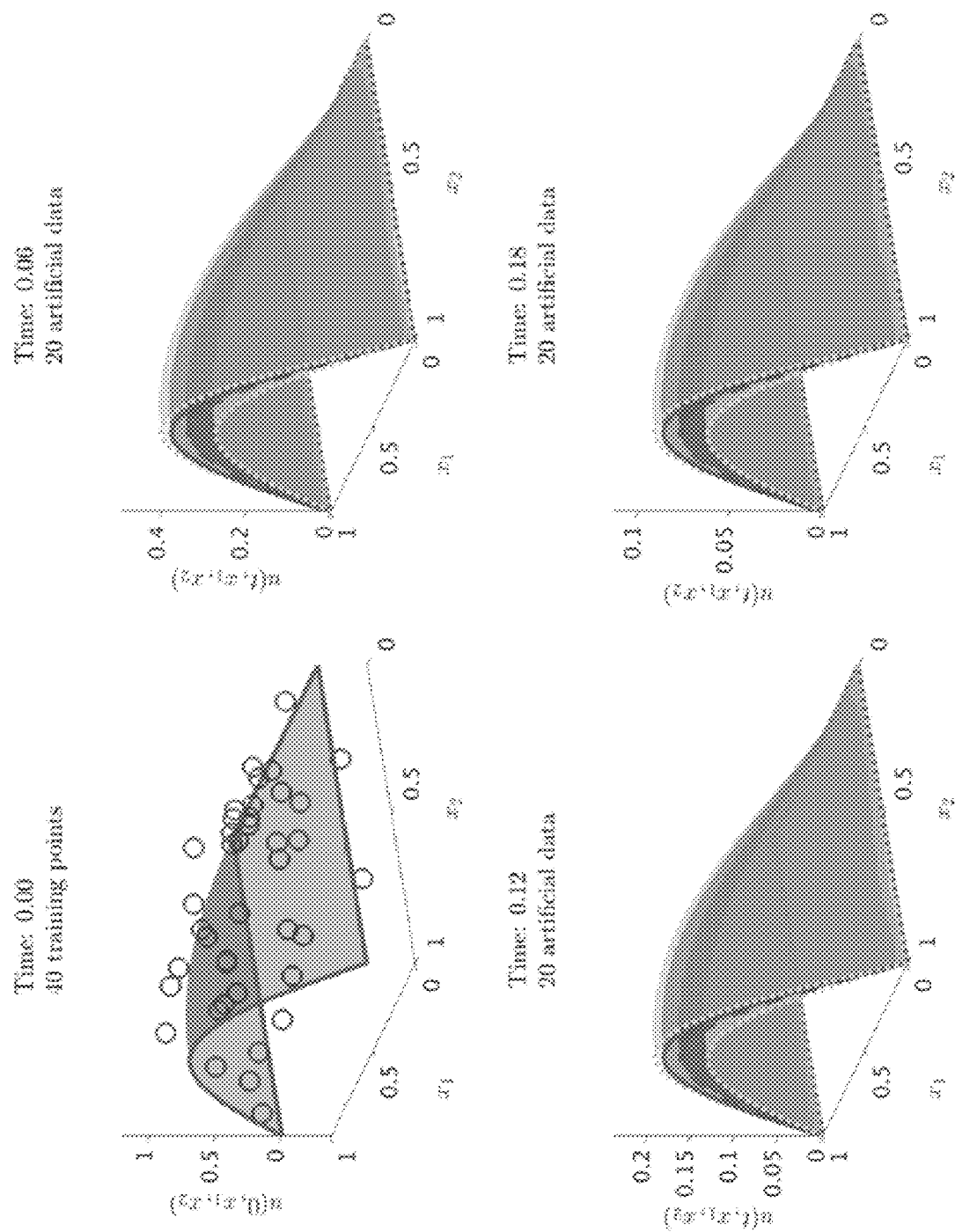
FIG. 23 illustrates noisy initial data and a posterior distribution of a solution to the heat equation at different time snapshots.

Equations (39) involve Dirichlet boundary conditions while Equation (40) corresponds to Neumann-type boundary. It is assumed that all the data observed are noisy measurements $\{(x_1^0, x_2^0), u^0\}$ of the black-box initial function $u(0, x_1, x_2)$. Given such measurements, the latent scalar field $u(t, x_1, x_2)$ (i.e., the solution to the heat equation (Equation (38)) will be inferred, while the uncertainty associated with the noisy initial data is quantified, as illustrated in FIG. 23. This example demonstrates the ability of the methods of the present disclosure to handle multi-dimensional spatial domains and mixed boundary conditions, as shown with Equations (39) and (40).

In some examples, the trapezoidal scheme is applied to the heat equation (Equation (38)). The trapezoidal rule for the heat equation can be given by $$u^{n+1} = u^n + \frac{1}{2}\Delta t \frac{d^2}{dx_1^2} u^n + \frac{1}{2}\Delta t \frac{d^2}{dx_1^2} u^{n+1} + \frac{1}{2}\Delta t \frac{d^2}{dx_2^2} u^n + \frac{1}{2}\Delta t \frac{d^2}{dx_2^2} u^{n+1}. \tag{41}$$

Rearranging the terms, $u_1^n := u^n$ and $$u_2^n := u_3^n := u^n = \tag{42}$$

$$u^{n+1} - \frac{1}{2}\Delta t \frac{d^2}{dx_1^2} u^n - \frac{1}{2}\Delta t \frac{d^2}{dx_1^2} u^{n+1} - \frac{1}{2}\Delta t \frac{d^2}{dx_2^2} u^n - \frac{1}{2}\Delta t \frac{d^2}{dx_2^2} u^{n+1}.$$

In other words, Equation (35) is rewritten for the heat equation (Equation (38)) with $\tau_1=0$, $\tau_2=1$, $b_1=b_2=\frac{1}{2}$, $a_{11}=a_{12}=0$, and $a_{21}=a_{22}=\frac{1}{2}$.

Similar to the strategy for the advection equation adopted for the Runge-Kutta methods, and as an alternative to the scheme used in the linear multi-step methods, the following prior assumptions are made:

$$u^{n+1}(x_1,x_2) \sim \mathcal{GP}(0, k_{u,u}^{n+1,n+1}((x_1,x_2),(x_1',x_2');\theta_{n+1})),$$

$$u^n(x_1,x_2) \sim \mathcal{GP}(0, k_{u,u}^{n,n}((x_1,x_2),(x_1',x_2');\theta_n)). \tag{43}$$

Here, anisotropic squared exponential covariance functions are employed of the form:

$$k_{u,u}^{n+1,n+1}((x_1,x_2),(x_1',x_2');\theta_{n+1}) =$$

$$\gamma_{n+1}^2 \exp\left(-\frac{1}{2}w_{n+1,1}(x_1-x_1')^2 - \frac{1}{2}w_{n+1,2}(x_2-x_2')^2\right),$$

$$k_{u,u}^{n,n}((x_1,x_2),(x_1',x_2');\theta_n) = \gamma_n^2 \exp\left(-\frac{1}{2}w_{n,1}(x_1-x_1')^2 - \frac{1}{2}w_{n,2}(x_2-x_2')^2\right).$$

The hyper-parameters are given by $\theta_{n+1}=(\gamma_{n+1}^2, w_{n+1,1}, w_{n+1,2})$ and $\theta_n=(\gamma_n^2, w_{n,1}, w_{n,2})$. To deal with the mixed boundary conditions (Equations (39) and (40)), it is defined that $$v^{n+1} := \frac{d}{dx^2} u^{n+1} \text{ and } v^n := \frac{d}{dx_2} u^n.$$

Then, the following numerical Gaussian process is obtained:

$$\begin{bmatrix} u^{n+1} \\ v^{n+1} \\ u^n \\ v^n \\ u_3^n \\ u_1^n \end{bmatrix} \sim \mathcal{GP}\left(0, \begin{bmatrix} k_{u,u}^{n+1,n+1} & k_{u,v}^{n+1,n+1} & 0 & 0 & k_{u,3}^{n+1,n} & 0 \\ & k_{v,v}^{n+1,n+1} & 0 & 0 & k_{v,3}^{n+1,n} & 0 \\ & & k_{u,u}^{n,n} & k_{u,v}^{n,n} & k_{u,3}^{n,n} & k_{u,1}^{n,n} \\ & & & k_{v,v}^{n,n} & k_{v,3}^{n,n} & k_{v,1}^{n,n} \\ & & & & k_{3,3}^{n,n} & k_{3,1}^{n,n} \\ & & & & & k_{1,1}^{n,n} \end{bmatrix}\right).$$

The covariance functions are given:

$$k_{u,v}^{n+1,n+1} = \frac{d}{dx_2'} k_{u,u}^{n+1,n+1},$$

$$k_{u,3}^{n+1,n} = k_{u,u}^{n+1,n+1} - \frac{1}{2}\Delta t \frac{d^2}{dx_1'^2} k_{u,u}^{n+1,n+1} - \frac{1}{2}\Delta t \frac{d^2}{dx_2'^2} k_{u,u}^{n+1,n+1},$$

$$k_{v,v}^{n+1,n+1} = \frac{d}{dx_2} \frac{d}{dx_2'} k_{u,u}^{n+1,n+1},$$

$$k_{v,3}^{n+1,n} = \frac{d}{dx_2} k_{u,u}^{n+1,n+1} - \frac{1}{2}\Delta t \frac{d}{dx_2}\frac{d^2}{dx_1'^2} k_{u,u}^{n+1,n+1} - \frac{1}{2}\Delta t \frac{d}{dx_2}\frac{d^2}{dx_2'^2} k_{u,u}^{n+1,n+1},$$

$$k_{u,v}^{n,n} = \frac{d}{dx_2'} k_{u,u}^{n,n},$$

$$k_{u,3}^{n,n} = -\frac{1}{2}\Delta t \frac{d^2}{dx_1'^2} k_{u,u}^{n,n} - \frac{1}{2}\Delta t \frac{d^2}{dx_2'^2} k_{u,u}^{n,n},$$

$$k_{u,1}^{n,n} = k_{u,u}^{n,n},$$

$$k_{v,v}^{n,n} = \frac{d}{dx_2}\frac{d}{dx_2'} k_{u,u}^{n,n},$$

$$k_{v,3}^{n,n} = -\frac{1}{2}\Delta t \frac{d}{dx_2}\frac{d^2}{dx_1'^2} k_{u,u}^{n,n} - \frac{1}{2}\Delta t \frac{d}{dx_2}\frac{d^2}{dx_2'^2} k_{u,u}^{n,n},$$

$$k_{v,1}^{n,n} = \frac{d}{dx_2} k_{u,u}^{n,n},$$

$$k_{3,3}^{n,n} = k_{u,u}^{n+1,n+1} - \frac{1}{2}\Delta t \frac{d^2}{dx_1^2} k_{u,u}^{n+1,n+1} - \frac{1}{2}\Delta t \frac{d^2}{dx_2^2} k_{u,u}^{n+1,n+1} +$$

-continued $$\frac{1}{4}\Delta t^2 \frac{d^2}{dx_1^2}\frac{d^d}{dx_1^2}k_{u,u}^{n,n} + \frac{1}{4}\Delta t^2 \frac{d^2}{dx_1^2}\frac{d^2}{dx_2^2}k_{u,u}^{n,n} - \frac{1}{2}\Delta t \frac{d^2}{dx_1^2}k_{u,u}^{n+1,n+1} +$$

$$\frac{1}{4}\Delta t^2 \frac{d^2}{dx_1^2}\frac{d^2}{dx_1^2}k_{u,u}^{n+1,n+1} + \frac{1}{4}\Delta t^2 \frac{d^2}{dx_1^2}\frac{d^2}{dx_2^2}k_{u,u}^{n+1,n+1} +$$

$$\frac{1}{4}\Delta t^2 \frac{d^2}{dx_2^2}\frac{d^2}{dx_1^2}k_{u,u}^{n,n} + \frac{1}{4}\Delta t^2 \frac{d^2}{dx_2^2}\frac{d^2}{dx_2^2}k_{u,u}^{n,n} - \frac{1}{2}\Delta t \frac{a^2}{ax_2^2}k_{u,u}^{n+1,n+1} +$$

$$\frac{1}{4}\Delta t^2 \frac{d^2}{dx_2^2}\frac{d^2}{dx_1^2}k_{u,u}^{n+1,n+1} + \frac{1}{4}\Delta t^2 \frac{d^2}{dx_2^2}\frac{d^2}{dx_2^2}k_{u,u}^{n+1,n+1},$$

$$k_{3,1}^{n,n} = -\frac{1}{2}\Delta t \frac{d^2}{dx_1^2}k_{u,u}^{n,n} - \frac{1}{2}\Delta t \frac{d^2}{dx_2^2}k_{u,u}^{n,n}, \text{ and}$$

$$k_{1,1}^{n,n} = k_{u,u}^{n,n}.$$

The hyper-parameters $\theta_{n+1}$ and $\theta_n$ can be trained by minimizing the Negative Log Marginal Likelihood resulting from $$\begin{bmatrix} u_D^{n+1} \\ v_N^{n+1} \\ u_D^n \\ v_N^n \\ u_3^n \\ u_1^n \end{bmatrix} \sim \mathcal{N}(0, K) \quad (44)$$

where $\{(x_{1,D}^{n+1}, x_{2,D}^{n+1}), u_D^{n+1}\}$ and $\{(x_{1,D}^n, x_{2,D}^n), u_D^n\}$ denote the data on the Dirichlet (Equation (39)) portion of the boundary, while $\{(x_{1,N}^{n+1}, x_{2,N}^{n+n+1}), u_N^{n+1}\}$ and $\{(x_{1,N}^n, x_{2,N}^n), u_N^n\}$ correspond to the Neumann (Equation (40)) boundary data. Moverover, $u_1^n = u_3^n = u^n$ and $\{(x_1^n, x_2^n), u^n\}$ are the artificially generated data.

The exact form of the matrix K is given by $$K = \begin{bmatrix} K_{D,D}^{n+1,n+1} & K_{D,N}^{n+1,n+1} & 0 & 0 & K_{D,3}^{n+1,n} & 0 \\ & K_{N,N}^{n+1,n+1} & 0 & 0 & K_{N,3}^{n+1,n} & 0 \\ & & K_{D,D}^{n,n} & K_{D,N}^{n,n} & K_{D,3}^{n,n} & K_{D,1}^{n,n} \\ & & & K_{N,N}^{n,n} & K_{N,3}^{n,n} & K_{N,1}^{n,n} \\ & & & & K_{3,3}^{n,n} & K_{3,1}^{n,n} \\ & & & & & K_{1,1}^{n,n} \end{bmatrix}.$$

Here, $$K_{D,D}^{n+1,n+1} = k_{u,u}^{n+1,n+1}((x_{1,D}^{n+1}, x_{2,D}^{n+1}), (x_{1,D}^{n+1}, x_{2,D}^{n+1})) + \sigma_{D,n+1}^2 I,$$

$$K_{D,N}^{n+1,n+1} = k_{u,v}^{n+1,n+1}((x_{1,D}^{n+1}, x_{2,D}^{n+1}), (x_{1,N}^{n+1}, x_{2,N}^{n+1})),$$

$$K_{D,3}^{n+1,n} = k_{u,3}^{n+1,n}((x_{1,D}^{n+1}, x_{2,D}^{n+1}), (x_1^n, x_2^n)),$$

$$K_{N,N}^{n+1,n+1} = k_{v,v}^{n+1,n+1}((x_{1,N}^{n+1}, x_{2,N}^{n+1}), (x_{1,N}^{n+1}, x_{2,N}^{n+1})) + \sigma_{N,n+1}^2 I,$$

$$K_{N,3}^{n+1,n} = k_{v,3}^{n+1,n}((x_{1,N}^{n+1}, x_{2,N}^{n+1}), (x_1^n, x_2^n))$$

$$K_{D,D}^{n,n} = k_{u,u}^{n,n}((x_{1,D}^n, x_{2,D}^n), (x_{1,D}^n, x_{2,D}^n)) + \sigma_{D,n}^2 I,$$

$$K_{D,N}^{n,n} = k_{u,v}^{n,n}((x_{1,D}^n, x_{2,D}^n), (x_{1,N}^n, x_{2,N}^n)),$$

$$K_{D,3}^{n,n} = k_{u,3}^{n,n}((x_{1,D}^n, x_{2,D}^n), (x_1^n, x_2^n)),$$

$$K_{D,1}^{n,n} = k_{u,1}^{n,n}((x_{1,D}^n, x_{2,D}^n), (x_1^n, x_2^n)),$$

$$K_{N,N}^{n,n} = k_{v,v}^{n,n}((x_{1,N}^n, x_{2,N}^n), (x_{1,N}^n, x_{2,N}^n)) + \sigma_{N,n}^2 I,$$

$$K_{N,3}^{n,n} = k_{v,3}^{n,n}((x_{1,N}^n, x_{2,N}^n), (x_1^n, x_2^n)),$$

$$K_{N,1}^{n,n} = k_{v,1}^{n,n}((x_{1,N}^n, x_{2,N}^n), (x_1^n, x_2^n)),$$

$$K_{3,3}^{n,n} = k_{3,3}^{n,n}((x_1^n, x_2^n), (x_1^n, x_2^n)) + \sigma_N^2 I,$$

$$K_{3,1}^{n,n} = k_{3,1}^{n,n}((x_1^n, x_2^n), (x_1^n, x_2^n)),$$

$$K_{1,1}^{n,n} = k_{1,1}^{n,n}((x_1^n, x_2^n), (x_1^n, x_2^n)) + \sigma_n^2 I.$$

Prediction and propagation of uncertainty associated with the noisy initial observations can be performed as follows. In order to predict $u^{n+1}(x_1^{n+1*}, x_2^{n+1*})$ at a new test point $(x_1^{n+1*}, x_2^{n+1*})$, the following is used:

$$u^{n+1}(x_{1,*}^{n+1}, x_{2,*}^{n+1}) \middle| \begin{bmatrix} u_D^{n+1} \\ v_N^{n+1} \\ u_D^n \\ v_N^n \\ u^n \\ u^n \end{bmatrix} \sim$$

$$\mathcal{N}\left( q^T K^{-1} \begin{bmatrix} u_D^{n+1} \\ v_N^{n+1} \\ u_D^n \\ v_N^n \\ u^n \\ u^n \end{bmatrix}, k_{u,u}^{n+1,n+1}((x_{1,*}^{n+1}, x_{2,*}^{n+1}), (x_{1,*}^{n+1}, x_{2,*}^{n+1})) - q^T K^{-1} q \right)$$

where $q := \begin{bmatrix} k_{u,u}^{n+1,n+1}((x_{1,D}^{n+1}, x_{2,D}^{n+1}), (x_{1,*}^{n+1}, x_{2,*}^{n+1})) \\ k_{v,u}^{n+1,n+1}((x_{1,N}^{n+1}, x_{2,N}^{n+1}), (x_{1,*}^{n+1}, x_{2,*}^{n+1})) \\ 0 \\ 0 \\ k_{3,u}^{n,n+1}((x_1^n, x_2^n), (x_{1,*}^{n+1}, x_{2,*}^{n+1})) \\ 0 \end{bmatrix}.$ To propagate the uncertainty associated with the noisy initial data through time, the artificially generated data $\{(x_1^n, x_2^n), u^n\}$ is marginalized by employing $u^n \sim \mathcal{N}(\mu^n, \Sigma^{n,n})$ to obtain:

$$u^{n+1}(x_{1,*}^{n+1}, x_{2,*}^{n+1}) \middle| \begin{bmatrix} u^n \\ v^n \\ u^{n-1} \\ v^{n-1} \end{bmatrix}$$

$$\sim \mathcal{N}\left( \mu^{n+1}(x_{1,*}^{n+1}, x_{2,*}^{n+1}), \sum^{n+1,n+1}((x_{1,*}^{n+1}, x_{2,*}^{n+1}), (x_{1,*}^{n+1}, x_{2,*}^{n+1})) \right)$$

where $\mu^{n+1}(x_{1,*}^{n+1}, x_{2,*}^{n+1}) = q^T K^{-1} \begin{bmatrix} u_D^{n+1} \\ v_N^{n+1} \\ u_D^n \\ v_N^n \\ \mu^n \\ \mu^n \end{bmatrix}$, and -continued $$\sum_{*}^{n+1,n+1}(x_*^{n+1}, x_*^{n+1}) =$$

$$k_{u,u}^{n+1,n+1}(x_*^{n+1}, x_*^{n+1}) - q^T K^{-1} q + q^T K^{-1} \begin{bmatrix} 0 & 0 & 0 \\ \sum^{n,n} & \sum^{n,n} & \\ & \sum^{n,n} & \end{bmatrix} K^{-1} q.$$

Now, the resulting posterior equation above can be used to obtain the artificially generated data $\{(x_1^{n+1}, x_2^{n+1}), u^{n+1}\}$ with $u^{n+1} \sim \mathcal{N}(\mu^{n+1}, \Sigma^{n+1,n+1})$.

In FIG. 23, which illustrates the noisy initial data along with the posterior distribution of the solution at different time snapshots, the blue surface with solid lines represents the true data generating solution, while the red surface with dashed lines depicts the posterior mean. The two standard deviations band around the mean is depicted using the orange surface with dotted boundary. The trapezoidal rule is employed with time step size $\Delta t=0.01$. At each time step, 20 artificial data points are generated which are randomly located in the domain $[0, 1] \times [0, 1]$ according to a uniform distribution. Three noiseless data-points are employed per boundary.

As such, the systems and methods of the present disclosure provides a machine learning framework for encoding physical laws described by partial differential equations into Gaussian process priors for nonparametric Bayesian regression. The systems and methods of the present disclosure can be used to infer solutions to time-dependent and nonlinear partial differential equations, and effectively quantify and propagate uncertainty due to noisy initial or boundary data. Moreover, the systems and methods of the present disclosure provide structured learning machines which are explicitly informed by the underlying physics that possibly generated the observed data. This structure is used to construct data-efficient learning algorithms that can effectively distill information in the data-scarce scenarios appearing routinely in studying complex physical systems. In contrast to classical deterministic numerical methods for solving partial differential equations (e.g., finite difference and finite-element methods), the systems and methods of the present disclosure are capable of propagating entire probability distributions in time.

As such, the systems and methods of the present disclosure employs the concept of numerical Gaussian processes, which we define as Gaussian processes with covariance functions resulting from temporal discretization of time-dependent partial differential equations. Numerical Gaussian processes can deal with cases where: (1) all observable data are noisy data on black-box initial conditions, and (2) it needs to quantify the uncertainty associated with such noisy data in the solutions to time-dependent partial differential equations. The present disclosure circumvents the need for spatial discretization of the differential operators by proper placement of Gaussian process priors. This enables to construct structured and data-efficient learning machines, which are explicitly informed by the underlying physics that possibly generated the observed data. In this document, the effectiveness of the systems and methods of the present disclosure has been demonstrated through several benchmark problems involving linear and nonlinear time-dependent operators. As shown in the examples, it is possible to recover accurate approximations of the latent solutions, and consistently propagate uncertainty, even in cases involving very long time integration.

FIG. 24 illustrates an exemplary architecture of the object analysis device 102. The object analysis device 102 illustrated in FIG. 24 is used to execute the operating system, application programs, and software modules (including the software engines) described herein.

The object analysis device 102 may be a computing device of various types. In some embodiments, the object analysis device 102 is one or more desktop computers, laptop computers, or other devices configured to process digital instructions. In other embodiments, the object analysis device 102 includes a mobile computing device. Examples of the object analysis device 102 as a mobile computing device include a mobile device (e.g., a smart phone and a tablet computer), a wearable computer (e.g., a smartwatch and a head-mounted display), a personal digital assistant (PDA), a handheld game console, a portable media player, a ultra-mobile PC, a digital still camera, a digital video camera, and other mobile devices.

It is recognized that the architecture illustrated in FIG. 24 can also be implemented in other computing devices used to achieve aspects of the present disclosure. For example, the data processing system 112 or the data collection device 108 can be configured similarly to the architecture of FIG. 24. To avoid undue repetition, this description of the object analysis device 102 will not be separately repeated herein for each of the other computing devices including the data processing system 112 or the data collection device 108.

The object analysis device 102 includes, in some embodiments, at least one processing device 1202, such as a central processing unit (CPU). A variety of processing devices are available from a variety of manufacturers, for example, Intel or Advanced Micro Devices. In this example, the object analysis device 102 also includes a system memory 1204, and a system bus 1206 that couples various system components including the system memory 1204 to the processing device 1202. The system bus 1206 is one of any number of types of bus structures including a memory bus, or memory controller; a peripheral bus; and a local bus using any of a variety of bus architectures.

The system memory 1204 includes read only memory 1208 and random access memory 1210. A basic input/output system 1212 containing the basic routines that act to transfer information within the object analysis device 102, such as during start up, is typically stored in the read only memory 1208.

The object analysis device 102 also includes a secondary storage device 1214 in some embodiments, such as a hard disk drive, for storing digital data. The secondary storage device 1214 is connected to the system bus 1206 by a secondary storage interface 1216. The secondary storage devices and their associated computer readable media provide nonvolatile storage of computer readable instructions (including application programs and program modules), data structures, and other data for the object analysis device 102.

Although the exemplary environment described herein employs a hard disk drive as a secondary storage device, other types of computer readable storage media are used in other embodiments. Examples of these other types of computer readable storage media include magnetic cassettes, flash memory cards, digital video disks, Bernoulli cartridges, compact disc read only memories, digital versatile disk read only memories, random access memories, or read only memories. Some embodiments include non-transitory media.

A number of program modules can be stored in secondary storage device 1214 or memory 1204, including an operating system 1218, one or more application programs 1220, other program modules 1222, and program data 1224.

In some embodiments, the object analysis device 102 includes input devices to enable a user to provide inputs to the object analysis device 102. Examples of input devices 1226 include a keyboard 1228, a pointer input device 1230, a microphone 1232, and a touch sensitive display 1240. Other embodiments include other input devices. The input devices are often connected to the processing device 1202 through an input/output interface 1238 that is coupled to the system bus 1206. These input devices 1226 can be connected by any number of input/output interfaces, such as a parallel port, serial port, game port, or a universal serial bus. Wireless communication between input devices and interface 1238 is possible as well, and includes infrared, BLUETOOTH® wireless technology, 802.11a/b/g/n, cellular, or other radio frequency communication systems in some possible embodiments.

In this example embodiment, a touch sensitive display device 1240 is also connected to the system bus 1206 is an interface, such as a video adapter 1242. The touch sensitive display device 1240 includes touch sensors for receiving input from a user when the user touches the display. Such sensors can be capacitive sensors, pressure sensors, or other touch sensors. The sensors not only detect contact with the display, but also the location of the contact and movement of the contact over time. For example, a user can move a finger or stylus across the screen to provide written inputs. The written inputs are evaluated and, in some embodiments, converted into text inputs.

In addition to the display device 1240, the object analysis device 102 can include various other peripheral devices (not shown), such as speakers or a printer.

The object analysis device 102 further includes a communication device 1246 configured to establish communication across the network. In some embodiments, when used in a local area networking environment or a wide area networking environment (such as the Internet), the object analysis device 102 is typically connected to the network through a network interface, such as a wireless network interface 1250. Other possible embodiments use other wired and/or wireless communication devices. For example, some embodiments of the object analysis device 102 include an Ethernet network interface, or a modem for communicating across the network. In yet other embodiments, the communication device 1246 is capable of short-range wireless communication. Short-range wireless communication is one-way or two-way short-range to medium-range wireless communication. Short-range wireless communication can be established according to various technologies and protocols. Examples of short-range wireless communication include a radio frequency identification (RFID), a near field communication (NFC), a Bluetooth technology, and a Wi-Fi technology.

The object analysis device 102 typically includes at least some form of computer-readable media. Computer readable media includes any available media that can be accessed by the object analysis device 102. By way of example, computer-readable media include computer readable storage media and computer readable communication media.

Computer readable storage media includes volatile and nonvolatile, removable and non-removable media implemented in any device configured to store information such as computer readable instructions, data structures, program modules or other data. Computer readable storage media includes, but is not limited to, random access memory, read only memory, electrically erasable programmable read only memory, flash memory or other memory technology, compact disc read only memory, digital versatile disks or other optical storage, magnetic cassettes, magnetic tape, magnetic disk storage or other magnetic storage devices, or any other medium that can be used to store the desired information and that can be accessed by the object analysis device 102. Computer readable storage media does not include computer readable communication media.

Computer readable communication media typically embodies computer readable instructions, data structures, program modules or other data in a modulated data signal such as a carrier wave or other transport mechanism and includes any information delivery media. The term "modulated data signal" refers to a signal that has one or more of its characteristics set or changed in such a manner as to encode information in the signal. By way of example, computer readable communication media includes wired media such as a wired network or direct-wired connection, and wireless media such as acoustic, radio frequency, infrared, and other wireless media. Combinations of any of the above are also included within the scope of computer readable media.

The computing device illustrated in FIG. 24 is also an example of programmable electronics, which may include one or more such computing devices, and when multiple computing devices are included, such computing devices can be coupled together with a suitable data communication network so as to collectively perform the various functions, methods, or operations disclosed herein.

The various examples and teachings described above are provided by way of illustration only and should not be construed to limit the scope of the present disclosure. Those skilled in the art will readily recognize various modifications and changes that may be made without following the examples and applications illustrated and described herein, and without departing from the true spirit and scope of the present disclosure.

What is claimed is:

1. A method for analyzing an object, the method comprising:
    modeling the object with a time-dependent partial differential equation;
    measuring an initial data from the object;
    constructing a probability distribution device by:
    constructing a linear multi-step device usable to predict a solution to the time-dependent partial differential equation;
    constructing a non-parametric regression prior; and
    placing the non-parametric regression prior on a predetermined term in the linear multi-step device;
    running the probability distribution device by:
    setting a time step size;
    inputting the initial data to the probability distribution device, the initial data representative of data at an initial time step;
    obtaining first artificial data at a first time step, the first time step being increased from the initial time step by the time step size, the first artificial data being calculated based on a first output from the probability distribution device to which the initial data is inputted;
    obtaining second artificial data at a second time step, the second time step being increased from the first time step by the time step size, the second artificial data being calculated based on a second output from the probability distribution device to which the first artificial data is inputted;

obtaining third artificial data at a third time step, the third time step being increased from the second time step by the time step size, the third artificial data being calculated based on a third output from the probability distribution device to which the second artificial data is inputted; and repeating the steps of obtaining the second artificial data and obtaining the third artificial data until a predetermined time is reached.

2. The method of claim 1, wherein measuring an initial data comprises: arranging one or more sensors at one or more locations of the object; operating the one or more sensors to obtain the initial data.

3. The method of claim 1, wherein the predetermined term is determined to avoid inversion of differential operators.

4. The method of claim 1, wherein each of the first output, the second output, and the second output includes a predicted solution to the time-dependent partial differential equation and an uncertainty associated with the predicted solution.

5. The method of claim 1, wherein a time-dependent partial differential equation is a time-dependent linear partial differential equation.

6. The method of claim 1, wherein a time-dependent partial differential equation is a time-dependent non-linear partial differential equation including one or more non-linear terms.

7. The method of claim 6, further comprising: approximating the non-linear terms into linear terms.

8. The method of claim 7, wherein approximating comprises: linearizing the non-linear terms around a previous time step state.

9. The method of claim 1, wherein the probability distribution device employs a Gaussian process, and the non-parametric regression prior is a Gaussian process prior.

10. The method of claim 1, wherein the linear multi-step device involves Runge-Kutta methods.

11. The method of claim 1, wherein the linear multi-step device involves at least one of a forward Euler scheme, a backward Euler scheme, and a trapezoidal rule.

12. The method of claim 1, wherein running the probability distribution device further comprises:

prior to obtaining a first artificial data, training kernel hyper parameters of the probability distribution device with the initial data; and utilizing a conditional posterior distribution of the probability distribution device with the trained kernel hyper parameters to calculate the first output at the first time step;

prior to obtaining a second artificial data, training the kernel hyper parameters of the probability distribution device with the first artificial data; and utilizing the conditional posterior distribution of the probability distribution device with the trained kernel hyper parameters to calculate the second output at the second time step; and prior to obtaining a third artificial data, training the kernel hyper parameters of the probability distribution device with the second artificial data; and utilizing the conditional posterior distribution of the probability distribution device with the trained kernel hyper parameters to calculate the third output at the third time step.

13. A system for analyzing an object using a differential equation, the differential equation modeling the object, the system comprising:

a sensing device for measuring one or more parameters of the object;

a data collection device configured to control the sensing device and generate initial data based on the parameters; and an object analysis device configured to: construct a probability distribution device by:

constructing a linear multi-step device usable to predict a solution to a time-dependent partial differential equation;

constructing a non-parametric regression prior; and placing the non-parametric regression prior on a predetermined term in the linear multi-step device; and run the probability distribution device by:

setting a time step size;

inputting the initial data to the probability distribution device, the initial data representative of data at an initial time step;

obtaining first artificial data at a first time step, the first time step being increased from the initial time step by the time step size, the first artificial data being calculated based on a first output from the probability distribution device to which the initial data is inputted;

obtaining second artificial data at a second time step, the second time step being increased from the first time step by the time step size, the second artificial data being calculated based on a second output from the probability distribution device to which the first artificial data is inputted;

obtaining third artificial data at a third time step, the third time step being increased from the second time step by the time step size, the third artificial data being calculated based on a third output from the probability distribution device to which the second artificial data is inputted; and repeating the steps of obtaining the second artificial data and obtaining the third artificial data until a predetermined time is reached.

14. The system of claim 13, wherein a differential equation is a time-dependent partial differential equation.

15. The system of claim 13, wherein the predetermined term is determined to avoid inversion of differential operators.

16. The system of claim 13, wherein each of the first output, the second output, and the second output includes a predicted solution to the time-dependent partial differential equation and an uncertainty associated with the predicted solution.

17. The system of claim 13, wherein a time-dependent partial differential equation is a time-dependent non-linear partial differential equation including one or more non-linear terms.

18. The system of claim 17, wherein the object analysis device is configured to approximate the non-linear terms into linear terms.

19. The system of claim 13, wherein the probability distribution device employs a Gaussian process, and the non-parametric regression prior is a Gaussian process prior.

20. The system of claim 19, wherein the linear multi-step device involves Runge-Kutta methods.

21. A method for analyzing an object, the method comprising:

obtaining a differential equation that models the object;

measuring a set of control data from the object;

constructing a probability distribution device based on the differential equation and the set of control data;
running the probability distribution device to obtain output data, the output data including information representative of the object, wherein measuring a set of data comprises arranging one or more sensors at one or more locations of the object and operating the one or more sensors to obtain the set of control data;
determining a first degree of uncertainty associated with one of the one or more locations of the object from the probability distribution device;
determining a second degree of uncertainty associated with a sample data point from the probability distribution device, the sample data point being different from the one or more locations of the object;
comparing the first degree of uncertainty with the second degree of uncertainty;
based on the second degree of uncertainty being higher than the first degree of uncertainty, rearranging a sensing device associated with one of a plurality of control points to the sample data point;
operating the sensing device to obtain sample data at the sample data point; and
adjusting the probability distribution device based on the sample data.

22. A method for analyzing an object, the method comprising:
obtaining a differential equation that models the object;
measuring a set of control data from the object;
constructing a probability distribution device based on the differential equation and the set of control data;
running the probability distribution device to obtain output data, the output data including information representative of the object;
measuring sample data at one or more locations of the object;
comparing the sample data with the output data obtained from the probability distribution device; and
adjusting the probability distribution device based on the comparison.

23. A method for analyzing an object, the method comprising:
obtaining a differential equation that models the object;
measuring a set of control data from the object;
constructing a probability distribution device based on the differential equation and the set of control data;
running the probability distribution device to obtain output data, the output data including information representative of the object;
determining a sample data point from the probability distribution device, the sample data point having a greater degree of uncertainty than a degree of uncertainty of any of locations of the object at which the set of control data are obtained;
measuring sample data at the sample data point; and
adjusting the probability distribution device based on the sample data.

24. A system for analyzing an object using a differential equation, the system comprising:
a sensing device for measuring one or more parameters of the object;
a data collection device configured to control the sensing device and generate control data based on the parameters;
an object analysis device configured to:
obtain a differential equation that models the object;
obtain the control data from the data collection device;
construct a probability distribution device based on the differential equation and the control data; and
run the probability distribution device to obtain output data, the output data including information representative of the object;
wherein the object analysis device is further configured to:
determine a sample data point of the object from the probability distribution device, the sample data point having a greater degree of uncertainty than a degree of uncertainty of any of locations of the object at which the control data is obtained;
measure sample data at the sample data point; and adjust the probability distribution device based on the sample data.

25. The system of claim 24, wherein the object analysis device is further configured to:
determine a first degree of uncertainty associated with one of a plurality of locations of the object from the probability distribution device;
determine a second degree of uncertainty associated with a sample data point from the probability distribution device, the sample data point being different from any of the plurality of locations of the object; compare the first degree of uncertainty with the second degree of uncertainty;
when the second degree of uncertainty is higher than the first degree of uncertainty, rearrange a sensing device associated with one of a plurality of control points to the sample data point; operate the sensing device to obtain sample data at the sample data point; and
adjust the probability distribution device based on the sample data.

26. A system for analyzing an object using a differential equation, the system comprising:
a sensing device for measuring one or more parameters of the object;
a data collection device configured to control the sensing device and generate control data based on the parameters;
an object analysis device configured to:
obtain a differential equation that models the object;
obtain the control data from the data collection device;
construct a probability distribution device based on the differential equation and the control data; and
run the probability distribution device to obtain output data, the output data including information representative of the object;
wherein the control data includes sample data and anchor point data, the sample data being measured by the sensing device, and the anchor point data being a solution to the differential equation.

27. A method of analyzing an object, the method comprising:
modeling the object with a differential equation; calculating anchor point data, the anchor point data including a solution to the differential equation; constructing a first prior probability distribution, the first prior probability distribution being a prior probability distribution on the solution to the differential equation;
constructing a second prior probability distribution, the second prior probability distribution being a prior probability distribution on the differential equation;
measuring sample data from the object using a sensing device;
running the second prior probability distribution using the sample data to estimate one or more hyperparameters, the one or more associated with the first prior probability distribution and the second prior probability distribution; and obtaining a posterior probability distribution for the solution to the differential equation based on the sample data and the anchor point data.

* * * * *